United States Patent [19]

Asmussen et al.

[11] Patent Number: 5,682,157
[45] Date of Patent: Oct. 28, 1997

[54] FREQUENCY-ALTERNATING SYNCHRONIZED INFRARED

[75] Inventors: Daniel R. Asmussen, Kirkland, Wash.;
Michael D. Shride, Helena, Mont.;
James A. Sloate, Duvall, Wash.;
Thomas P. Dillon, Woodinville, Wash.

[73] Assignee: Fasirand Corporation, Helena, Mont.

[21] Appl. No.: 962,746

[22] Filed: Oct. 19, 1992

[51] Int. Cl.$^6$ .................................................. H03M 5/04
[52] U.S. Cl. ........................................... 341/68; 341/13
[58] Field of Search .............................. 341/68, 70, 13, 341/69, 50

[56] References Cited

U.S. PATENT DOCUMENTS

| | | | |
|---|---|---|---|
| 4,868,569 | 9/1989 | Montgomery | 341/70 |
| 5,127,023 | 6/1992 | Tash et al. | 341/70 X |
| 5,222,105 | 6/1993 | Kinney et al. | 341/70 X |
| 5,243,628 | 9/1993 | Moritoki et al. | 341/68 X |

Primary Examiner—Brian K. Young

[57] ABSTRACT

Disclosed is a system for rapid, wireless communication of electrically-generated and detected, serial digital data signals via a plurality of infrared (or other compatible wireless medium) transceivers. Signals are communicated without electrical connection among computers, fax machines, computer peripheral equipment, or may be employed within self-contained communication, control data-acquisition, and/or display systems. The system operates at predetermined maximum data rates and sub-multiples thereof. The disclosed transceivers can be joined with additional circuits, to form an arrangement that operates as a wireless modem. In each arrangement, light is continuously modulated at either of two precise multiples of the predetermined maximum data rate, and is synchronized to transmitted-data transitions. Upon receipt of light-signals thus produced, the system's receiving transceiver synchronizes received-data electrical output signals to the received modulated light signals. Received light-modulation periods are measured and verified continuously within each data-state interval, minimizing data-delay times and transition-timing distortions in the system's electrical output signals.

46 Claims, 39 Drawing Sheets

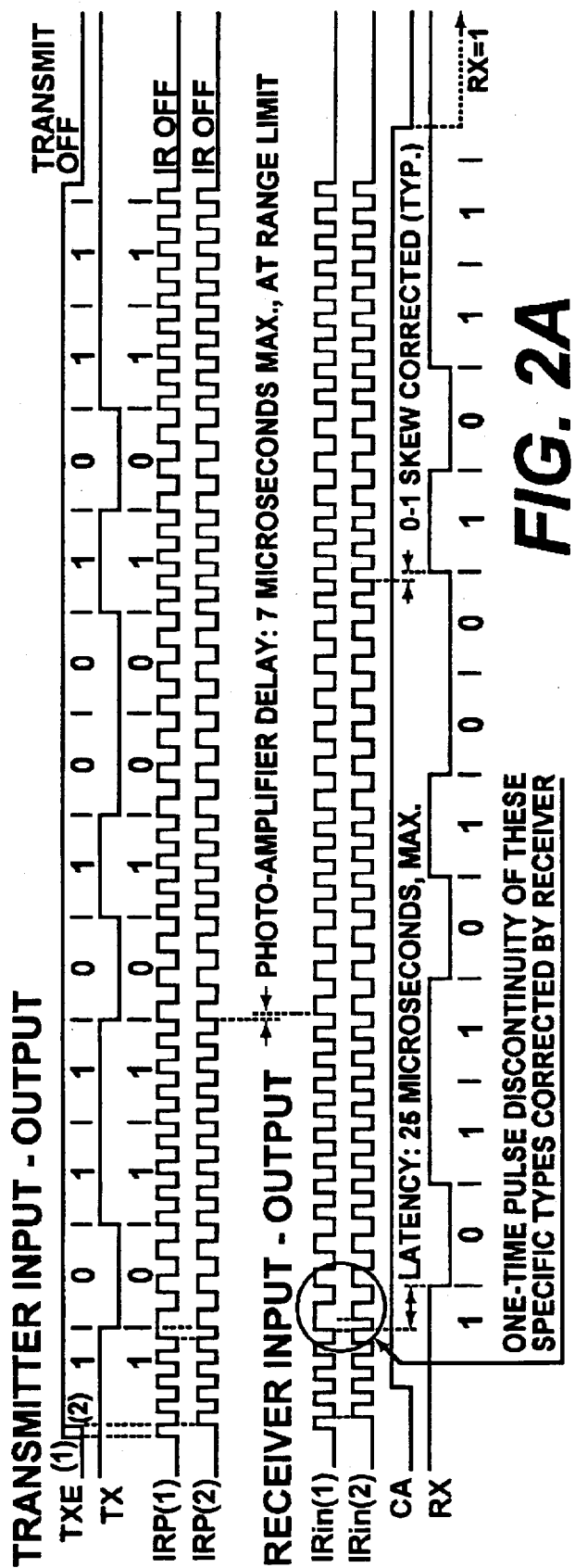

| Figure 4A | Figure 4B | Figure 4C | Figure 4D |

Figure 4

1. TWO-INPUT MULTIPLEXER:

SYMBOL:

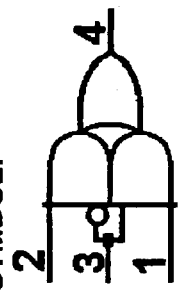

FUNCTIONAL DESCRIPTION:

ONE-OF-TWO-INPUT SIGNAL SELECTOR. WHEN PIN 3 IS AT LOGIC 1, PIN 1 INPUT STATE APPEARS AT PIN 4 OUTPUT. WHEN PIN 3 IS AT LOGIC 0, PIN 2 INPUT STATE APPEARS AT PIN 4 OUTPUT.

2. "D" FLIP-FLOP:

SYMBOL:

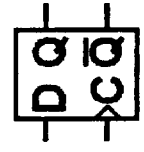

FUNCTIONAL DESCRIPTION:

POSITIVE-EDGE-TRIGGERED "D" FLIP-FLOP. "D" INPUT STATE TRANSFERS TO "Q" OUTPUT FOLLOWING A POSITIVE TRANSITION AT "C", THE CLOCK INPUT PIN. "$\overline{Q}$" OUTPUT STATE IS THE LOGICAL COMPLEMENT OF "Q".

3. "D" FLIP-FLOP WITH DIRECT $\overline{SET}$ AND $\overline{RESET}$:

SYMBOL:

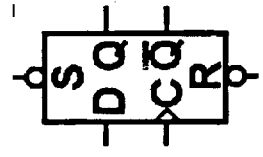

FUNCTIONAL DESCRIPTION:

POSITIVE-EDGE-TRIGGERED "D" FLIP-FLOP WITH INVERTED SET AND RESET OVERRIDE OPERATION. WITH INVERTED "S" AND "R" INPUTS AT LOGIC 1, OPERATION IS THE SAME AS IN 2., ABOVE. LOGIC 0 AT PIN "S" AND LOGIC 1 AT PIN "R" HOLDS OUTPUT "Q" AT LOGIC 1 AND OUTPUT "$\overline{Q}$" AT LOGIC 0. LOGIC 1 AT PIN "S" AND LOGIC 0 AT PIN "R" HOLDS "Q" AT LOGIC 0 AND "$\overline{Q}$" AT LOGIC 1. LOGIC 0 AT BOTH PIN "S" AND AT PIN "R" HOLDS "Q" AT LOGIC 1 AND "$\overline{Q}$" AT LOGIC 1.

FIG. 5A

4. "D" FLIP-FLOP WITH CHANGE-ENABLE INPUT:

SYMBOL:

FUNCTIONAL DESCRIPTION:

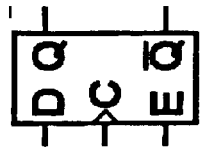

POSITIVE-EDGE-TRIGGERED "D" FLIP-FLOP WITH CHANGE-ENABLE INPUT. WITH "E" INPUT AT LOGIC 1, OPERATION IS THE SAME AS IN 2., ABOVE, WITH STATE OF "D" INPUT TRANSFERRED TO "Q" OUTPUT AFTER A POSITIVE TRANSITION AT "C". LOGIC 0 AT PIN "E" HOLDS "Q" AND "$\overline{Q}$" AT THEIR PREVIOUS STATES, REGARDLESS OF TRANSITIONS AT "C". "$\overline{Q}$" STATE IS THE LOGICAL COMPLEMENT OF "Q" STATE.

5. "D" FLIP-FLOP WITH CHANGE-ENABLE INPUT AND DIRECT $\overline{SET}$ AND $\overline{RESET}$:

SYMBOL:

FUNCTIONAL DESCRIPTION:

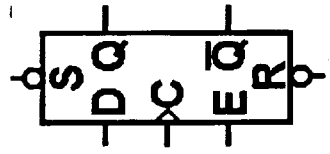

POSITIVE-EDGE-TRIGGERED "D" FLIP-FLOP WITH CHANGE-ENABLE INPUT AND INVERTED SET AND RESET OVERRIDE OPERATION. WITH "S" AND "R" INPUT PINS AT LOGIC 1, OPERATION IS THE SAME AS IN 4., ABOVE. LOGIC 0 AT PIN "S" AND LOGIC 1 AT PIN "R" HOLDS OUTPUT "Q" AT LOGIC 1 AND OUTPUT "$\overline{Q}$" AT LOGIC 0. LOGIC 1 AT PIN "S" AND LOGIC 0 AT PIN "R" HOLDS "Q" AT LOGIC 0 AND "$\overline{Q}$" AT LOGIC 1. LOGIC 0 AT BOTH PINS "S" AND AT PIN "R" HOLDS BOTH "Q" AND "$\overline{Q}$" AT LOGIC 1.

FIG. 5B

6. SEVEN-BIT PRE-LOADABLE COUNTER:

FUNCTIONAL DESCRIPTION:

SEVEN-BIT PRELOADABLE COUNTER WITH PRELOAD-ENABLE CONTROL AND DECODED TERMINAL-COUNT OUTPUTS. WITH "PE" INPUT PIN AT LOGIC 0, THE COUNTER OUTPUT BITS, "QA" THROUGH "QG", ADVANCE IN BINARY SEQUENCE AFTER EACH POSITIVE TRANSITION OF THE CLOCK INPUT AT "CL". "QA" IS THE LEAST-SIGNIFICANT COUNTER OUTPUT BIT AND "QG" IS THE MOST SIGNIFICANT COUNTER OUTPUT BIT. WHEN THE MAXIMUM COUNT (DECIMAL 127) IS REACHED ("QA" THROUGH "QG" AT LOGIC 1), THE "TC" PIN (DECODED TERMINAL COUNT) GOES TO LOGIC 1. "$\overline{TC}$" IS THE LOGICAL COMPLEMENT OF TC. WITH "PE" AT LOGIC 1, THE STATES OF "QA" THROUGH "QG", RESPECTIVELY, ARE DRIVEN TO THE STATES PRESENTED AT PRELOAD INPUTS "A" THROUGH "G" AFTER THE NEXT POSITIVE TRANSITION AT CL. THE COUNTER REMAINS IN THE STATE CORRESPONDING TO INPUTS "A" THROUGH "G", UNTIL THE FIRST POSITIVE TRANSITION OF "CL", AFTER "PE" GOES TO LOGIC 0. THE COUNTER CONTINUES TO INCREMENT AFTER EACH SUBSEQUENT POSITIVE "CL" TRANSITION, "WRAPPING" TO DECIMAL STATE 0, ONE POSITIVE "CL" TRANSITION AFTER REACHING DECIMAL STATE 127. THIS SEQUENCE CONTINUES UNTIL "PE" IS RETURNED TO LOGIC 1.

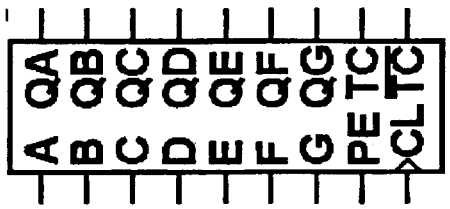

FIG. 5C

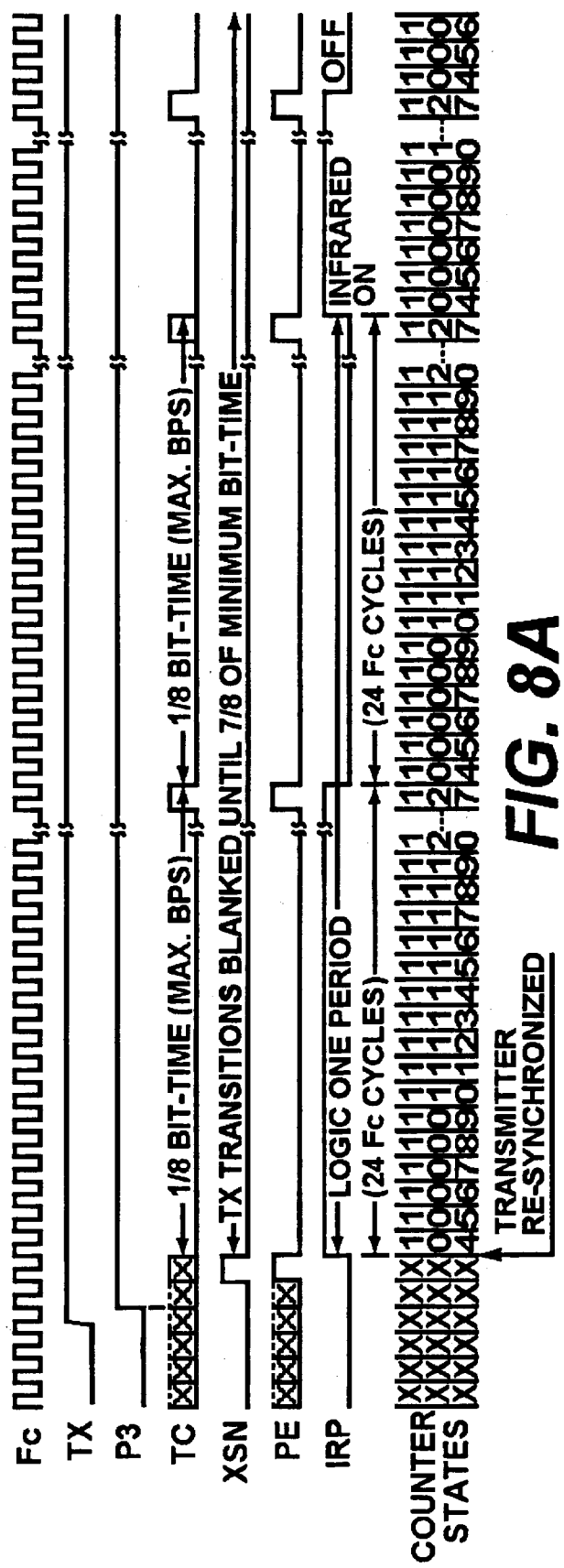

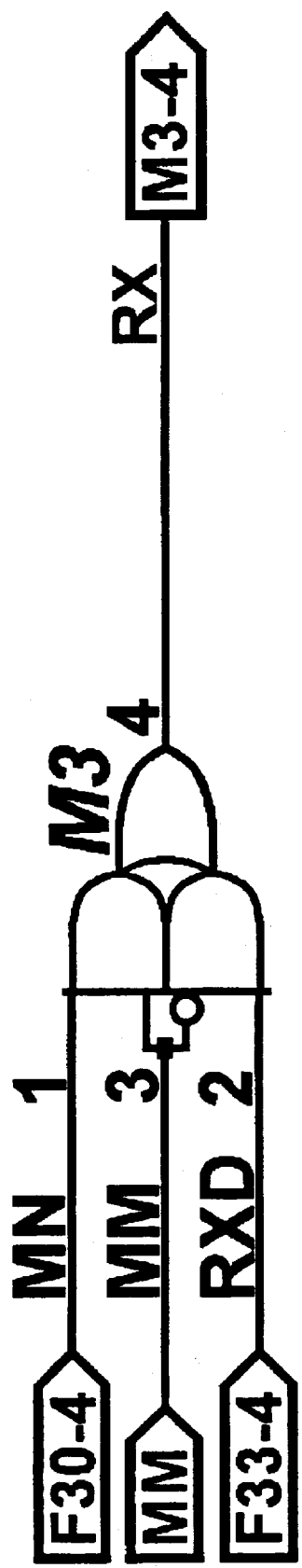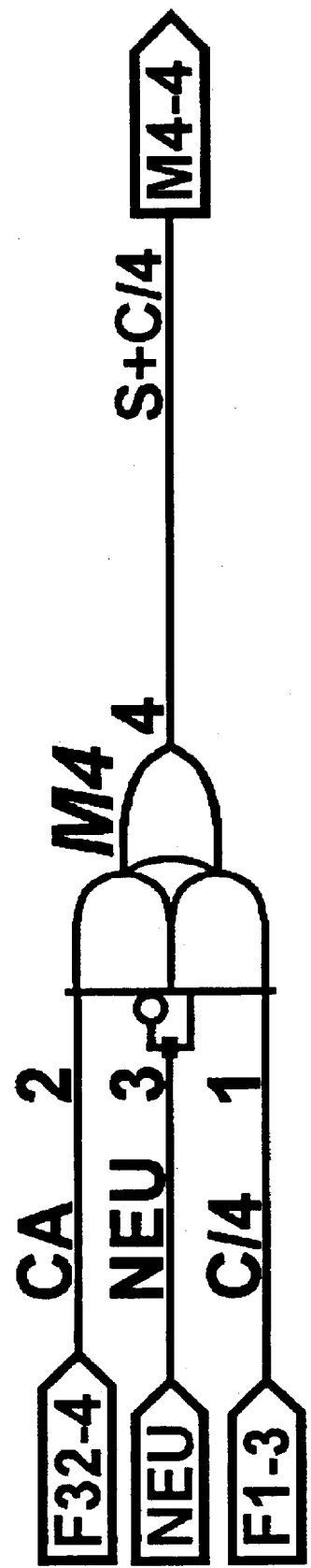
FIG. 23
DATA FORMAT SELECTOR
CARRIER SIGNAL OR CLOCK/4 SELECTOR

FREQUENCY-ALTERNATING SYNCHRONIZED INFRARED

BACKGROUND OF THE INVENTION

1. Field of the Invention

This invention relates to transmission and reception of electrically-generated and electrically-detected serial data, usually in non-return-to-zero (i.e. RS-232 or similar format), or Manchester or similar format, via an intermediate light-signaling, usually unenclosed, path. The system permits multiple translations along the transmission path from electrical signals to modulated light, and from modulated light back into electrical signals a large number of times with minimal signal distortions or delays. Such signal translation permits wireless line-of-sight, or reflected-light communications among stationary or portable (i.e., battery-operated) devices which require serial communications for their operation, without direct electrical or other physical connection among the devices. Further, modulated-light transmission permits "broadcasting" of serial data to a number of devices simultaneously, as in a multi-drop communication system employing addressable nodes or devices, or where several receiving devices require common data or commands. Use of a pair of enclosed light-paths, employing fiber-optic strands or other such media, permits simultaneous (full-duplex) two-way data communication over the system.

2. Discussion of the Technical Problems

Numerous infrared modulation techniques are currently in use for remote control of appliances or for low-speed data communications.

a. In a low-complexity technique in common use, a series of pulsed, timed light-bursts, usually pulsed in the frequency range, twenty-to-seventy kilohertz, is generated by the infrared (or other light) transmitter. The durations of these pulsed intervals (bursts), and the period between each such burst, represent the data or command(s) to be transmitted. Absence of a received light burst for a predetermined interval indicates the end of a data word or command. This method (pulsed infrared signaling) usually employs a photodiode or photo-transistor whose output passes into either an amplifier-band-pass-filter or an amplifier-phase-locked-loop circuit, whose center frequency is tuned to the infrared modulation frequency of the transmitter. Presence of the desired infrared signal is detected after several cycles of modulation, and presented at the receiver output as a change in (logic-level) voltage. The durations of the absence and presence of this signal are subsequently timed, and the data or command content of a sequence of the infrared bursts is interpreted by evaluation of these on/off intervals. In such detection means, there is a delay of several modulation-cycles required to reliably detect both the presence and the absence of modulated infrared signals within the chosen frequency range. To minimize false responses of the receiver to ambient, spurious, or other infrared transmitter sources, the interval of each burst usually must be between ten and sixty modulation periods. This transmission and detection method is practical and suitable when low data rates are sufficient to operate an appliance requiring relatively limited choices of simple commands or data, to be received infrequently, over relatively small distances. In addition to the data-rate limitations of this technique, the relatively long pauses between modulated pulses make the assessment of "off-times" between pulses subject to "stretching" by virtue of interfering light sources. This effect also places a design limitation on the sensitivity of the receiver to minimize spurious light interference, thereby significantly limiting the range of reception of the receiver.

b. In other, more complex infrared communication and control designs, two (or more) modulation frequencies are employed. The number of modulation intervals are counted over a predetermined larger interval, and the acquired counts determine the state of the received signal. This technique is less susceptible to interference and permits somewhat greater transmission rates and receiver sensitivities than the pulsed infrared method, described above, but does not operate at data rates typical of present-day computer systems. The minimum time to determine the signal-state of the received light-signal is only slightly less than a transmitted data-bit transition-time.

In either of the above methods, data or commands transmitted via infrared are expected to have low overall baud rates, as compared to those usually used in serial data communications. Commonly, serial data to be re-transmitted must be stored and reformatted, transmitted via the light path, detected, evaluated, reformatted and re-transmitted as electrical signals to the receiving equipment. Each of these operations require that an entire "packet", or "word" of data be received and reconstituted within the transmission path. The path, then, cannot be regarded as "transparent" from one device to another, and in many applications, such substantial data delays can interfere with desired operation of equipment, particularly when duplex (two-way) transmission is required. In many applications it is desirable or necessary that data be received bit-by-bit with less than a single data-bit transition-time of delay along the total transmission path. Further, it is usually desirable in data transmission within a computer system or network, that serial data rates be maintained for long periods, as in the case of the transfer of lengthy files between computers, or to/from peripheral equipment. In such non-transparent light-transmission means, memory must be provided at each point of reception or re-transmission, sufficient to store the largest amount of data to be sent at any one time. Further, the end-to-end transmission of data over several repeaters, using these types of signaling, requires that data transit times be at least the initial translation time, multiplied by the number of repeater stages used in the total signal path.

SUMMARY OF THE INVENTION

The present invention provides for the real-time translation of electrical serial data signals to a continuously-modulated infrared (or other light) signal, and for the detection and real-time demodulation of such infrared (or other light) signals back into electrical serial data signals, precisely matching its original input. These operations are performed, imposing a data delay of approximately one-third of a minimum data transition-time upon the signal path, at its maximum baud-rate. For example, using a commonly available, modest-frequency crystal clock of 3.6864 Megahertz, a transition rate of 19.2 Kbaud is achievable with a maximum instantaneous transition-time error (phase-jitter) of less than 0.6%. Such low-frequency circuit operation permits the practical use of the circuits in very low-power applications, such as hand-held controllers and communicators, and in battery operated lap-top computers or data repeaters. When higher-frequency clocks are used, commensurately higher baud-rates are achievable within the same phase-jitter limits, given as a percentage of bit-time, within the modulation frequency-response limits of the light-source(s), the receiver photo-sensitive device and its associated amplifier circuits.

Serial data is received by the light-transmitter as electrical signals from an input device, such as a computer UART "TXD" (transmitted data) terminal, via an electrical input pin. By use of a presettable counter, clocked at an exact multiple of the modulation frequency (and, therefore, of the data-transition-rate), the transmitter generates a driving signal to a (usually infrared) light-emitting diode (or other light-producing device) whose pulse-intervals (determined by one-of-two counter-moduli) are selected by the state of the electrical signal. Restarting of the presettable counter and commencing an infrared pulse at each serial data-transition creates a frequency-alternating, data-synchronized, pulse-modulated light source. The pulse-modulation frequency of the drive to the light-emitting diode is chosen as one of two exact multiples of the data bit-rate received. In the embodiment shown, these frequencies are three-times (for a logic zero state, and four-times (for a logic one state), the highest data-transition-rate, respectively, and are synchronized to the incoming bit-stream at each electrical-input logic-level transition.

The modulated light, thus produced, impinges at a distance upon a receiving photodiode, photo-transistor or other high-speed light detector, chosen to respond to the light spectra produced by the light-emitting source. Low level (pulsed) electrical signals produced by the detector are amplified and broadly filtered (to reduce interference from other differently-modulated light) and passed to an infinite-clipping comparator, producing a logic-level electrical signal whose logic states correspond to the electrical signals which were used to drive the light-emitting source at the transmitter. This logic-level signal is then passed (usually through an enabling logic gate) into the light-signal demodulator.

The logic signal thus presented at the demodulator input alternates between logic one and logic zero states, replicating the frequency-modulated signals used to drive the transmitter's light-emitting source. Each period of this signal is timed, using a counter which is clocked at a frequency which is a precise common-multiple of the two modulation frequencies used (in the embodiment shown, 3.6864 MHz). At each logic transition representing the beginning of the presence of light, the counter is restarted, and its partially-decoded count-range for its previous interval is stored by simultaneously clocking a flip-flop pair. If the interval just timed by the counter is within a band of values, chosen to encompass a single-cycle period of either of the two modulation frequencies transmitted, an in-band-indicating flip-flop will be set, indicating the presence of a carrier (CA) within the range of "valid" modulation frequencies. If the modulation frequency of the light is higher, or lower, than the "valid" range(s), the CA flip-flop will be reset, indicating the absence of a carrier within the limits chosen. Likewise, interruption of the light source for any time exceeding twice the lowest permissible period of modulation is interpreted as an out-of-range, or absent, light signal. Absence of the CA signal holds a second "signal-state" flip-flop set, presenting a continuous logic one at the received-data output. The ranges decoded as "in-band" may be contiguous, as in the embodiment shown, or may be separated by a "disallowed" range, between the two chosen modulation frequencies.

When light modulated within the permissible range(s) is detected, setting of the CA flip-flop permits resetting of the signal-state flip-flop if the counter state at the end of a modulation period is within the part of the permissible range(s) determined to represent a logic zero. In the embodiment shown, a range encompassing the lower of the two chosen modulation frequencies represents a logic zero state. As can be seen, four conditions are interpreted as a logic one signal-state by the demodulator. These four conditions are:

1) the absence of modulated light, 2) the presence of light modulated at frequencies within the range chosen to represent logic one, 3) the presence of light modulated at frequencies lower than the permissible range(s), and 4) the presence of light modulated at frequencies higher than (or between,) the permissible range(s). Conditions 1), 3) and 4), above, result in the resetting of the CA output signal, which will be interpreted as a "no-signal" condition. Also, a fifth condition, the presence on light modulated within the range chosen to represent a logic zero, will not permit initial setting of the CA output signal. The states of the signal-state flip-flop correspond to RS-232 (or similar format) signal behavior wherein (usually) the absence of any signal of interest is presented to a receiver as a logic one, one minimum-transition-time interval of logic zero is interpreted as a data "start-bit", and a one minimum-transition-time interval of logic one at the end of a byte or word is interpreted as a "stop-bit".

When light which is modulated within the permissible range(s) is detected, one period of the modulation interval is required to determine the signal-state received, and to set or reset the signal-state flip-flop. Since two differing frequencies are used to modulate the light-emitter, there is an inherent difference in the time required to detect a logic transition from one-to-zero, as compared to a logic transition from zero-to-one. This is true because the counter-range state is stored at the end of the preceding modulation-pulse interval, and if a signal-state transition has occurred, the signal-state flip-flop's state will not be changed until a single period of the new modulation frequency has passed. If the modulation frequency has changed from the higher to the lower frequency, the signal-state flip-flop state will be changed later than when the modulation frequency has changed from the lower to the higher frequency. For example, in the embodiment shown, the logic one modulation frequency is 76.8 Kilohertz (four times the maximum permissible baud rate of 19.2 Kbaud) and the logic zero frequency is 57.6 Kilohertz (three times 19.2 Kbaud). When the frequency of modulation shifts from 57.6 to 76.8 Kilohertz, one period at 76.8 Kilohertz, or 13.021 microseconds, is required to detect the frequency change. When the frequency of modulation shifts from 76.8 to 57.6 Kilohertz, one period at 57.6 Kilohertz, or 17.361 microseconds is required to detect that frequency change. The difference in these times produces a transition-time "skew" of 4.3403 microseconds, or one-twelfth of a transition-time difference between a high-to-low versus a low-to-high data transition.

The timing errors produced by this phenomenon would be acceptable in many cases where only one translation through the light path were required, but if several such uncorrected translations were made along a transmission path, transition-time skews would increase, the signal would rapidly degrade, and the compounding degradation would severely affect the quality and validity of the received data signals. For this reason, a third, restoring flip-flop is employed to correct the skew of the modulator's electrical output logic-state signal, RXD (received data). Its function is to delay the received-data flip-flop output signal change on a low-to-high frequency change by an interval, derived from a state of the demodulator counter, exactly equal to the difference in the inherent detection delays between a low-to-high and a high-to-low frequency change. The effect then, is to precisely equalize the transition detection times, thereby eliminating any significant transition-time skew in the final output of the received-data flip-flop. In the embodiment shown, both high-to-low, and low-to-high frequency changes are presented at the demodulator output 17.361 microseconds after the detected light modulation frequency has changed, discounting any (much smaller) logic device propagation-delay differences, and the more modest delays in the light-emitting and light-receiving circuits. Although some sub-transition-time delays and time-skews are present and unavoidable, this technique effectively minimizes bit-time-ratio degradation of the data signals passed through the light modulation/demodulation circuits. In the majority of applications, such signal translation delays are not significant to system performance. The total time delays, in the embodiment shown, incurred in light modulation transmission and demodulation are slightly greater than that of a two-mile wired transmission path. For comparison, telecommunication MODEM set, and radio-frequency-transmitted (packet-radio) data delays are far in excess of these values.

The choices of the frequencies of modulation and the demodulator counter clock are constrained by three major considerations. They are: 1) The choice of the highest baud-rate to be translated, and that 2) The light modulation frequencies must be (very near to) an exact multiple of the highest data-rate, and that 3) The demodulator counter clock must be a common-multiple of the light-modulation frequencies.

Each of these choices is further limited by physical and electrical properties of the devices used in the implementation, as well as the practical objectives of the system design with regard to power requirements, desired light transmission distances, data phase-jitter, noise and spurious light susceptibility, and other such concerns. For example, choosing a high data rate requires that either the two multiples of that rate, chosen for determination of modulation frequencies, be low, or that the modulation frequencies may exceed practical limits for available choices of light emitters, light detectors, or receiver amplifier/filter components, or may require components of higher cost in these circuits. If light modulation frequencies are chosen to be low multiples of the required baud-rate, then the detection delays become a larger part of a transition-time interval, and "skew" correction may impose delays exceeding a transition-time interval. For instance, choices of multiples of one, and of two, times the maximum data-rate require a full data-transition-time interval to demodulate, ignoring additional transmission path and device propagation delays. Further, the ratio of frequency-change is greater than in the present embodiment, and requires greater relative bandwidths of the receiver, opening the system to greater light-produced-noise susceptibility.

The choice of the common-multiple of the two light modulation frequencies for driving the demodulator counter is constrained by the choice of logic components and their power requirements at a high common-multiple extreme, and by transition-time phase-jitter considerations at the lowest common-multiple extreme. If the entire system is synchronous (driven from one common demodulator clock source), the choice of the lowest common-multiple of the light modulation frequencies for the demodulator clock introduces no transition-time phase-jitter, and permits low-frequency (and, therefore, low-power) designs to be used. If, as is usually the case, end-to-end transmission of a common clock is impractical, then some (usually slight) frequency difference between the transmitter clock source and the receiver clock source will exist. Each time the phase between the transmitter clock and the receiver clock accumulate a relative phase difference of one cycle of the demodulator counter (receiver) clock, the received data transition-time interval will be compressed or expanded by a time equal to one receiver clock period, due to the receiver's re-synchronization of the light modulation period to its local clock. It is usually desirable to hold this periodic phase-jitter interval to a small part of a bit time in order to minimize data distortions and resultant bit errors, especially if multiple translators are used in the total signal path. For this reason, the common-multiple of the light modulation frequency chosen for the demodulator counter clock is somewhat higher than the lowest common-multiple. For data rates up to 19.2 Kbaud, for instance, crystal-controlled clocks commonly used for RS-232 standard data rate generation in computer UARTs are reasonable choices for application in the present invention; in this example, 3.6864 Megahertz.

It is, therefore, an object of this invention to provide reliable and secure line-of-sight control of electrical devices.

A further object of this invention is to provide an easily-movable (portable) control device, which may be operated from any location chosen by the user, while preventing control from undesired locations (such as outside a building).

An additional object of the present invention is to improve the speed and reliability of broadcast light-transmitted data, as compared to other means presently in use. This is accomplished in the first case by transmission of continuously frequency-modulated light, rather than intermittent bursts, thereby making it possible to distinguish between spurious disruptions of the light transmission path, and the logic-states represented by the continuously-modulated beam. In the second case, the improvement in data transmission speeds, achievable by the present invention, provides that more data, including verifying data patterns such as parity, check-sums or cyclic-redundancy-check data may be included in the data "packets", during a similar data-transmission interval. It is apparent that, the longer the transmission interval, the greater is the time-per-unit-data sent, and the greater is the probability of exposure of the transmission path to external disturbances. Improved speed permits a higher degree of data verification within comparable or shorter transmission times resulting in a marked decrease in undetectable and therefore, uncorrectable errors.

Another object of the present invention is to provide security of the receiver-translator-transmitter from unwanted access by use of sensitivity-control and directionality-control of its infrared sensor(s).

A further object of this invention is to provide additional security, as required, through use of user and/or device-unique addresses and security codes. These addresses and security codes must be issued from the (often portable) control/display unit with the commands being issued, permitting or rejecting access to the system, to specified devices within the system, or to selected features or functions of the system.

A still further object of this invention is to provide convenient control of electrical devices which are out of physical reach, or in inconvenient locations, using frequency-alternating synchronized light signals.

Yet another object of this invention is to provide control of electrical devices not in the immediate vicinity, or view, of the user, employing frequency-alternating synchronized light signals.

A further object of the present invention is to receive and provide corresponding frequency-alternating synchronized light signal data for reception, annunciation, or other response to, the status of electrical devices and other sensors which may be passed to the electrical ports of a transceiver.

Yet another object of this invention is to receive and provide corresponding electrically-transmitted data for reception, annunciation, or other response to, the status of electrical devices and other sensors equipped with separate transceivers, which are in view of the receiving transceiver, via frequency-alternating synchronized light signals.

A yet further object of this invention is to interrogate, receive and provide corresponding electrically-transmitted data for reception, annunciation or other response to conditions detected by sensors equipped with separate (or shared) transceivers, without requiring that interrogation commands be previously issued from another device in the system.

An additional object of this invention is to provide electrically-isolated data or control-signal communications among or between computers, computer peripherals, local area networks, local operating networks, or the likes, through line-of-sight transmission.

Another object of this invention is to provide wireless repeating of data or control-signal communications among or between computers, computer peripherals, local area networks, local operating networks, or the likes, through optical barriers, while imposing minimal data delays at each repeater point.

Yet another object of the present invention is to provide multiple translations of electrical-to-light signals and light-to-electrical signals along a data path without requiring intermediate data-storage memory at any of the translation points.

A further object of this invention is to provide bi-directional repeating of frequency-alternating synchronized light signals through or around optical barriers. In this application, two transceivers are electrically connected together and may share a common power source. Both transceivers are normally in "receive mode," until one receives a frequency-alternating synchronized light signal. The receiving unit then switches the other transceiver to "transmit mode", passing its demodulated electrical signals to the opposite transceiver.

Another object of this invention is to form a wireless local-area-network among computers and/or their peripheral devices or systems. Such a light-path network may operate in half-duplex mode (one direction at a time) or, when enclosed light paths are provided and twice the number of transceivers are equipped, in full-duplex mode (both directions simultaneously).

Yet another object of this invention is to restore, by receiving and re-transmitting from a second physical source, the strength and integrity of frequency-alternating synchronized light signals.

Yet another object of this invention is to pass Manchester-encoded serial data, via light path(s) among devices employing such serial data formats, imposing minimal data delays.

An additional object of this invention is, by means of appropriately-designed decoders and encoders, to convert Manchester-encoded serial data to non-return-to-zero form, for modulation of a light source as previously described, and to re-format the demodulated light signals for presentation to receiving equipment as Manchester serial code, thus permitting transmission of Manchester data at the same maximum rates as non-return-to-zero (NRZ) data. Such decoders and encoders are usually designed to operate at only one (the highest achievable) data rate. At sub-multiples of the maximum data rate, the encoder and decoder are disabled, as the invention is able to pass these lower-rate Manchester signals transparently, without additional signal treatment or manipulation.

Yet another object of this invention is to transmit and receive, via a light path, data at any baud-rate within the operational limits of the circuit components used, by appropriate selection of clock-frequency control elements (oscillators, crystals, resonators, or the likes).

A further object of this invention is to pass Manchester-encoded signals via frequency-alternating-synchronized light signal paths at approximate sub-multiples of the maximum baud rate, transparently, using less precise, or somewhat off-frequency clocks. This can be done because, at each data bit time, at least one transition of the Manchester signal will have occurred, causing frequent re-synchronization of the modulated-light transmitted signals to the data transitions and avoiding bit-state errors which would occur if re-synchronization of the transceivers were less frequent, as is true for non-return-to-zero data.

BRIEF DESCRIPTION OF THE DRAWINGS

The advantages of this invention will become apparent upon consideration of the following detailed disclosure of the invention, especially when taken in conjunction with the accompanying drawings, wherein:

FIGS. 2A and 2B are timing diagrams which illustrate the timing and general operation of a preferred embodiment of a frequency-alternating synchronized infrared (FASIR) transceiver-circuit set. This diagram is sufficiently detailed to show the modulator and demodulator behavior, in response to transferred data, as well as the typical timing characteristics seen in the operation of the present embodiment.

FIGS. 5A, 5B, and 5C form a glossary of logic symbols, defining the specialized logic symbols used in the detailed logic diagrams.

FIGS. 7A and 7B and FIGS. 8A and 8B are timing diagrams which illustrate the operation of the period counter and related elements within the logic implementation used within the preferred embodiment for modulation and transmission of infrared pulses, under various operating sequences.

FIG. 23 is a detailed logic diagram of the output signal multiplexer circuits.

DESCRIPTION OF THE PREFERRED EMBODIMENT

Figure 1:
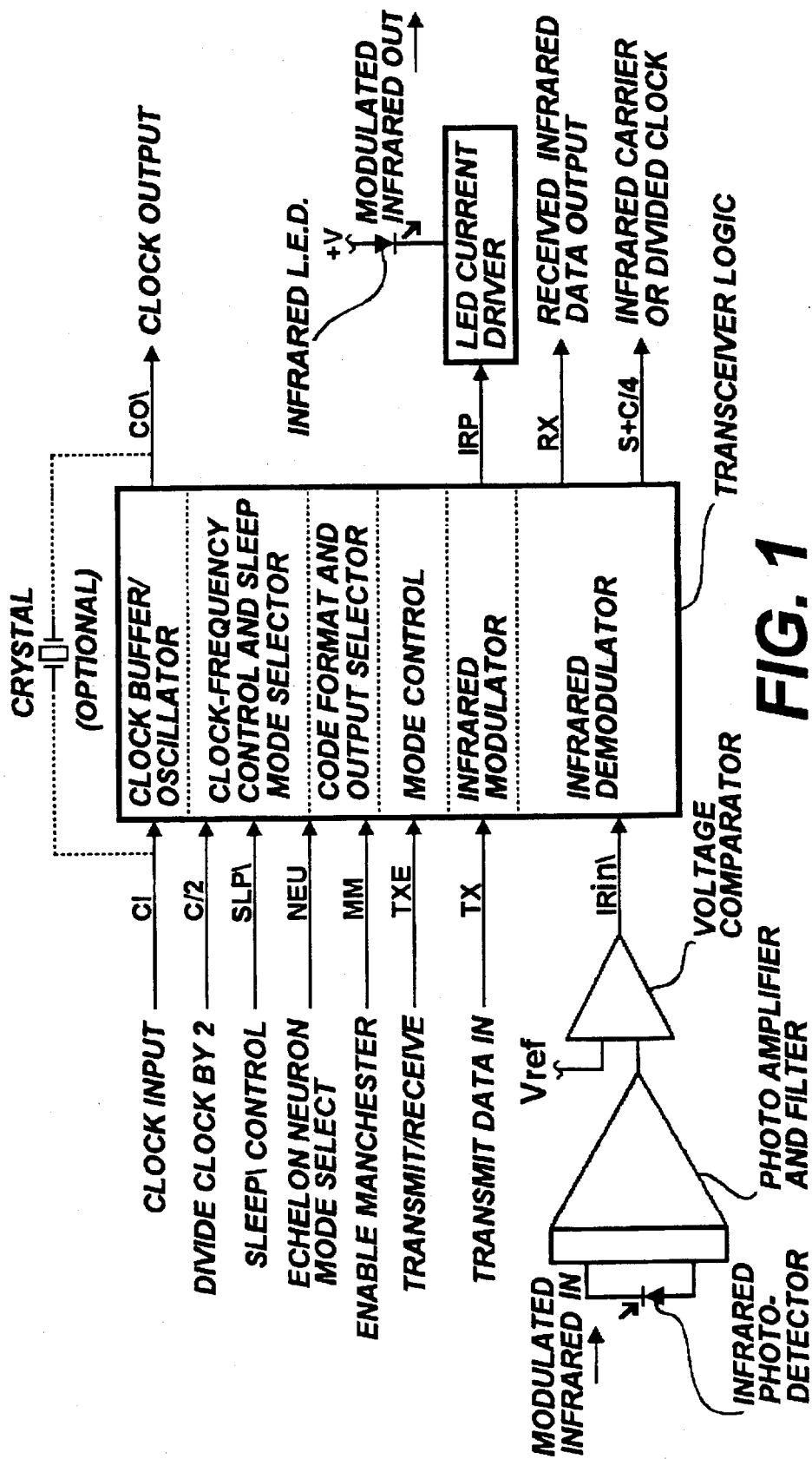
FIG. 1 is a functional block diagram showing the elements of the invention employed to translate electrical signals to frequency-alternating synchronized infrared (or other light) for transmission via a light path. This diagram shows a generalized embodiment of all signal paths used to modulate and transmit light signals of the type required of this invention.

With reference to FIG. 1, the following will describe the major functional elements and the external signals required in the implementation of a preferred embodiment of the FASIR infrared transceiver.

The key elements of the system consist of an infrared light-emitting-diode (LED) or other high-speed light emitter, a gated-current LED driver, an infrared photodiode or other high-speed light sensor, a photo-amplifier-filter, an infinitely-clipping voltage comparator, transceiver logic and a suitable clock source.

In the lower, right portion of FIG. 1 is shown the gated-current LED driver and an (representative) infrared LED. The signal, IRP (infrared pulse), is an output from the infrared modulator portion of the FASIR transceiver logic which causes the gated-current LED driver and its infrared LED to produce a continuously-modulated light beam, for reception and demodulation by a similar transceiver at a distance. Any number or type(s) of light-emitting diodes may be used to form the modulated light source.

In the lower, left portion of FIG. 1 is shown the infrared photodiode, its output signal amplifier and infinitely-clipping comparator. The photodiode, properly biased, operates as a variable-current source when exposed to a light source matching its spectral response characteristics. When pulsed infrared light impinges upon the photodiode, it produces an electrical current, proportional to the intensity of the light imposed upon it, thereby reproducing electrical pulses which correspond to the pulses of impinging light. This varying current is impressed through a load resistance to produce a pulsating voltage in the microvolt range. The voltage pulses, thus developed, are passed through a high-gain amplifier-filter, designed to increase to a usable level, the pulses within the frequency range intended, while minimizing any such signals which lie outside the frequency range intended. Each amplifier stage is also equipped with electrical signal limiters (usually clamp diodes), to prevent saturation which would degrade the photo-amplifier frequency performance at much higher signal levels, as would be produced if the distance from the light emitter were small.

Also in the lower, left portion of FIG. 1, following the photo-amplifier, is a voltage comparator. The purpose of this comparator is to change its output state as a logic level when the output signal from the photo-amplifier exceeds a predetermined level. This sets a maximum-sensitivity limit below which impinging light will not be detected, and, when the received light energy is sufficient, produces logic pulses which correspond to the light pulses detected. These logic pulses are passed to the FASIR transceiver infrared demodulator which reconstructs from the pulses, the serial data which produced the modulated light at the sending transceiver.

In the center of FIG. 1 is an enclosed section which depicts all of the essential logic functions required of the preferred embodiment of the invention. These functions consist of a clock-buffer/oscillator section, a clock-frequency control and sleep-mode section, a code format and output selector section, a mode control section, an infrared modulator section, and an infrared demodulator section. Each of these sections have associated inputs and/or outputs, whose purposes and functions are described in the following:

FASIR transceiver logic input signals:

1. CI, Clock Input: Input to the logic clock inverting buffer. Connection point for an externally-provided logic clock, or a connection to a local series-resonant clock crystal (shown connected by dashed lines in FIG. 1).

2. C/2, Divide clock by 2 control input: A logic one state applied to C/2 selects the internal clock from a frequency dividing flip/flop. This permits operation of the transceiver logic, using a clock source of twice the frequency normally required.

3. SLP\, Inverted Sleep control input: A logic zero state applied to SLP\ disables internal clock activity to conserve power when the transceiver is not required to be active.

4. NEU (Echelon Neuron CHIP), NEURON mode select input: A logic one state applied to NEU enables a divide-by-⅔ clock prescaler circuit, and selects an input-clock divided-by-4, C/4, signal to appear at the S+C/4 output. A logic zero state applied to NEU disables the clock prescaler and selects a carrier-present signal, S, to appear at the S+C/4 output.

5. MM, Manchester Maximum-bit-rate code-format select input: A logic one state applied to MM enables an internal Manchester decoder to convert TX input signals to non-return-to-zero form for transmission, and selects the RX (received infrared) output signal from an internal Manchester encoder (MN internal signal). A logic zero state applied to MM operates the FASIR modulator from the TX input state directly and selects the RX output directly from the infrared demodulator (RXD internal signal).

6. TXE, Transmit Enable control input: A logic one state applied to TXE enables the infrared modulator circuits for infrared signal transmission. A logic zero state applied to TXE enables the infrared demodulator circuits for reception of infrared signals.

7. TX, Transmit Data input: Electrical form of the signal to be modulated and transmitted via infrared.
8. IRin\, infrared input signal: Logic level form of the infrared signal detected. Irin\ is the signal operated upon by the demodulator to recreate the data signal at RX corresponding to data (TX) modulated and transmitted via infrared from another transceiver.

FASIR transceiver logic output signals:
1. CO\, Clock Output: Output from the logic clock inverting bier. CO\ may be used to drive other associated external circuits, and/or to provide an active drive for a local oscillator crystal.
2. IRP, infrared Pulse: Output signal from the infrared modulator, used to control the gated-current LED driver circuit.
3. RX, Received Data output: RX, as selected by the state of the MM control input, is the electrical form of the data received from a transmitting transceiver, in view of the receiving transceiver's photodiode. If MM is at logic one, RX is presented in Manchester format and if MM is at logic zero, RX is in return-to-zero form.
4. S+C/4, Infrared Signal Present or Clock divided-by-4: In NEU mode, C/4 appears at this output for operation of a Neuron CHIP or other devices at a lower, power-conserving frequency. In non-NEU mode, the S (carrier signal) appears, indicating reception of FASIR modulated infrared input at sufficient strength for detection.

Figure 2B:
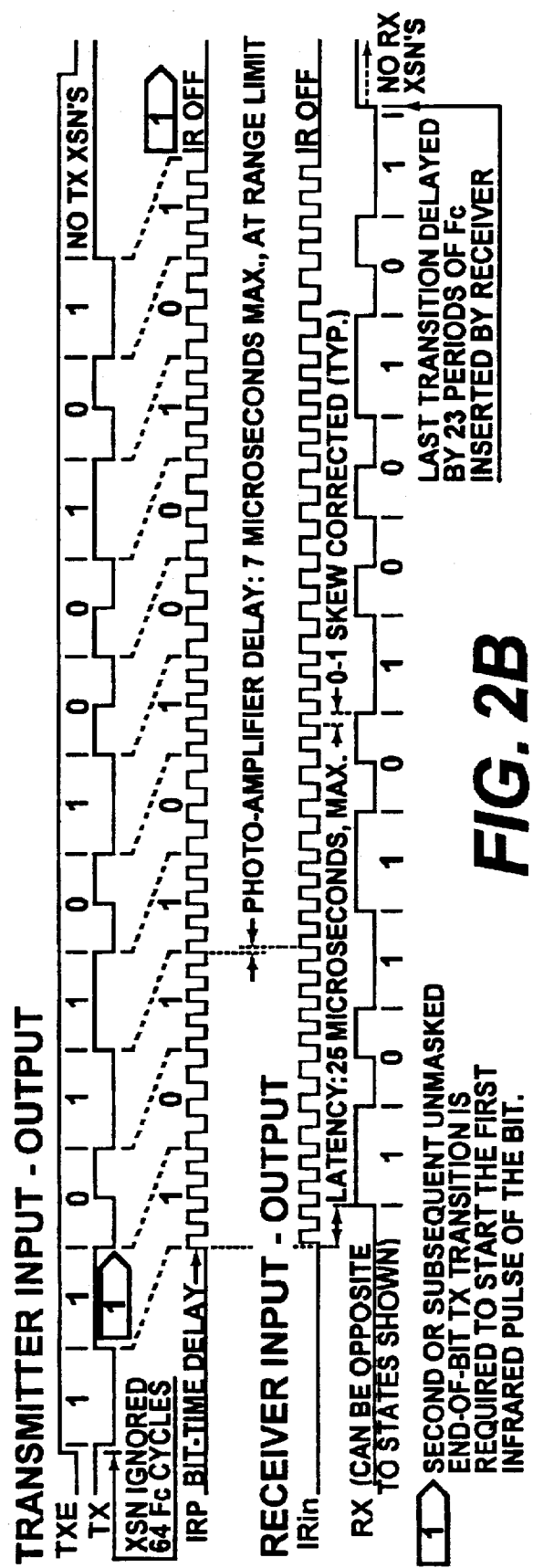

Referring to FIGS. 2A and 2B, two examples of infrared transmission and reception of the preferred embodiment of the invention are shown. The sequence shown in FIG. 2A, illustrates operation of a transceiver pair in return-to-zero mode (MM at logic state zero), at the maximum bit-rate permissible. The sequence shown in FIG. 2B, shows operation of a transceiver pair in the Manchester mode (MM at logic state one), also at the maximum permissible bit-rate.

In FIG. 2A, TXE is first driven from receive mode (zero) to transmit mode (one), at least one bit-time prior to the first data transition at TX. Two cases are shown with respect to this interval. In the first case (1) TXE is driven to logic state one earlier than in second case (2), as taken with respect to the time of the first TX transition. This is done to illustrate that two sorts of timing discontinuities may appear in the modulated infrared signal (IRP), depending upon this interval. In subsequent discussion, case 1 is referred to as the long one, early zero condition, while case 2 is described as the long one, late zero condition.

The long one, early zero [case (1)] condition occurs when the first one-to-zero transition of the TX input produces the beginning of an IRP pulse, due to re-synchronization of the modulator immediately following each signal transition, while a (data logic one) IRP pulse produced by the previous transition of TX or TXE is still being generated. This effect produces a "stretched" IRP pulse, which is unavoidable, and must be accommodated by the receiving FASIR transceiver. (See the circled pulses in FIG. 2A, under "RECEIVER" INPUT/OUTPUT").

The long one, late zero condition, shown as case (2) in FIG. 2A, occurs when the first one-to-zero transition of TX produces the beginning of an IRP pulse very shortly after the previous IRP pulse goes to logic zero. This effect can produce an out-of-band short-period pulse (foreshortened off-time) which is also unavoidable, and must be interpreted as a logic zero modulation period by the receiving FASIR transceiver.

Still referring to FIG. 2A, it should be noted that a TXE zero-to-one transition begins the generation of an IRP (infrared) pulse (almost) immediately, with the state of the TX signal determining which of two IRP pulse frequencies is generated. Although not shown here, a single, valid, logic one pulse must be detected by the receiver in order to "unlock" it for further reception. This requirement upon the receiver greatly reduces its response to spurious light, and can be imposed because logic one is the idle state for RS-232 formatted electrical signals. This feature is important in prevention of erroneous transmissions when two transceivers are connected as a FASIR infrared repeater set, each on opposite sides of an optical barrier.

As can be seen from the effect of the first TX data transition, each TX transition immediately drives the IRP pulse to logic one. Likewise, as will be shown, the internal period counter, which times all sub-clock-frequency events within the transceiver logic, is also synchronized to each TX transition when in transmit mode. When receive mode is invoked (TXE at zero), the period counter is synchronized to each negative-going transition of Irin\ (edge-of-presence of the detected infrared signal).

The re-synchronization of the transmitting, as well as the receiving, transceivers to the data-transmitted, maintains a coherent and predictable timing relationship between the transitions of data modulated by the transmitting transceiver and the infrared pulses produced therefrom, and between the infrared pulses received and the demodulated data extracted from these infrared pulses by the receiving transceiver. It therefore becomes possible to predict with precision all system delays and bit-transition timing distortion limits from input to final output, and through several intermediate signal-translations. Both data delays and bit-time distortions are minimal. Total data delays of a transceiver set are shown in FIG. 2.

In FIG. 2A, above the right portion of the RX time-line, is shown the effect of the correction of timing-skew, inherent in the modulation method used. As previously discussed, since the infrared pulses transmitted are, in the embodiment shown, three times the maximum permissible data-transition rate when the data state is logic zero and four times the maximum permissible data-transition rate when the data state is logic one, and, since the receiver cannot evaluate a pulse period until that period has passed, the first logic one period following a logic zero period is evaluated in less time than a first logic zero pulse following a logic one pulse. As it is desirable to minimize the overall data throughput delays, the receiving transceiver demodulator presents a detected data state change at the earliest time. That is, upon completion of the evaluation of the period of each pulse received. This outputting of demodulated data at the earliest time would create a "skew" in output data bit-times if a finite delay were not imposed upon the outputting of a first logic one pulse detection, occurring at the beginning of a bit-time. For this reason, a period counter state is decoded following evaluation of each first logic one pulse period in each bit-time which enables the forwarding of the logic one data state to the RX output of the receiving transceiver. As is indicated in FIG. 2A, above the right one-third of the RX time-line, this delay corrects any bit-time skew which would otherwise occur at the receiving transceiver RX output.

Inasmuch as the demodulator only times received infrared pulses from on-time-to-on-time (beginnings of pulses, only), any asymmetry in the pulses received does not effect bit-time distortions. If significantly large asymmetry occurs, the receiver sensitivity is reduced, due to the resulting attenuation of the frequencies of interest. Another source orbit-time distortions will result near the sensitivity limits of the photodiode and photo-amplifier, in the presence of interfering light sources, or if rapid changes of infrared signal strength occur during transmission. These effects are minimal when the distances between the transmitting LEDs and the photodiode are within easily-detectable ranges, and the line-of-sight path is unobstructed.

Any additional bit-time distortions which occur in the FASIR modulation, transmission, reception and demodulation processes are attributable only to the group-delay response characteristics of the photo-amplifier and associated elements. Prudent design of the photo-amplifier and its filter will compensate well for this effect.

In addition to the receiving transceivers one-carrier-period delay, the transmitting LEDs, photo-amplifier, comparator, transmitter and receiver synchronization and logic device signal-propagation delays contribute to additional delays in data-transition throughput. By a large margin, the photo-amplifier delays are the largest contributor to this effect, and the totals of all of these contributions have been measured at less than 8 microseconds at infrared signal strengths near the limits of reception of the embodiment shown. The worst-case photo-amplifier delays account for about 7 microseconds of this total.

In FIG. 2A, can be seen the relationship between the TX data states and excursions which produce corresponding IRP (and therefore, infrared light) pulses of durations equal to three-times the maximum permissible bit-rate, or four times the maximum bit-rate, for TX states of zero and one, respectively. Likewise, it can be seen that IRP is held at logic zero (infrared LEDs off) when TXE is at logic zero (receive mode selected).

Also in FIG. 2A, can be seen the response of the receiving transceiver to the reception of the electrical form of the infrared pulses, IRin, as they represent the FASIR modulated form of the TX data transmitted. IRin is shown as a positive-true logic signal and its logic one state represents the detected presence of the infrared signal.

Referring to FIG. 2B, showing the transmission and reception of maximum-rate data in Manchester-encoded format, it can be seen that an additional bit-time delay is incurred in the decoding of the TX Manchester code to non-return-to-zero form, prior to transmission via FASIR modulation. This form of Manchester encoding represents a data state of one by generation of a single (TX) signal-transition each bit-time, and represents a data state of zero by generation of two (TX) signal-transitions each bit-time. Nominally, the intervals between signal transitions representing a logic zero are equally spaced in time, with the additional transitions occurring midway in the data-bit interval. This form of serial data encoding is commonly used in transformer-coupled networks which provide electrical isolation among coupled elements. Since signal transitions occur constantly during transmission, such signals may be passed via A.C.-coupled paths. As an example, the Neuron CHIPs, developed by Echelon Corporation of Palo Alto, Calif., employ this data-encoding technique.

In order to pass Manchester-encoded data at the maximum permissible data rates for which a FASIR transceiver is designed, it is necessary to convert the (TX) Manchester-coded signals to eliminate the mid-bit-time transition which occurs when data state zero appears at the TX input of the transmitting transceiver. If this were not done, the transmitted infrared pulses would be interrupted mid-pulse and the effective maximum bit-rate (signal transition-rate) would be exceeded.

It should be noted that enabling of the Manchester mode of the transceiver (MM set to logic one) is only applicable when data is to be passed at the maximum permissible bit-rate for which the transceiver set is designed. When Manchester data is to be passed at integer sub-multiples of the maximum permissible bit-rate, the MM control input must be set to logic zero, disabling the transmitting transceiver's Manchester decoder, and disabling the receiving transceivers Manchester RX encoder. The following paragraphs describe FASIR transceiver operations when passing Manchester signals at the maximum permissible data rate with MM set to logic one.

Again referring to FIG. 2B, it can be seen that three conditions, necessary for determining the operations inherent in Manchester-coded signals, are provided in the transceiver. The three conditions which must be represented in the received Manchester signal are: 1. Presence of data-state one, 2. Presence of data-state zero, and 3. Absence of transitions (no transmission). In order to provide an indication that Manchester signals are not present, the transmitting transceiver produces no infrared pulses until a known Manchester state has been decoded, and a subsequent (unmasked) Manchester signal-transition occurs. To accomplish this, it is necessary to "mask" TX transitions which occur immediately after TXE is set to logic one. This is required because the state of TX, at the time of the transition of TXE, may or may not represent a valid Manchester transition, as the prior state of TX cannot be known. The masking "times out" one IRP data-zero pulse-period (not transmitted) after TXE is set to logic one. Thereafter, the first transition of TX begins the Manchester-to-return-to-zero decoding operation by capturing the logic level to which TX goes on the first unmasked transition.

The transition masking is restarted immediately after the first unmasked transition, and is active until one-half of an IRP pulse prior to the end of the bit-time. From this time, a "window" period equal to one IRP pulse interval (either a one or zero period), nominally centered about the expected end-of-bit transition, will permit transmission of the infrared pulse to begin, re-synchronizing the transmitter, and transmitting the decoded Manchester logic state of the bit-period just past. The Manchester-to-non-return-to-zero decoder captures the new state of TX following each unmasked transition and stores that state in a two-bit shift register. At the end of each valid bit-time, as marked by another unmasked transition of TX, the prior stored state is compared to the new state by an exclusive-OR gate. If the previous and new states differ, the bit is decoded as logic one, and if they are the same (indicating that a masked mid-bit-time transition has occurred), a logic zero is decoded. A valid Manchester signal will, within this plus-or-minus time window, present its end-of-bit-time transition. Each unmasked TX transition after the first, then, begins the IRP pulsing at the frequency corresponding to the Manchester logic value of the preceding bit period.

If the end-of-bit-time transition does not occur before the window interval expires, the transmitter regards this as an end-of-transmission Manchester code timing violation, and re-asserts the two-transition constraint upon the TX signal before resuming infrared transmission.

FIG. 2B shows an early, masked TX transition occurring shortly after TXE is set to logic one. This transition is ignored for 48 or 64 internal (Fc) clock cycles after TXE is set to logic one, depending upon the initial, arbitrary state of the Manchester decoder. A second TX transition is shown well-after the initial mask-time has expired, and the new state of TX is captured by the Manchester decoder shift register. Since the Manchester code state cannot be known until the next unmasked TX transition occurs, the modulator IRP output pulses are delayed until the end of this (in this sequence, third) transition. The net effect of the decoding of Manchester signals then, is an additional one-bit-time delay in transmitting the FASIR infrared pulses, as compared to the passing of return-to-zero TX signals shown in FIG. 2A.

Referring again to FIG. 2B, flag note 1, it should be noted that a second, or following, unmasked transition of TX is required to start the IRP pulses for each new bit-interval, and that the first expected pulse after cessation of Manchester transitions does not occur. The receiving transceiver therefore, does not receive a completed (last) bit-time and, if other provisions were not made, the ending transition of re-encoded Manchester data received would not appear at the RX output of the receiving transceiver. As a result, the last bit-state would not be forwarded to the receiving equipment. To remedy this potential problem, the loss-of-carrier algorithm, active in receive mode, causes the insertion of a final transition by the RX Manchester encoder during detection of the end of a FASIR transmission. Subsequently, following completion of carrier-loss detection, no RX output transitions are generated until valid reception of FASIR infrared signals is detected.

Figure 3A:
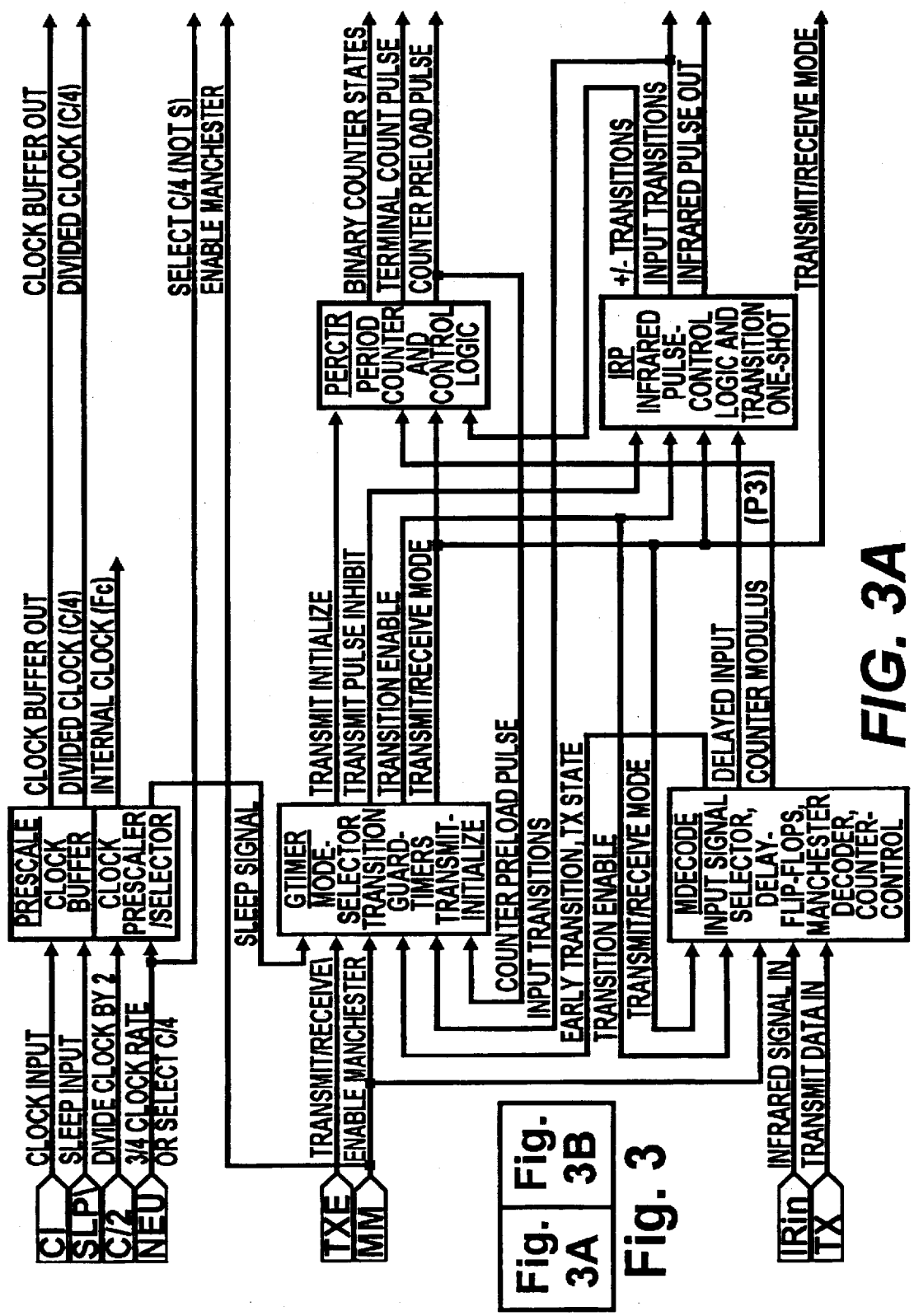
FIG. 3 is a simplified block diagram of the logic implementation of a preferred embodiment of a FASIR transceiver, being collectively formed by FIGS. 3A and 3B and showing major signals and signal-groups as passed into, out of, and among, the major functional logic sections.
Figure 3B:
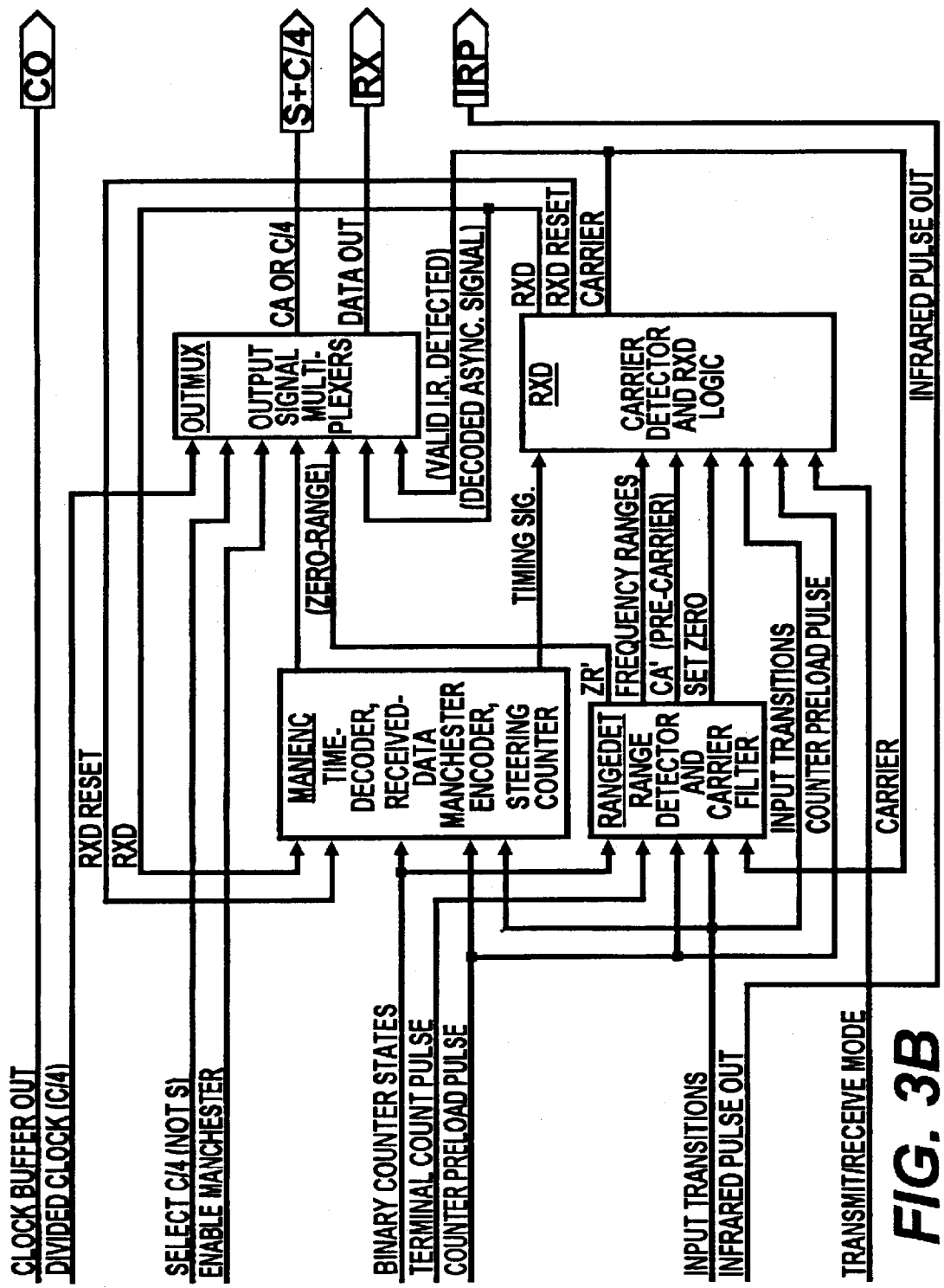

FIGS. 3A and 3B collectively form a simplified block diagram of the FASIR transceiver logic. Logic input signals are shown at the extreme left of FIG. 3A and logic output signals are shown at the extreme right of FIG. 3B. These are the same signals described in preceding paragraphs. The block diagram breaks the logic into sections which are internally more intimately related than are each block to another. Various signals and signal groups are shown passing among the blocks, and each signal or group of signals exits the originating block at the right of that block. All signals which enter a block at the left are used by logic constructs within that block, but are not generated within that block. This convention holds for FIGS. 1, 3 and 4, and should help to make the exchange of signals from block to block, and from input to output, more understandable. In the arrangement illustrated by FIGS. 3A and 3B, all signals or groups of signals, as well as each block, carry brief descriptive legends, but do not identify each individual signal by its mnemonic.

In the upper left corner of FIG. 3A, the enclosed section labeled Prescale consists of two parts. The upper part of this block is the logic-clock-inverting buffer/oscillator circuit, previously described. The clock buffer/oscillator requires a logic clock signal from an external source, or can generate a logic clock signal by connection of an oscillator crystal of appropriate frequency and resonant characteristic, along with its associated passive circuit components, between the clock buffer output (CO\) and its input (CI).

The lower part of this block is the clock prescaler, and the selector for dividing either the prescaled or non-prescaled input clock by 2as required to set Fc, the internal logic dock, to a frequency equal to 192 times the design bit-rate. The Fc, clock is the global logic clock used by all synchronous elements within the transceiver logic, excepting those flip-flops used in generation or control of the clock signals. This block also generates the divided clock signal and the sleep control signals. The clock prescaler requires the clock output (CO\) signal, the sleep input control signal (SLP\) the divide clock by 2 input control signal (C/2) and the divide clock by ⅔ input control signal (NEU).

The lower leftmost block of FIG. 3A is the Mdecode block, which selects the source of the input signals (TX in transmit mode, IRin\ in receive mode), generates the delayed forms of the input signals (TX) and (IRin) required for transition detection, contains the Manchester-to- non-return-to-zero TX input decoder and transition-mask gating and controls the modulus (preload values) of the period counter. These circuits also generate the early transition signal, used to produce the transmit pulse inhibit signals, and the period counter modulus control signal which determines the IRP frequencies when transmitting infrared pulses.

Below the Prescale block in FIG. 3A is shown the Gtimer block. This block contains the logic circuits concerned with selection of modes of operation of the transceiver (excepting NEU mode), and the guard-timer circuits which provide for masking of input transitions in transmit mode. This block also contains the transmit-initialization circuits required to control the timing of the beginning IRP pulse upon entering transmit mode (TXE set to logic one). This transmit initialize signal (XIN), the transmit pulse inhibit signals (BI and PEI), transition enable (TE) and transmit/receive mode signals (REC and XMT) originate in these circuits. The Gtimer circuits require the transmit/receive control input signal (TXE), the enable Manchester control input signal (MM), sleep signals from the Prescale circuits, the early transition signal and TX-state signals form the Mdecode circuits, the selected input transition signals from the Irp circuits, and the counter preload pulse from the Perctr circuits.

In the center rightmost portion of FIG. 3A is the Perctr block, containing the period counter and its immediately-associated control logic. The period counter is the master sub-clock-rate timer, whose states, periods and initialization control the generation of all timing required to modulate transmitted infrared pulses, generate mask intervals for transition guard timing, demodulate received infrared pulses, correct bit-time skew, detect the presence and absence of valid infrared FASIR carrier, and to control Manchester encoding of received data. Its output signals are the binary counter states, the terminal count pulse (TC) and the period counter preload pulse (PE). These circuits require the transmit initialize signal (XIN), the counter modulus control signa (PE), one of the transmit/receive mode control signals (REC), and the input signal decoded transition (XSN) signals.

Immediately below the Perctr block is the IRP block. This block contains circuits which decode the delayed states of the selected (TX or IRin\) input to develop one-clock-period pulses which represent the required transitions if the input signals (T+, T− and XSN). This block also contains circuits which generate or inhibit IRP (hence the infrared transmitted) pulses which drive the transmitting LEDs. Outputs from this block are the decoded input transition pulses and the infrared output pulse (IRP). These circuits require the transmit pulse inhibit signals (PEI and BI), the transition enable signal (TE), one of the transmit/receive mode control signals (XMT) and the delayed forms of the input signals (IN" and IN'"), used in the transmit mode.

The Rangedet block, containing the partial-decoding of the period counter states used to define the frequency limits of received infrared pulses (CR), and to define the part of the frequency range which the demodulator will detect as a data logic zero state (ZR") is shown in FIG. 3B. Also contained within the Rangedet block are the logic circuits concerned with carrier-detection filtering, including those circuits which the receiver requires to correctly manage the infrared pulse discontinuities which occur when a long one, late zero and long one, early zero conditions occur at the transmitting transceiver. Outputs of the Rangedet circuits are the decoded frequency-range signals (CR and ZR"), a pre-carrier signal (CA') and the set zero signal (SETZ), used to force a zero-state (receive infrared) detection in the presence of the infrared signal discontinuity created by the long one, early zero transmit condition described previously. Input signals required by these circuits are the period counter binary counter states and terminal count pulse (TC), the period counter preload signal (PE), the decoded input transitions derived from IRin (XSN), and the fed-back carrier output signal (CA).

The lower rightmost block in FIG. 3B is labeled Rxd, and contains circuits which, in transmit mode, detect presence or absence of valid FASIR infrared pulses and generate RXD, the return-to-zero form of the demodulated IRin\ received infrared signals. This block also contains the final output circuits used for carrier detection, RXD transition timing logic and RXD change-of-state pulse decoding for initialization of the Manchester encoder steering counter. Outputs from these circuits are RXD, the return-to-zero form of the demodulated FASIR signal received, the carrier output signal (CA) and the RXD reset signal (RXDR), used to steer the generation of RXD within the block, and used to by the Manenc block to control initialization of its steering counter. The Rxd circuits require timing signals decoded from the period counter states by the Manenc circuits (W and T73), the period counter preload pulse (PE), the input transition decoded pulse (XSN) frequency range signals (CR and ZR') also decoded from the period counter states by the Rangedet circuits, the filtered carrier signal (CA'), and the set zero signal (SETZ).

Just above the Rangedet block in FIG. 3B is the Manenc block which contains the period counter time decoder, the received-data Manchester encoder and its associated steering counter. The Manenc block outputs are the Manchester-encoded form of the received (IRin) FASIR infrared data (MN) and timing signals (W and T73) used for skew correction by the Rxd circuits. Inputs to the Manenc block are the receiver mode signal (REC), the zero-range signal (ZR'), the pre-carrier signal (CA'), the carrier signal (CA), the period counter preload signal (PE) the period counter binary states, the period counter preload pulse (PE) and the decoded input-signal transition pulses (XSN) derived from IRin, and the RXD and RXD-reset signal (RXDR).

The upper rightmost block in FIG. 3B is the Outmux block. This contains the output signal selection multiplexers which, under control of the NEU and MM mode control input signals determine which signals are passed to the S+C/4 and RX outputs of the FASIR transceiver logic. Outputs from the Outmux circuits are S+C/4 and RX. Inputs required by this block are NEU, MM, the carrier signal, the divided clock (C/4), the RXD signal and the Manchester output.

FIG. 4 depicts the relationship by which FIGS. 4A–4D collectively depict a detailed block diagram of the FASIR transceiver logic, showing the same blocks as described above, arranged as in FIGS. 3A and 3B, but identifying by mnemonic each individual signal passed among the various logic sections. Flags at the right side of each block identify the logic device and pin number of the device from which each signal originates. Flags at the far left of the diagram identify the mnemonic of each external input signal, and flags at the far right of the diagram identify the mnemonic of each external output signal. This diagram serves as a "map" into the descriptions of each of the detailed logic diagrams which are used in subsequent paragraph to describe the contents and operations of elements within the FASIR transceiver logic sections (blocks).

FIGS. 5A, 5B and 5C describe the functions and operations represented by the specialized logic element symbols used in the detailed logic diagrams, along with references indicating the diagrams in which they are used. This glossary of symbols is required to understand the behavior of the circuits depicted in the detailed logic diagrams in which they appear. Referral to the glossary should be commensurate with examination of the detailed logic diagrams.

In the logic diagrams, described in the following and subsequent paragraphs, in many cases are shown inverted, as well an non-inverted logic-senses of the signals described. The specific polarities of these signals were chosen only for convenience of design, or to manage accumulated logic-device propogation delays in commonly-available technologies. Also, Boolean-equivalent gate symbols are not used in the diagrams, as many (logic-one-true) functions are formed from combinations of signals of both senses. This fact forces departure from the boolean-equivalent use-rules, and creates difficulties in discerning the uses, or the originations, of many signals. Mnemonics are chosen to represent origins or uses of the signals, and all inverted-sense (logic-zero-true) forms of the signals are identified by a backward-slash symbol (\), immediately following the mnemonic.

Figure 6A:
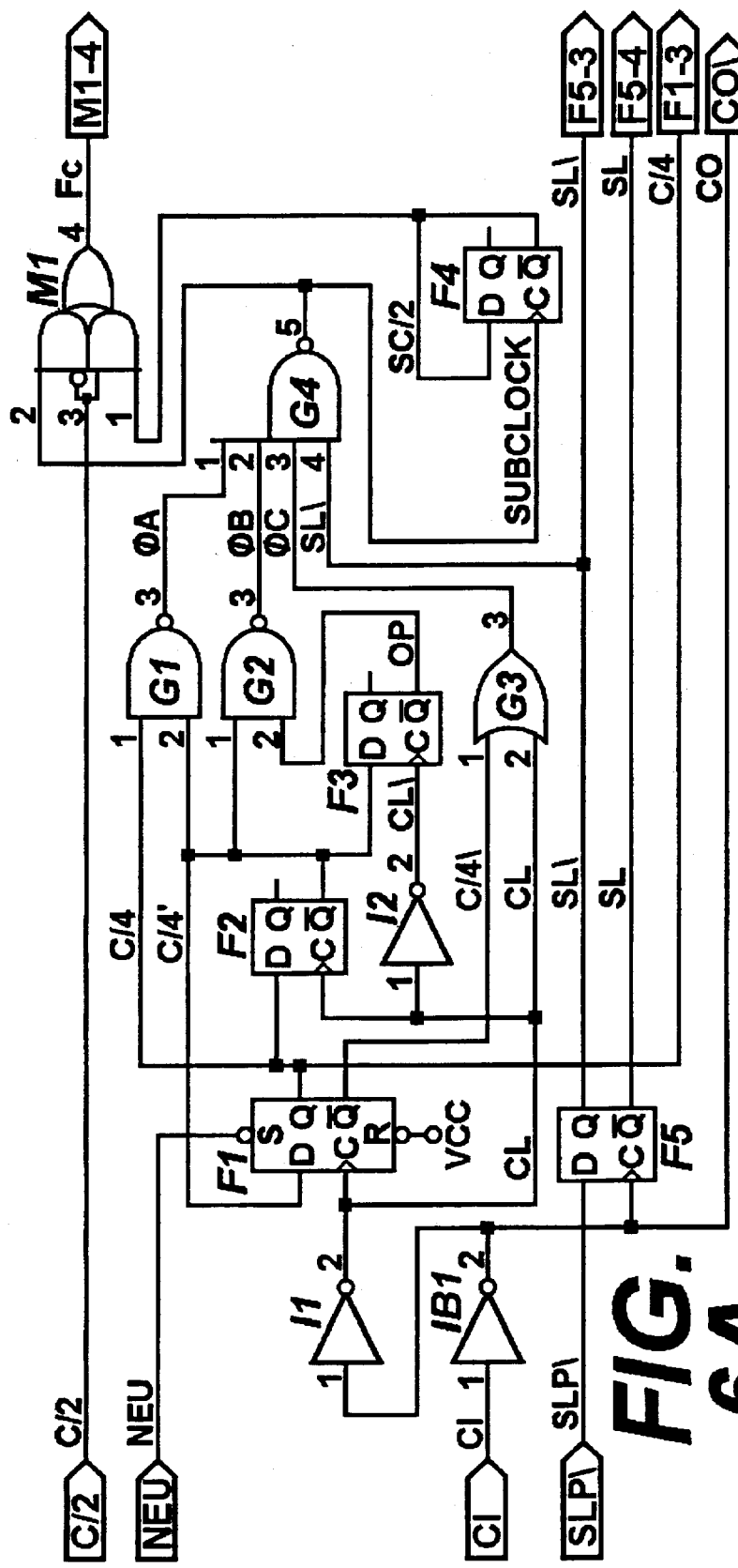
FIG. 6A is a detailed logic diagram dock-buffer and clock prescaler circuits.

FIG. 6A details the logic implementation of the clock buffer/oscillator and prescaler circuits, shown as the Prescale block in FIGS. 3 and 4. In the logic diagram at the upper left, IB1 (inverting buffer 1) is a high-current-output logic-level inverter which is used to accept an externally-generated clock signal at its input (CI), or to provide an oscillator-drive amplifier function to generate the system logic clock through use of a local oscillator crystal or resonator. In either case, the buffer output (CO\) can be used to drive docked peripheral devices as well as the FASIR transceiver logic. The clock signal thus provided is passed within the circuit section to F5, the SLP\ (sleep control input function) flip-flop, which captures the state of the SLP\ control signal following each positive transition of the CO\ clock. F5 synchronizes transitions of the SLP\ signal to the internal clock to prevent unpredictable states in the various docked elements throughout the transceiver logic which are affected by the sleep function. Both logic senses, SL and SL\ (positive-true and negative-true) forms of the captured SLP\ input are passed to other logic sections.

The remainder of the Logic diagram in FIG. 6A is concerned with the development of Fc, the internal logic clock, and C/4, the ¼-frequency clock which is output as S+C/4 when NEU input is at logic one state. These operations can best be understood by referring to the logic diagram and the timing diagram of FIG. 6B.

Figure 6B:
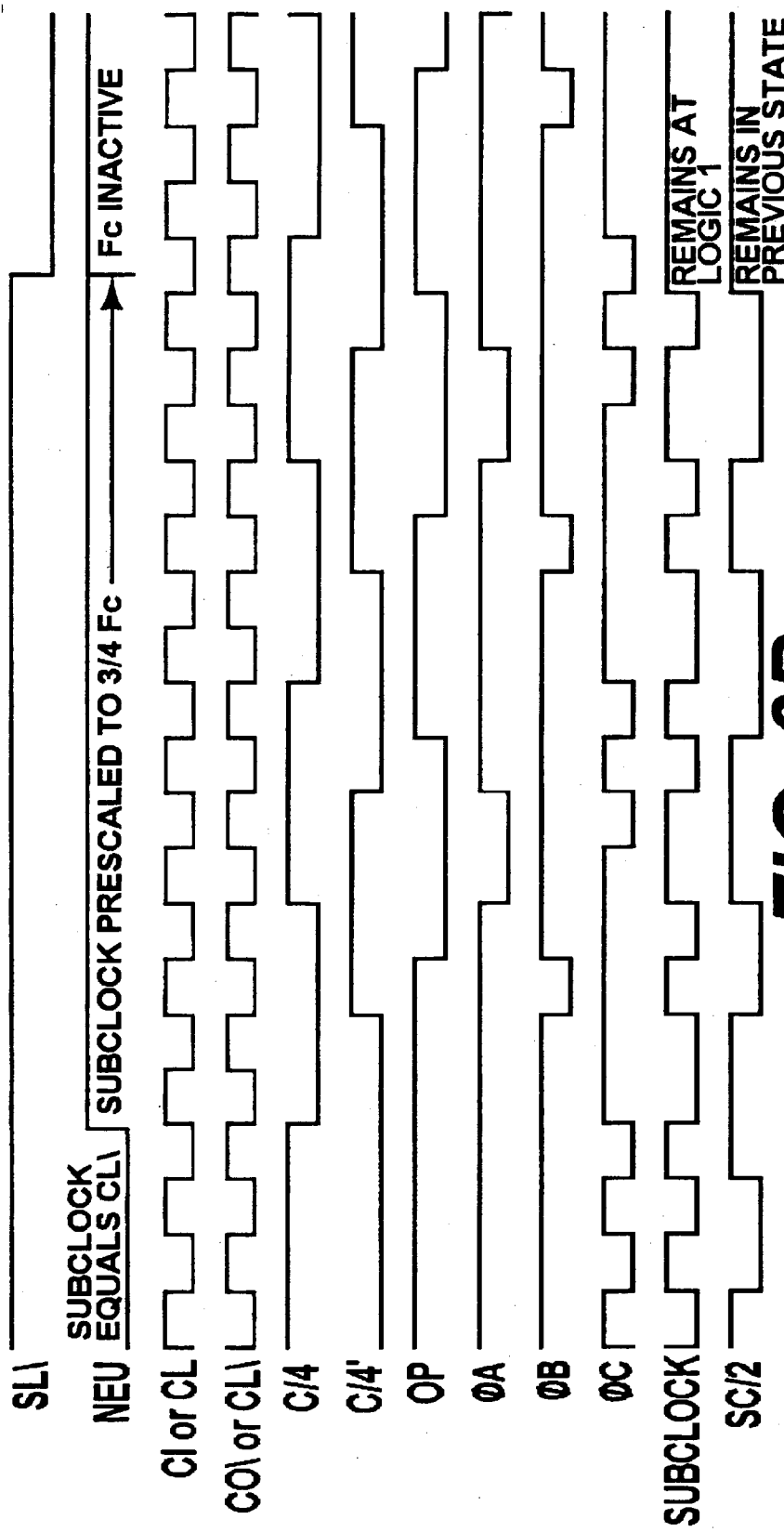
FIG. 6B depicts a timing diagram for the clock-buffer and clock prescaler circuits of FIG. 6A.

As can be seen in the upper left part of the logic diagram of FIG. 6B, the NEU signal operates as an inverted reset signal to flip-flop F1. With NEU set to logic zero, disabling the divide by ⅓ clock prescaling, F1 "Q" output (C/4) is driven to its logic one state, and F1 "Q̄" output (C/4\) is driven to logic 0 state, as described in the Glossary of symbols in FIG. 5, symbol 3. With an appropriate logic clock operating (CL active), the complement of the C/4 state is passed to F2 "D" input (C/4' goes to logic zero), as described in FIG. 5, symbol 2, upon the next positive transition of CL (driven by inverter I1). One-half CL-clock period later, the logic zero state of C/4\ causes OP, at F3 Q output, to be driven to logic one. The states of C/4 (logic one), C/4\ (logic zero), C/4' (logic zero), and OP (logic one) are held so long as NEU remains at logic zero. The logic zero state of C/4' holds Nand gate G1 pin 3 (0A), and Nand gate G2 pin 3 (0B) at logic one. C/4\ at logic zero then permits the CL clock signal to pass through Or gate G3 from pin 2 to pin 3 as 0C. With SLP\ at logic one (sleep mode not selected) and 0A, 0B, and SL\ at logic one, 0C drives Nand gate G4 from pin 3, producing the logical complement of CL at G5 pin 5, as SUBCLOCK. SUBCLOCK, in this mode, is the gated equivalent of CO\, the complement of the input clock. SUBCLOCK appears at pin 2 of the two-input Multiplexer, M1, and is applied as the clock input of the divide-by-two flip-flop F4 at the "D" input, forming the ½ SUBCLOCK frequency SC/2, at F4 "Q" output and M1 pin 1.

These sequences for NEU set to logic zero are shown in the FIG. 6B timing diagram, under the note on the NEU line "NO PRESCALING". If C/2, the divide clock by 2 signal, is at logic zero, M1 passes SUBCLOCK, at the frequency of CO\, to its output at pin 4 as Fc, the internal logic clock. With C/2 at logic one, M1 passes the SUBCLOCK-divided-by-2 signal, SC/2, to its output at pin 4 as Fc, at half the frequency of CO\. The state of C/2 control input is determined by the choice of the external clock or Crystal frequencies connected to CI. For any maximum data-transmission-rate, the internal logic clock frequency, Fc, must be 192 times that rate. In the case shown, the maximum data rate for the mode where NEU is zero (non-Neuron CHIP mode) is 19.2 Kbps. The frequency of Fc must then be 19200×192, or 3.6864 MHz. If an external clock or crystal of 3.6864 MHz is to be used, C/2 is set to logic zero for proper operation. If, however, it is desirable to use a 7.3728 MHz external clock or crystal for external circuit requirements, C/2 is set to logic one.

With NEU control input set to logic one (Neuron CHIP mode selected), the maximum data rate will be binary sub-multiple of 10 MHz. In the case shown, the maximum design data rate would then be 10,000,000/512, or 19.5313 Kbps, slightly more than 1.7% greater than 19.2 Kbps. This data rate is easily supported as FASIR infrared modulated light signals by the same linear circuit elements (LEDs, LED driver, photodiode, photo-amplifier and infinite-clipping comparator) of a FASIR system designed for a 19.2 Kbps data rate. It is still required that the Fc clock frequency be equal to 192 times the (NEU) maximum bit rate, in this case, 19531.3×192 or 3.75 KHz. To obtain 3.75 KHz from a 5 MHz or 10 MHz clock, the prescaler divides the CI frequency by ⅓ as described below, and as shown in FIG. 6.

Still referring to FIG. 6B, the generation of a ¾ CI-frequency Fc internal logic clock is performed as shown in the timing diagram, under the note below the NEU line, "PRESCALER DIVIDES CL BY ⅓—". With NEU set to logic one, the state of flip-flop F1 (in FIG. 6A) is not forced. The combination of F1 and F2 then operates as a modulo-2 Johnson counter, generating the pattern of states shown from the time C/4 first goes to logic zero, commensurate with the first positive-going transition of CL following the setting of NEU to logic 1. Following each subsequent positive transition of CL, the complement of the prior state of C/4 is clocked via F2 to C/4', and the prior state of C/4' is clocked via F1 to C/4. The four-state sequence of FI and F2 outputs continues in this pattern so long as NEU is at logic 1 and CL continues its regular transitions. Flip-flop F3 (FIG. 6A), clocked from the inverted CL signal at I2 pin 2, duplicates the complemented states of C/4, delayed by one-half cycle of CL, producing the timing pattern in the diagram for OP. GI Nand gate combines C/4 Nand C/4' to produce the pattern, ⬤A, G2 Nand gate combines C/4' Nand OP to produce the pattern, ⬤B and G3 Or gate combines C/5\ Or CL to produce the pattern, ⬤C. With SL\ still at logic 1, Nand gate G4 (used as an inverted-input Or gate) further combines ⬤A, ⬤B, and ⬤C, to produce the signal, SUBCLOCK.

The effect of the (sum-of-products) operation of the named gates upon the above described ⬤A, ⬤B and ⬤C functions, is to generate a SUBCLOCK signal that replicates three subsequent transitions of the CL clock, skips one transition, replicates three, skips one, continuously. This transition-by-transition clock division produces a SUBCLOCK frequency of exactly three-fourths the frequency of CL (or CI), with the minimum possible variations from one positive transition to another.

The clock cycle-by-cycle "jitter" thus produced, is never greater than one-half of a CI (or CL) clock period (assuming a symmetrical CI clock signal), and maintains the shortest possible jitter-repetition interval that can be produced by logic-implemented timing which does not employ higher-frequency clocks in the frequency reduction process. Further, if the SUBCLOCK signal is derived from the higher-allowable-frequency input clock source (10 MHz in this example) the cycle-by-cycle timing variations are further reduced by a factor of two as a minimum, by flip-flop F4, as C/2 must then be set to logic one to select SC/2 as the Fc internal logic clock. This is shown as the last signal at the bottom of the timing diagram in FIG. 6B.

At the right portion of the timing diagram in FIG. 6B is shown the effect of SLP\ set to logic one, invoking sleep mode, which stall the Fc clock to reduce power consumption when the transceiver is not required to operate. Flip-flop F5, clocked by CO\, frames the changes of state of the SL and SL\ functions to assure that the minimum setup time requirements of all clocked elements with the transceiver logic will be met before the Fe clock transitions are stopped, or started. This prevents excessively short clock pulses from driving the clocked elements into unpredictable states.

Finally, when the transceiver is operated in NEU mode, the Johnson counter formed by flip-flops F1 and F2 provide a one-fourth-of the CI frequency clock which, in NEU mode, is passed to the transceiver S+C/4 output. This clock may be used by external devices, as needed.

Figure 7A:
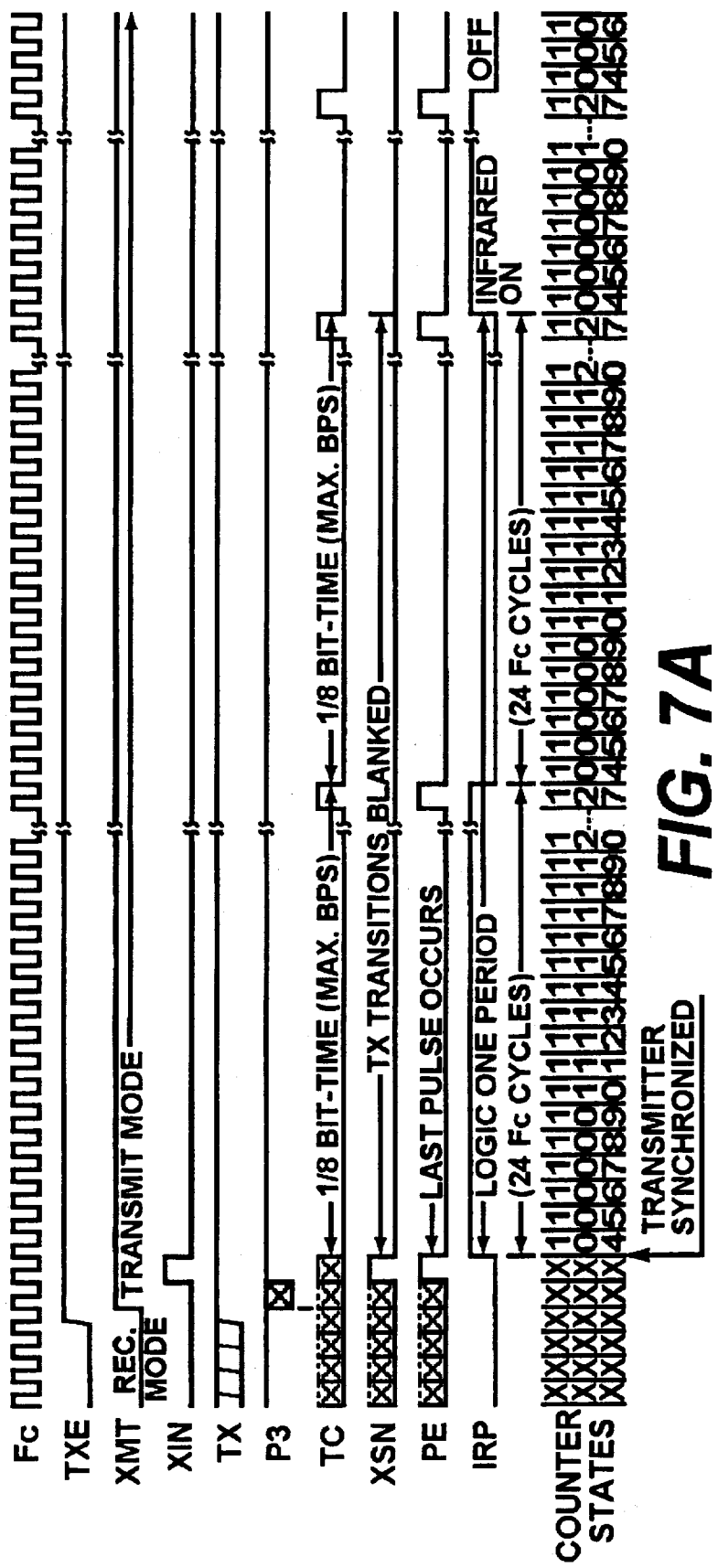
Figure 7B:
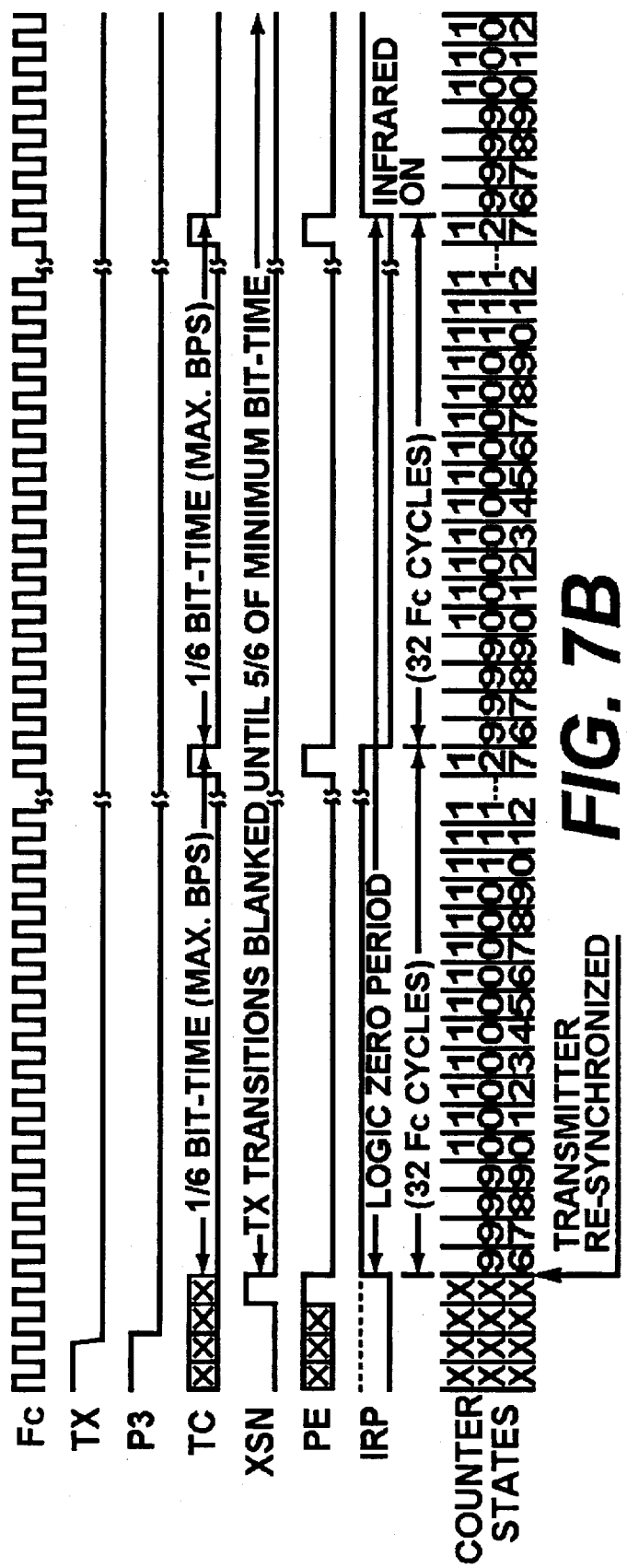
Figure 8B:
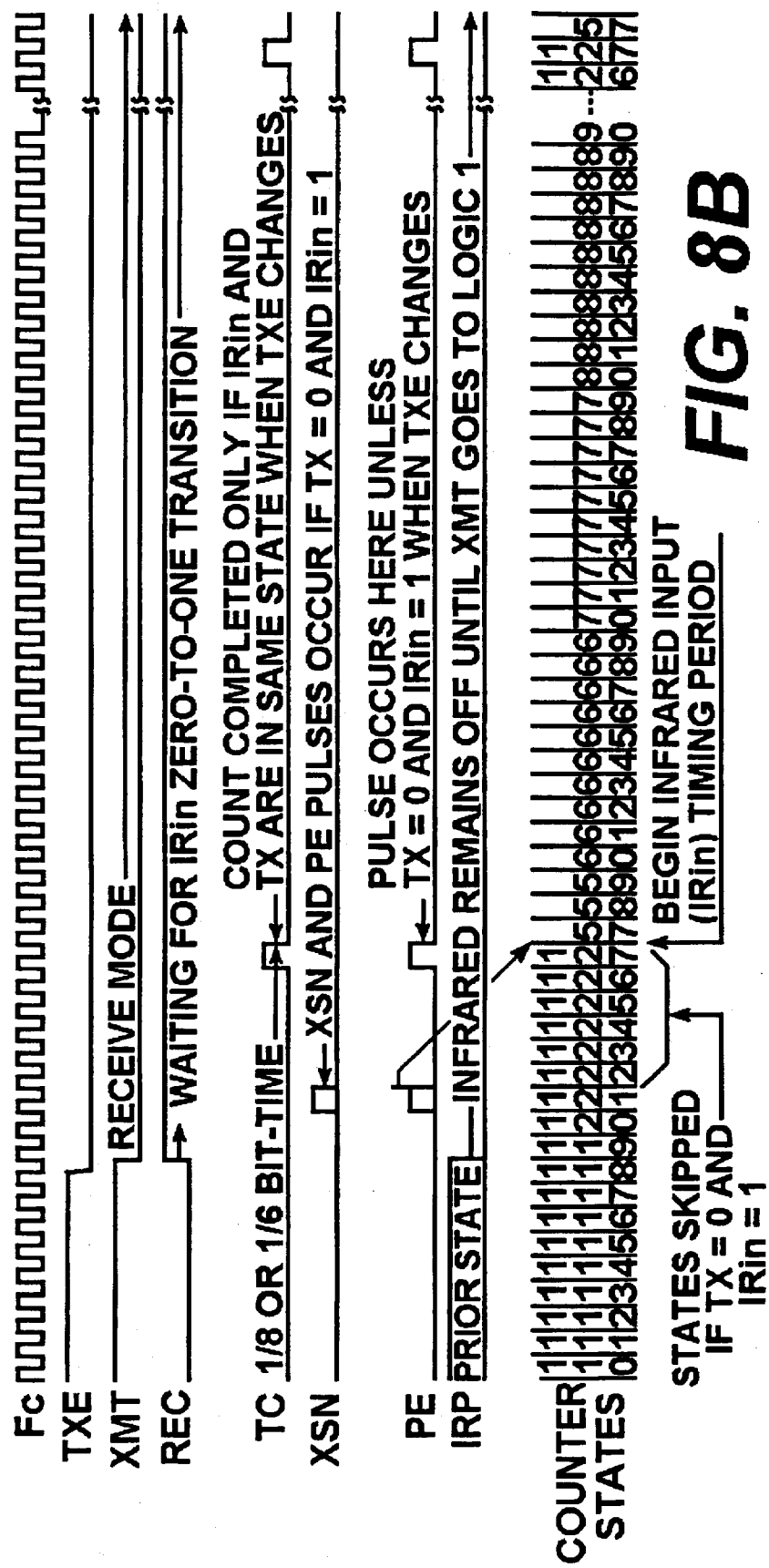

FIG. 7A is a timing diagram which illustrates the FASIR infrared transmission of the beginning of a first logic one data state and FIG. 7B illustrates the beginning of transmission of a logic zero data state, on a scale that permits examination of the signals shown on a cycle-by-cycle (of Fc) basis. The companion diagrams of FIGS. 8A and 8B illustrate, on the same scale, the FASIR infrared transmission of a subsequent logic one (FIG. 8A), upon ending of an infrared transmission, the return of the transceiver to receive mode (FIG. 8B). Detailed timing relationships of the transceiver logic are shown as the counter states, counter modulus control (P3), the TX transition pulses (XSN), the period counter preload-enable pulses (PE), and the infrared output pulses (IRP) are generated in response to the states and/or state-transitions of the transmit/receive control input (TXE) and the input data transmit signal (TX). The counter and other flip-flops are sequenced by the internal logic clock signal (Fc). An examination of these diagrammed sequences and noted events and intervals will help to clarify the operation of a transmitting FASIR transceiver and in particular, the role of the period counter and its associated control logic, in modulation of infrared signals. These operations will be explained more fully in the descriptions of the operation of each logic section in subsequent paragraphs. It is useful, however, to understand the general relationships of the signals shown, in advance of the detailed descriptions to follow.

In each of the sequences shown in FIGS. 7A and B and FIGS. 8A and B, TXE is synchronized to the internal clock, Fc, by its input flip-flop, and then gated with SL and SL\ (sleep mode signals) w generate XMT, the internal transmission-enabling mode signal. A logic one-shot, formed by two more flip-flops and a gate, generate a transmit-initialization pulse of one Fc clock period, XIN. XIN is one of the terms used to generate the period counter preload enable pulse, PE, just after the REC and XMT signals have disabled IRin as the controlling signal input, and selected TX as the controlling input. All of the diagrams in FIGS. 7 and 8 assume that SLP\ is at logic 1, permitting the Fc clock to run at its required frequency.

At the beginning of transmission shown in FIG. 7A, TX, in Manchester mode (MM set to logic zero), as captured by the first input-delay flip-flop (IN', not shown), directly controls the states of the period modulus control signal, P3. The delayed input signal flip-flop states are decoded to generate the input transition pulses, XSN, T-\ and T+\, corresponding to the negative-going and/or positive-going transitions of TX. Also, each time the period counter reaches its highest count-state, 127 decimal, the terminal-count-state pulse, TC, is generated. The logical Or of XIN, XSN or TC create the period counter preload pulses, PE. That is, any of these pulse signals will, on the following Fc zero-to-one edge, cause the period counter to be set to one of two possible starting states, 104 decimal when P3 (determined by the captured state of TX) is at logic one, or 96 decimal when P3 is at logic zero.

It can be seen, referring to FIG. 7A, that when TX is at logic one before TXE is captured to form XMT, P3 will be at logic one and the subsequent pulse of XIN will, upon the following Fc zero-to-one transition, preload the period counter to state 104 decimal. In FIG. 7A, the PE pulse derived from XIN also begins the first infrared pulse, setting IRP to logic one. IRP remains at logic one until the period counter reaches 127 decimal, 24 Fc periods later. The TC (terminal count) pulse thus generated, creates another PE pulse, again preloading the counter to 104 decimal and causing IRP to be toggled to logic zero. Another 24 Fc periods pass, the period counter again reaches 127 decimal, TC creates another PE pulse, and IRP is toggled to logic one again. This sequence repeats every 48 Fc periods, so long as TX remains at logic one, generating symmetrical IRP (infrared pulse) signals at the rate of exactly four pulses each minimum bit-time interval. This infrared pulse period is interpreted each cycle by the receiving transceiver as a data-state logic one. For example, if the Fc clock frequency is 3.6864 MHz, 48 periods of Fc is 76.8 KHz, or exactly four times 19.2 Kbps.

In FIG. 7B, it is assumed that the duration of the transmission of a preceding data logic one state is unknown. For that reason, the period counter states and the state of TC is initially unknown, as is the state of IRP, until a new transition of TX has occurred. One Fc clock period after the one-to-zero transition of TX is captured by the first input flip-flop (F22, shown in FIG. 12), XSN is generated for one Fc period. XSN directly sets the IRP signal to logic 1 upon the next Fc positive transition, and creates a PE pulse to preload the period counter. P3, corresponding to the new state of TX. P3 is, in the period of the PE pulse, at logic zero, causing the counter to be preloaded to state 96 decimal. IRP remains at logic one until the period counter reaches 127 decimal, 32 Fc periods later. The TC pulse, thus generated, creates another PE pulse, again preloading the counter to 96 decimal and causing IRP to be toggled to logic zero. Another 32 Fc periods pass, the period counter again reaches 127 decimal, TC creates another PE pulse, and IRP is toggled to logic one again. This sequence repeats every 64 Fc periods, so long as TX remains at logic zero, generating symmetrical IRP (infrared pulse) signals at the rate of exactly three pulses each minimum bit-time interval. This infrared pulse period is interpreted each cycle by the receiving transceiver as a data-state logic zero. For example, if the Fc clock frequency is 3.6864 MHz, 64 periods of Fc is 57.6 KHz, or exactly three times 19.2 Kbps.

The notes placed on the XSN lines in FIGS. 7A, 7B, and 8A indicate the intervals for which the transmit-initialization circuits and transition guard circuits "blank" the modulator's responses to TX transitions following the initial TXE zero-to-one transition in FIG. 7A, and the detection of certain TX transitions in FIGS. 7B and 8A. These blanking (masked) intervals serve as a filter to prevent spurious TX changes-of-state from affecting the modulations of data, such as might otherwise occur due to signal "ringing", which can result from improper termination of the TX signal lines enroute to the transceiver. These "blanking" functions are essential when the transceiver is operated in Manchester mode, as will be shown in later paragraphs.

The only differences of consequence between the transmissions of logic one data in FIG. 7A and FIG. 8A, are that in FIG. 8A, the logic one data transmission is initiated by a TX zero-to-one transition rather than a similar transmission of TXE, and that the TX transition-blanking interval is ⅞ of a minimum bit-time from the unmasked transition, rather than 48 Fc cycles from the TXE transition, as in FIG. 7A. The importance of these functions will be more readily seen in subsequent descriptions of Manchester code infrared transmissions.

FIG. 8B illustrates the end of transmission and the invocation of the receive-infrared mode of the transceiver. All input transition blanking (masking) is suspended in receive mode, as it would otherwise interfere with detection of the faster-changing IRin states, and is otherwise unnecessary. At the beginning of FIG. 8B, it is assumed for the sake of clarity that TX transitions do not occur just before setting TXE to logic zero. This would usually be true, and would not in any case substantially alter the operations shown. FIG. 8B shows then, the continuing infrared transmission of a data state (either one or zero), prior to the setting of TXE to logic zero (receive mode). Since in the diagram, the states of TX and IRin are assumed to be unknown at the time of the TXE transition, the corresponding ambiguities in timing and the resultant ambiguous states of the period counter are also shown, as "XXX" values, in this sequence.

As determined by the states of the TXE mode control inputs (and SLP\, assumed to be logic one), the mode control logic circuits set XMT (internal transmit-mode signal) to logic zero, and the REC (internal receive-mode signal) to logic one when the TXE input flip-flop captures the new TXE state. The logic zero state of XMT changes the period counter preload value to 57 decimal, regardless of the state of the selected input signal (now IRin). XMT at logic zero also de-selects TX as the transceiver input signal, and REC at logic 1 selects IRin, the detected infrared signal, as the transceiver input signal, passing it to the input signal delay flip-flops. XMT at logic zero also disables one of the input transition decoding gate, causing the XSN signal to be generated only by (clock-delayed) logic zero-to-one transitions of IRin. The period counter preload signal, PE, is created only by TC (period counter terminal count) pulses or positive-going transitions of IRin (the edge-of-presence of each infrared pulse received by the photodiode). XIN, a function of only zero-to-one transitions of TXE, is not active in this sequence, and does not influence PE.

The changes of state of XMT and REC de-select TX and select IRin as the input signal to the input delay flip-flops, and either signal can be in either state when the transceiver mode is changed from transmit to receive. It is then possible that TX may be at logic zero, and IRin may be at logic one when the transceiver mode change occurs. If this is the case, the period counter will preload as a result of an XSN pulse which would occur two Fc clock cycles after the TXE change of state is captured. This condition causes the remaining period counter states, in the case shown, 122 decimal to 127 decimal, to be skipped. If this should occur and the state of the period counter were within the range detectable as infrared data zero, this first transition would be erroneously evaluated as a modulated infrared period of zero. Transition "blanking" would prevent this phenomenon, but would delay reception of an initial valid period. Further, evaluation of various designs of the photo-amplifier has indicated that invariably, the first infrared pulse is, to some degree, "stretched" by the dynamic (impulse) response characteristics of the amplifier/filter circuits. It is therefore common to receive at least one infrared pulse at the beginning of a new infrared transmission which can appear as a short logic one data state. For these reasons, a logic mechanism has been provided in the infrared carrier-detection algorithm, which requires that a single logic one data-period be detected before the receiver is "unlocked" to receive subsequent infrared data. This creates the constraint that a transmitted logic one interval be sent by the transmitting transceiver at the initial state transmitted. This constraint creates no difficulty in most applications, since the idle state before data transmission of RS-232 TXD (here identified as TX) signals is a logic one state, and a "start-bit" is defined as the first logic zero data bit. Similar definitions and constraints are used in the encoding and transmission of common Manchester formats, such as the requirement that a series of logic one data bits be sent in order to synchronize all Manchester receivers and decoders. The imposition of this "unlocking" requirement provides the additional advantage that the receiving transceiver bandwidth is substantially narrowed before receiver "unlocking" occurs, thereby reducing its susceptibility to spurious light sources until a valid logic one infrared data pulse period has been detected. In the case shown for this condition, in FIG. 8B (sequence IV), the presence of an XSN pulse at the point shown would have resulted in an erroneous detection of a data logic zero state if not for the data logic one receiver "unlocking" requirement. The beginning states of the period counter are actually arbitrary within the range, 96 decimal to 127 decimal, depending upon the time that TXE goes to logic zero, but the states shown are representative of a worst-case condition for the occurrence of the false XSN pulse described above.

Also shown in FIG. 8B, are the (more usual) cases where the previous apparent of IRin does not take place immediately following selection of receive mode. In these cases, the initial states on IRin and TX are such that the XSN pulse does not occur, the period counter is not preloaded before the TC pulse occurs and period counter states 122 through 127 are not skipped. In these cases, assuming an IRin transition does not occur within the times illustrated, the period counter, when it reaches state 127 decimal, is preloaded by TC to state 57 decimal, continuously repeating this 71 Fc cycle count sequence until an IRin zero-to-one transition occur (indicating the initial presence of a detected infrared pulse.

Figure 9A:
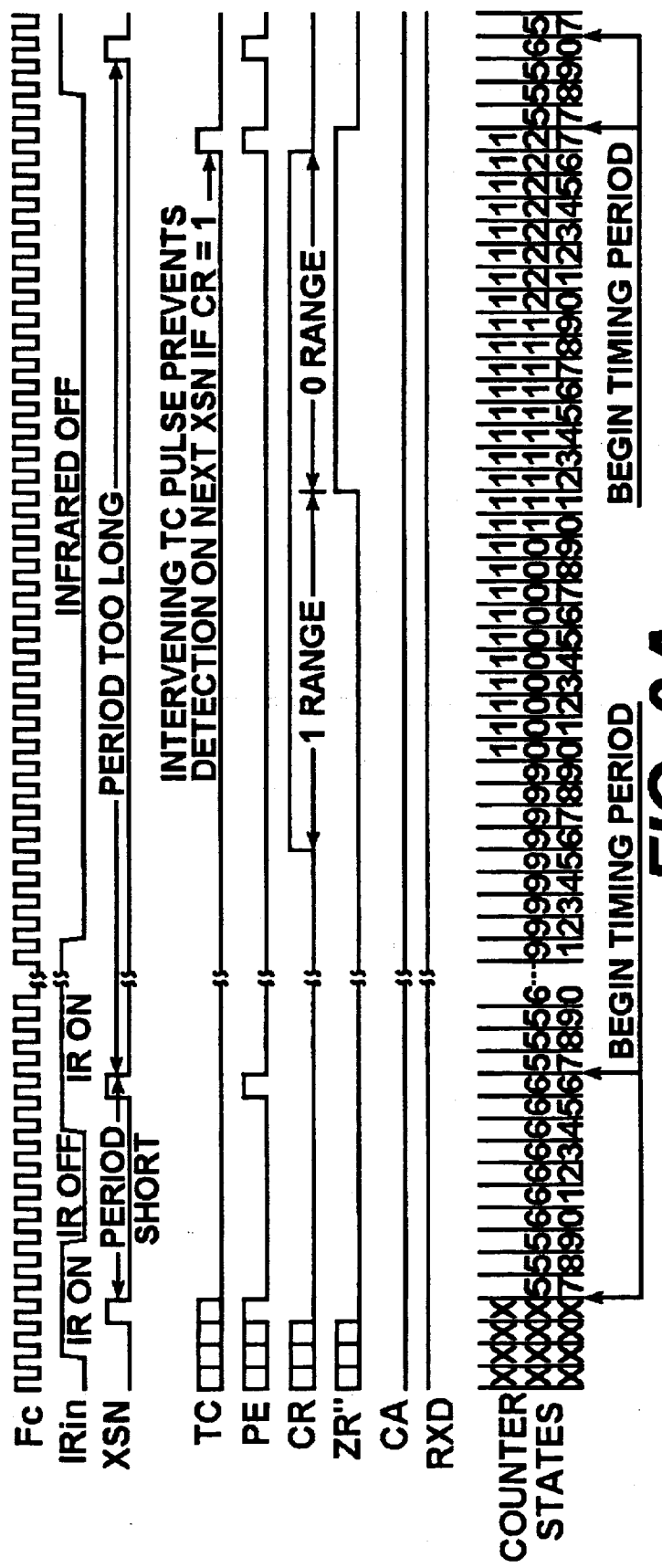
FIGS. 9A, 9B, 10A, 10B, 11A and 11B are timing diagrams which illustrate the operation of the period counter and related elements within the logic implementation of the preferred embodiment used for the detection and demodulation of infrared pulses received, under various operating sequences.

Referring to FIGS. 9A and B, 10 and 11A and B, in the implementation shown, the period counter states chosen as limits for a valid received pulse period are decoded as state 96 decimal through state 126 decimal, corresponding to the 40th through the 70th state of the period counter when it is preloaded to state 57 decimal. This count range is decoded as CR, (carrier range) and is shown as the sixth function counting downward, in FIG. 9A. Within this (CR at-logic-one) range, is that part of the period counter range which corresponds to a FASIR modulated pulse period which is defined as data logic zero. This range, corresponding to period counter states 112 decimal through 127 decimal, is decoded as ZR" (decoded zero range) and is shown as the seventh Function counting downward in FIG. 9A. The carrier range, thus defined, is from 40 to 70 cycles of Fc. If Fc is 3.6863 MHz, this corresponds to a period of 40×271.261 nanoseconds to 70×271.267 nanoseconds, or 10.8507 microseconds to 18.9887 microseconds. These period limits equate to a FASIR modulated infrared pulse frequency range of 52.6629 to 92.1600 kilohertz. Likewise, the data state zero range, thus defined, is from 56 to 70 cycles of Fc. With Fc at 3.6863 MHz, this corresponds to a period of 56×271.267 nanoseconds to 71×271.267 nanoseconds, or 15.1910 microseconds to 19.2600 microseconds. These period limits equate to a FASIR modulated infrared pulse-frequency ranges of 51.9211 to 65.8286 kilohertz for a data logic zero range and 65.8286 to 92.1600 kilohertz for a data logic one range. These ranges bracket the two transmitted data frequencies (at the same Fc frequency) of 57.6 and 76.8 kilohertz, with reasonable error bands to accommodate clock jitter of ± one Fc period of capture-time ambiguity, as well as pulse distortions which occur through the systems linear components. (i.e. photo-amplifier group delays, relative errors in clock frequency sources, etc.).

As shown in FIG. 9A, each zero-to-one transition of IRin, in the second Fc clock cycle following its capture by the input signal flip-flop, generates an XSN (input transition signal) which preloads the period counter to state 57 decimal. Once the first such transition of IRin occurs, the period counter sequences through its states until the next XSN or TC pulse occurs, either of which will generate PE. When, as shown, the period counter has not yet reached state 96 decimal when XSN again occurs, the period counter goes to state 57 and the out-of-band period causes no further action. That is, the infrared pulse is regarded by the receiving transceiver as invalid, and is ignored except that it begins a new timing period. Likewise, if the interval between positive transitions is greater than 70 periods of Fc, the period counter will have reached state 127 decimal before another XSN pulse is generated, The period counter will be preloaded by TC, and the fact that XSN was not present during preload is stored by a flip-flop (as XSNF, not shown). This storage of the non-XSN preloading assures that when an XSN pulse occurs, which may be during any (possibly, in-band) state of the period counter, the first such pulse cannot be assessed as an in-band signal. Only two consecutive XSN pulses, without an intervening TC pulse, can be interpreted as in-band, if the interval between them lies within the decoded CR range of the period counter. The implementation of this function will be described further in subsequent paragraphs, as part of the logic circuit descriptions. As FIG. 9A illustrates, in the initial case of either the too-short, or too-long, timed infrared pulse periods, the receiving transceiver does not respond. That is, since both cases fail to meet the criteria that CR be at logic one during a second successive occurrence of XSN, neither is CA (carrier-detected) set to logic one nor can the state of RXD (return-to-zero received data) be changed from its logic one idle state. Also, no internal "history" of these XSN transitions is kept, beyond the preloading of the period counter, and the resetting, then the failure to set the XSND signal, which is required to be at logic one for detection of a valid infrared pulse period. The receiving transceiver thereby initially "ignores" any number of out-of-band (or data-zero-state-period, not shown) infrared pulse intervals detected.

Figure 9B:
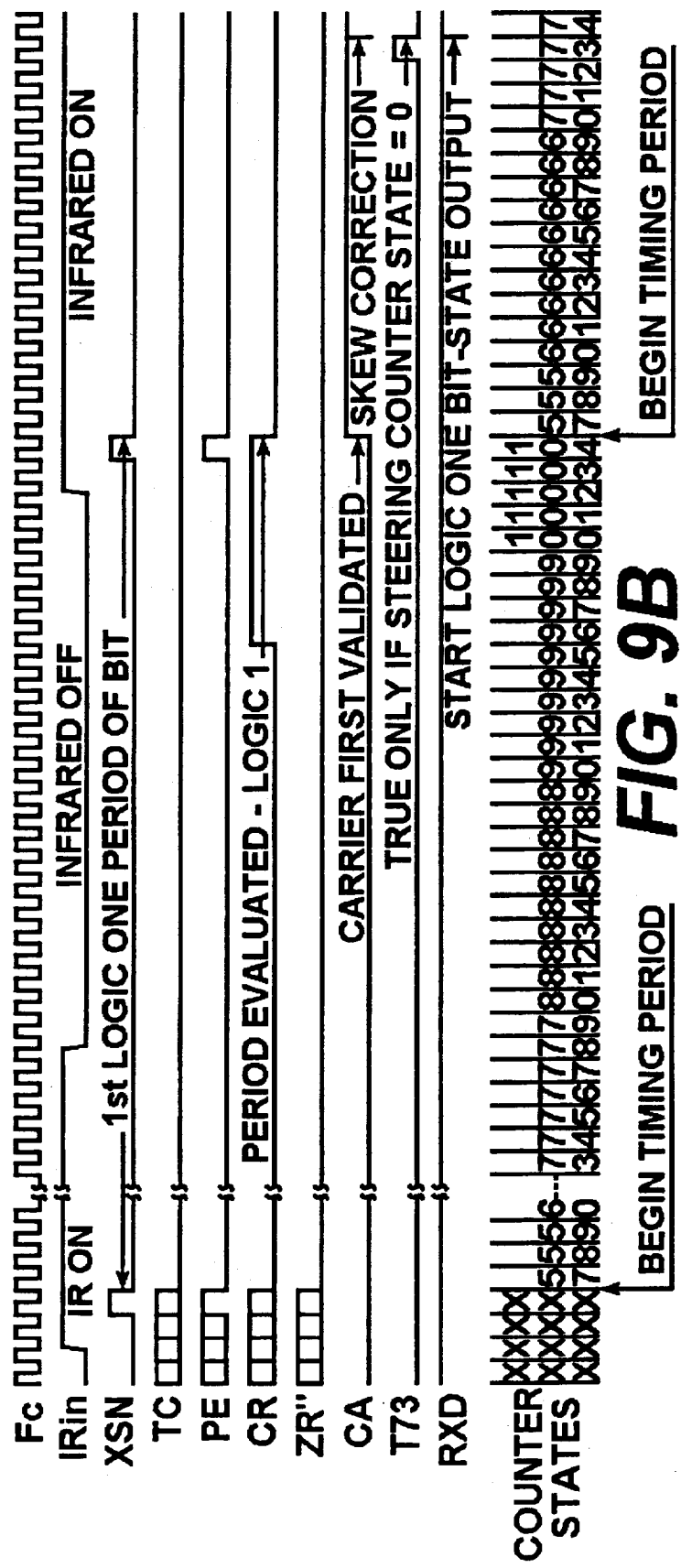

FIG. 9B illustrates the successful detection of an initial, valid, FASIR modulated infrared pulse period. Prior to the beginning transition (XSN pulse) of such a period, CA is at logic zero (as at the end of FIG. 9A), RXD is still in its idle state of logic one (held by CA at logic zero), and the states of the period counter, from 57 decimal through 127 decimal, are unknown. As in FIG. 9A, any XSN pulse re-synchronizes the period counter to the detected infrared (IRin) zero-to-one transition to begin timing of the IRin pulse period, but does not result in detection. The period counter then advances sequentially, reaching the CR (valid carrier) range of states at period counter state 96 decimal. In this case, the second XSN pulse, corresponding to the second positive-going transition of IRin, occurs at period counter state 104 decimal, within the CR logic one range, but before the ZR" logic one range. This (also second) PE pulse enables both the CA (carrier-range) flip-flop and the CA' (filtered carrier) flip-flop to capture the logic one state of CR, and setting the CA bit to logic one following the next positive transition of Fc, as shown. The same (second) XSN pulse, at the same time, preloads the period counter to state 57 decimal to begin timing of a subsequent period of the IRin input signal, and enables a zero-range flip-flop to capture the (logic zero) state of ZR", as ZR (not in the from-zero period counter range, not shown). (In this case, the state of ZR remains unchanged at logic zero). Since in the case shown, this is the first logic one period detected within a bit period, a "steering counter" is also initialized to indicate that this is the first period detected within this bit-interval. The state of the steering counter is decoded along with the subsequent period counter state, 73 decimal. At this time, the decoded function T73 enables the RXD flip-flop to be set following the next positive transition of Fc.

As the RXD flip-flop output, shown as RXD in FIG. 9B, was previously at logic one, no change of RXD occurs at this point. If however, a previous logic zero FASIR modulated infrared data bit had been detected, the RXD flip-flop would have been driven from logic zero to logic one at the beginning of period counter state 74 decimal. The logic circuits which cause the setting of RXD at this delayed time from the time of initial detection of a from logic one period, precisely correct the bit-time "skew" which would otherwise occur in the detection of a from bit transition from logic zero-to-one, as described in preceding paragraphs. As indicated in FIG. 9B, the timing of (any number of) infrared data logic one periods, if not interrupted by a change of range in a subsequent infrared period or by the loss of FASIR modulated infrared pulses, results in no further changes of state of CA or of RXD, and the receiving transceiver continues to output a valid logic one.

Not shown in these diagrams is the case wherein an initial FASIR modulated from logic zero period is received. As stated previously, the receiver "ignores" an initial from logic zero period. This is accomplished by the "feeding-back" of the existing CA state in combination with a period counter range bit, E. The logic 1 state of bit E distinguishes the zero-period range from the one-period range of the period counter states within the valid carrier range, and is gated with CA such as to force the CR (carrier range) signal to logic zero if CA has not been set before an XSN pulse corresponds to a data logic zero interval. After CA is set to logic one, as shown in FIG. 9B, this "feedback" term no longer prevents detection of infrared data logic zero periods, as is seen in FIG. 10A, so long as CA remains at logic one.

Figure 10A:
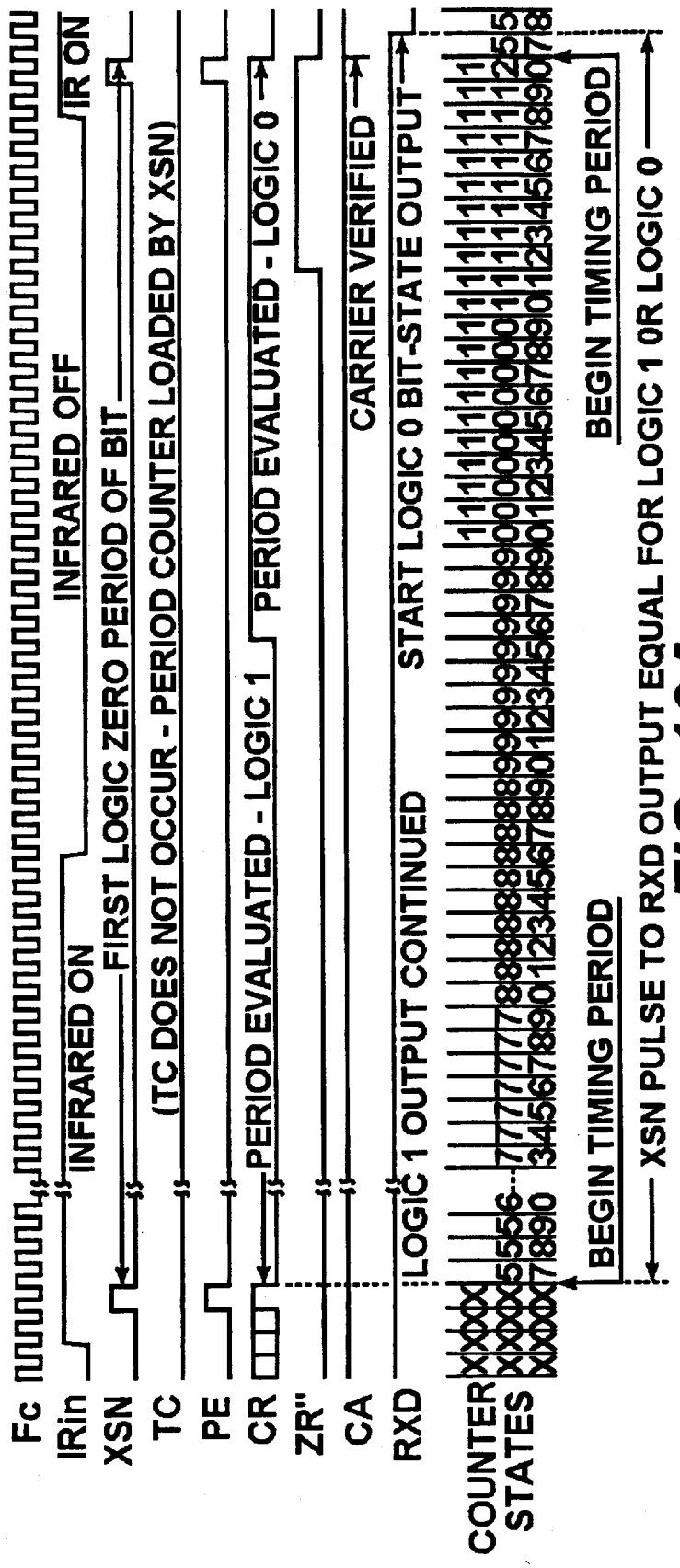

FIG. 10A illustrates the detection of a FASIR modulated infrared data zero period, following the setting of the CA (carrier) signal by reception and detection of at least one data logic one period. At the leftmost part of the diagram, CA and RXD are at logic one and the states of the period counter, and consequently, TC and PE, are unknown. In this case, the ending transition of a previous data logic one period, which is also the beginning transition of a logic zero period, is seen as the first zero-to-one transition of IRin, at the left of the diagram, it is therefore known that the CR signal is at logic one, and the ZR" signal is at logic zero when the corresponding XSN pulse occurs. As a result, CA and RXD remain at logic one until after a second XSN pulse is generated. (Other, discontinuous, cases will be described in later paragraphs). In the diagram, a second XSN pulse at about the three-fourths point from the left, corresponding to a second positive-going transition of IRin, occurs at period counter state 120 decimal, within the CR logic one range, and after the ZR" (data logic zero) range is reached. The resulting PE pulse enables both the CA (carrier-range) flip-flop and CA' (filtered carrier flip-flop, not shown) to capture the logic one state of CR, holding the CA bit at its previous logic one state, following the next positive transition of Fc. The same (second) XSN pulse, at the same time, preloads the period counter to state 57 decimal to begin timing of a subsequent period of the IRin input signal, and enables a zero-range flip-flop to capture the (logic one) state of ZR", passed via another gate, forming ZR', as ZR (the data-zero period captured in-range signal, not shown). Since in the case shown, this is the first logic zero period detected in this data bit-time, the "steering counter" is set to its second-period state indicating that this is the first of three periods detected within a new, minimum bit-interval. At the beginning of the second Fc clock period following XSN and PE, the state of zero-range flip-flop steers the RXD signal to logic zero. As previously described, this minimal delay in setting RXD to zero, as opposed to the T73-triggered setting of RXD to logic one, precisely compensates for the difference in times the demodulator requires to recognize a longer data logic zero period as opposed to a data logic one period. The otherwise inherent bit-time "skew" of the receiving transceiver is therefore corrected. The vertical dashed lines drawn between the FIG. 10A and FIG. 10B diagrams show these input-to-output times to be exactly equal, assuming that the IRin transitions occur as shown (exact periods received, no clock-jitter in the signals captured).

As in the detection of FASIR modulated infrared data logic one periods, timing of any number of infrared data logic zero periods, if not interrupted by a change of range in a subsequent infrared period or by the loss of FASIR modulated infrared pulses, results in no further changes of state of CA or of RXD, and the receiving transceiver continues to output a valid logic zero. This capability permits the transmission and reception of return-to-zero formatted data at the maximum data rate (Fc/192, in the embodiment shown) or at integer sub-multiples of this rate, down to a very low data rate. Likewise, in non-Manchester mode, (MM set to logic zero) the transceiver pair can pass Manchester-encoded signals at ½ the maximum return-to-zero data rate, or at integer sub-multiples of that (Fc/384) rate. Manchester mode then (MM set to logic one), permits passing of Manchester-encoded signals at the highest (Fc/192) data rate, only.

Figure 10B:
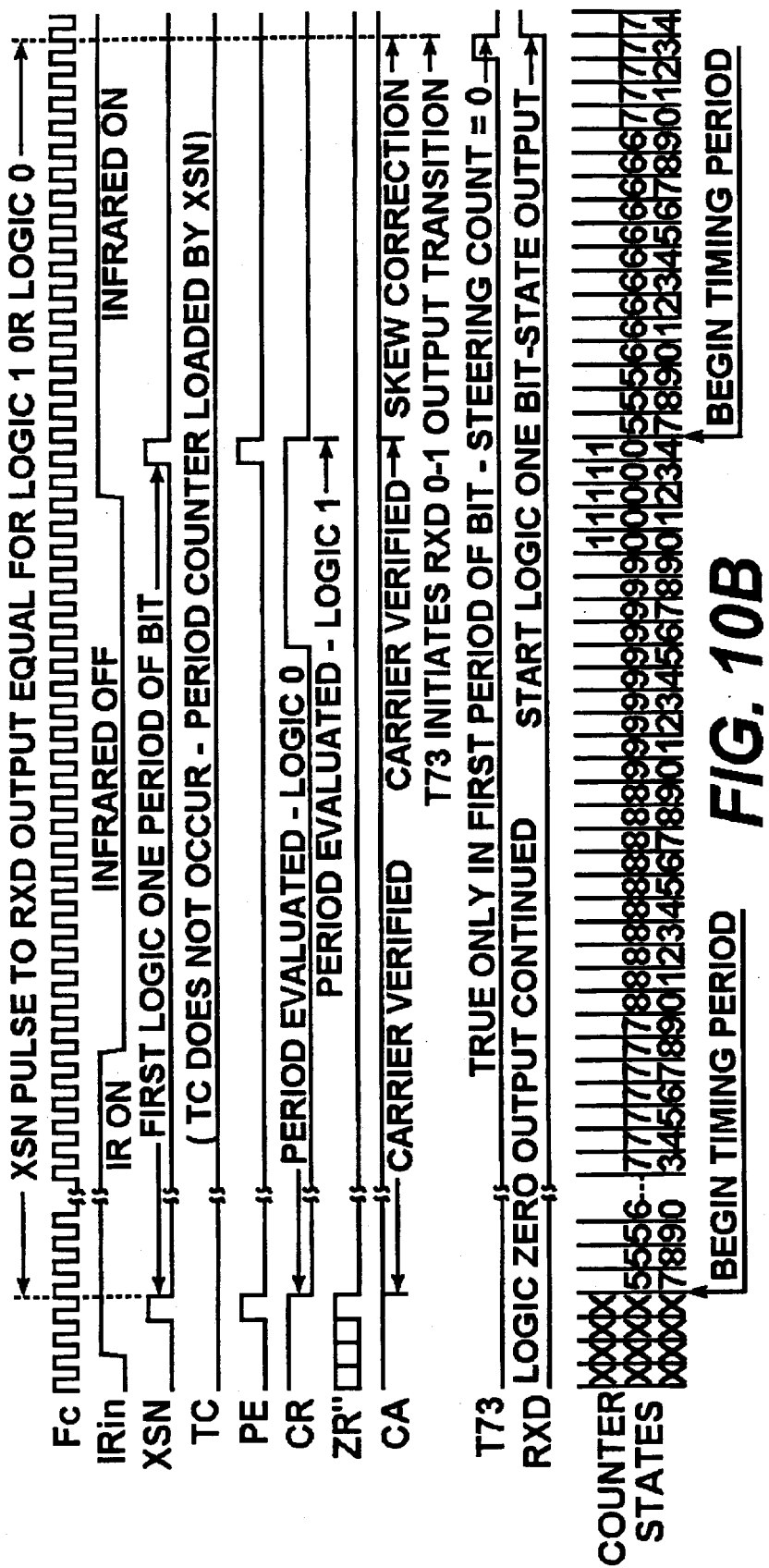

FIG. 10B, illustrates the detection of an initial data logic one period, immediately following the end of a logic zero period. Internal behavior of the receiving transceiver is identical to that shown in FIG. 9B, except that CA is initially at logic one, and the transition of RXD from logic zero to logic one is shown, as initiated by the T73 timing pulse to correct the RXD "skew", which would otherwise occur (described previously).

Figure 11A:
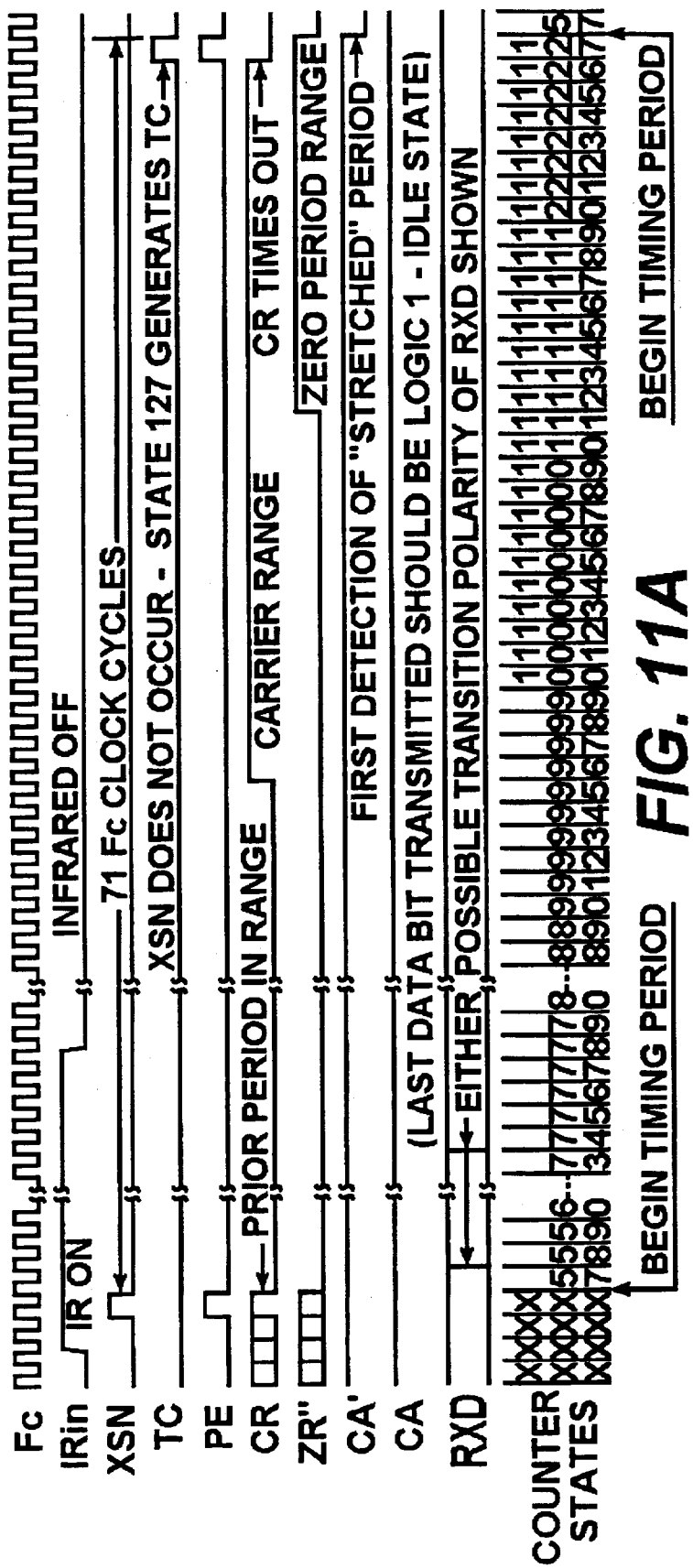
Figure 11B:
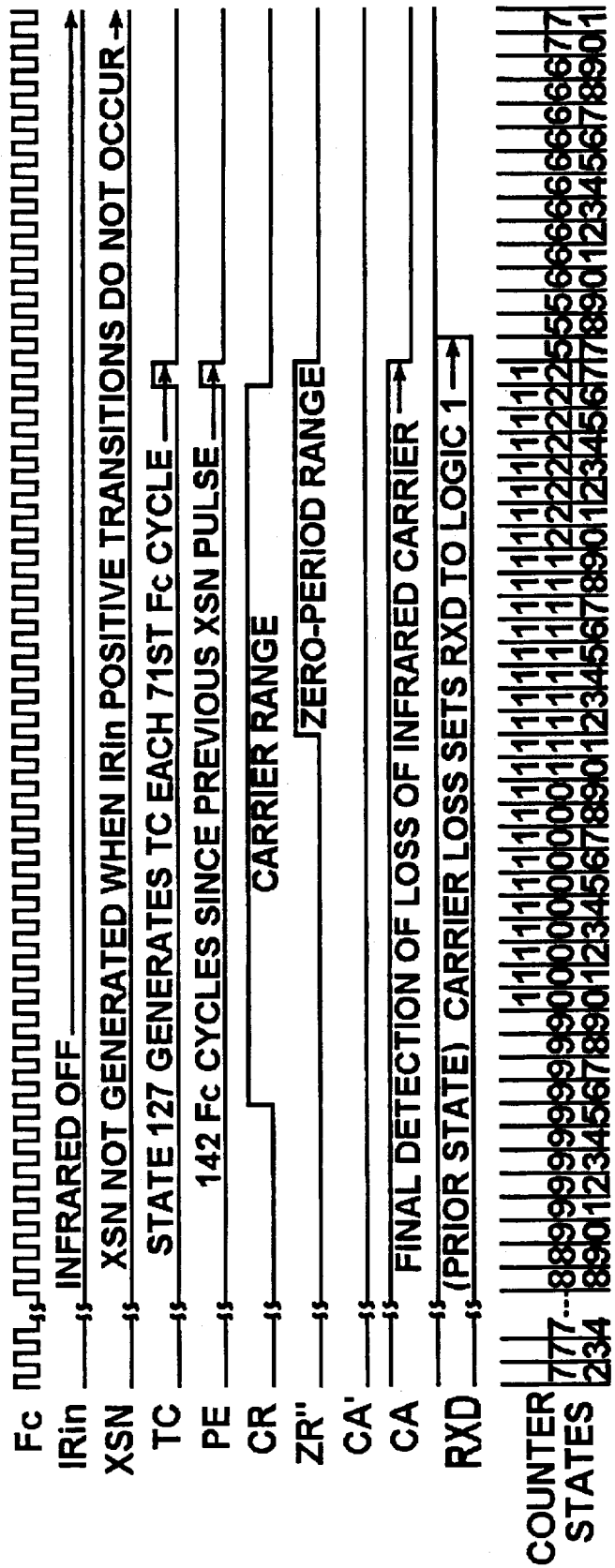

The timing sequence of FIG. 11A continues directly into the timing sequence of FIG. 11B, illustrating the operations of the receiving transceiver in the detection of the end (or disruption) of an infrared transmission. Loss of infrared carrier detection occurs in two stages, as required in order for the demodulator to tolerate the long one, early zero and long one, late zero disruptions shown in FIG. 2A and discussed above and in subsequent paragraphs. Detection of the infrared signal loss is "filtered" by requiring two consecutive 71-period counter intervals to pass before carrier loss is verified. Although this may appear to be a long interval, it represents only 142 Fc clock periods, or slightly less than 0.74 minimum bit-times, measured from the last XSN pulse.

In order to illustrate the worse-case conditions which may result from disruption of the infrared light-path, these diagrams begin by assuming that the previously detected data logic period could have been either a logic one, or a logic zero, and that the period ending at the far left of FIG. 11A (first, as well as final, XSN pulse), could also be the end of either a data logic one, or data logic zero, period. RXD is shown in ambiguous states until near the end of sequence VI, as shown in FIG. 11B, after carrier loss has been verified. Possible times of RXD transitions are seen, as marked and noted, in the first one-forth of the FIG. 11A diagram.

In FIG. 11A, the last in-range period ends by producing the XSN pulse, capturing the valid data logic state represented by the period ending, and preloading the period counter to state 57 decimal, as in preceding cases. As before, the period counter advances through its sequential states, its decoders marking the CR, and then the ZR" ranges at the states shown. When the period counter reaches state 127, the first TC pulse in the absence of XSN since the beginning of reception of valid data occurs. The resulting PE pulse enables the carrier-filter flip-flop to capture this condition, setting its CA' output signal to logic zero. Likewise another flip-flop records the first TC pulse, setting its output (TC2, not shown) to logic zero. At this point, no output signals change state, and the period counter, having been preloaded to 57 decimal, continues to advance. In FIG. 11B, is shown the second advance of the period counter through the CR and ZR" ranges, until state 127 decimal is again reached. A second, consecutive TC pulse is generated, and the logic zero state of CA' is reinforced by this occurrence, and the previously-recorded occurrence of TC, and the carrier flip-flop output, CA, is steered to logic zero. This, in the following Fc clock cycle, steers the RXD flip-flop output to logic one, its idle state. CA remains at logic zero and RXD (RX, in non-Manchester mode) remains at logic one thereafter, until the receiver is again "unlocked" by receipt of a valid infrared data logic one pulse, as shown in FIGS. 9A and B and 10A and B.

Figure 4A:
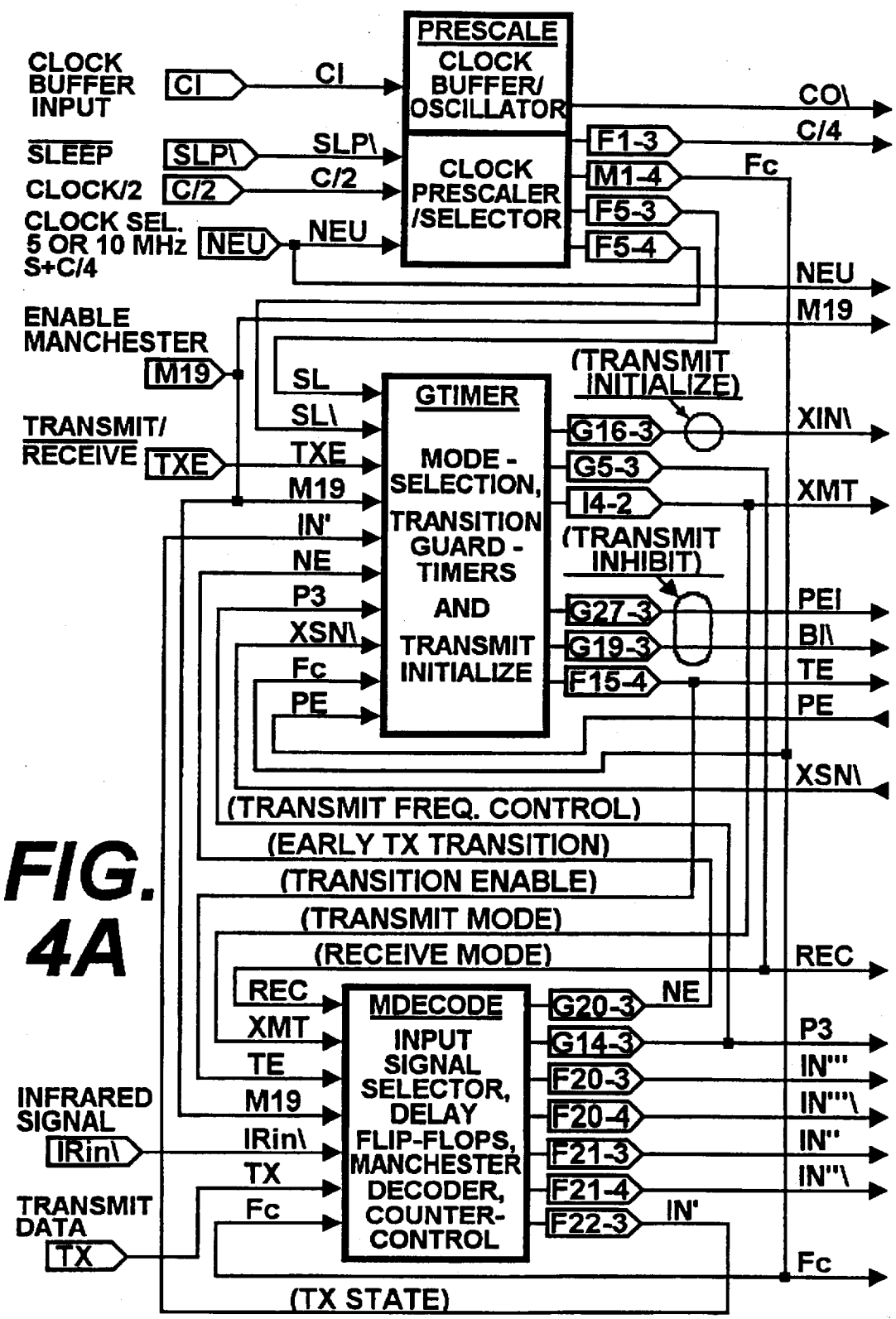
FIG. 4 illustrates the manner in which FIGS. 4A–4D collectively provide a detailed block diagram of the logic implementation of a preferred embodiment of a FASIR transceiver, with the block diagram formed by FIGS. 4A–4D showing all individual signals passed into, out of, and among, the major functional logic sections.
Figure 12:
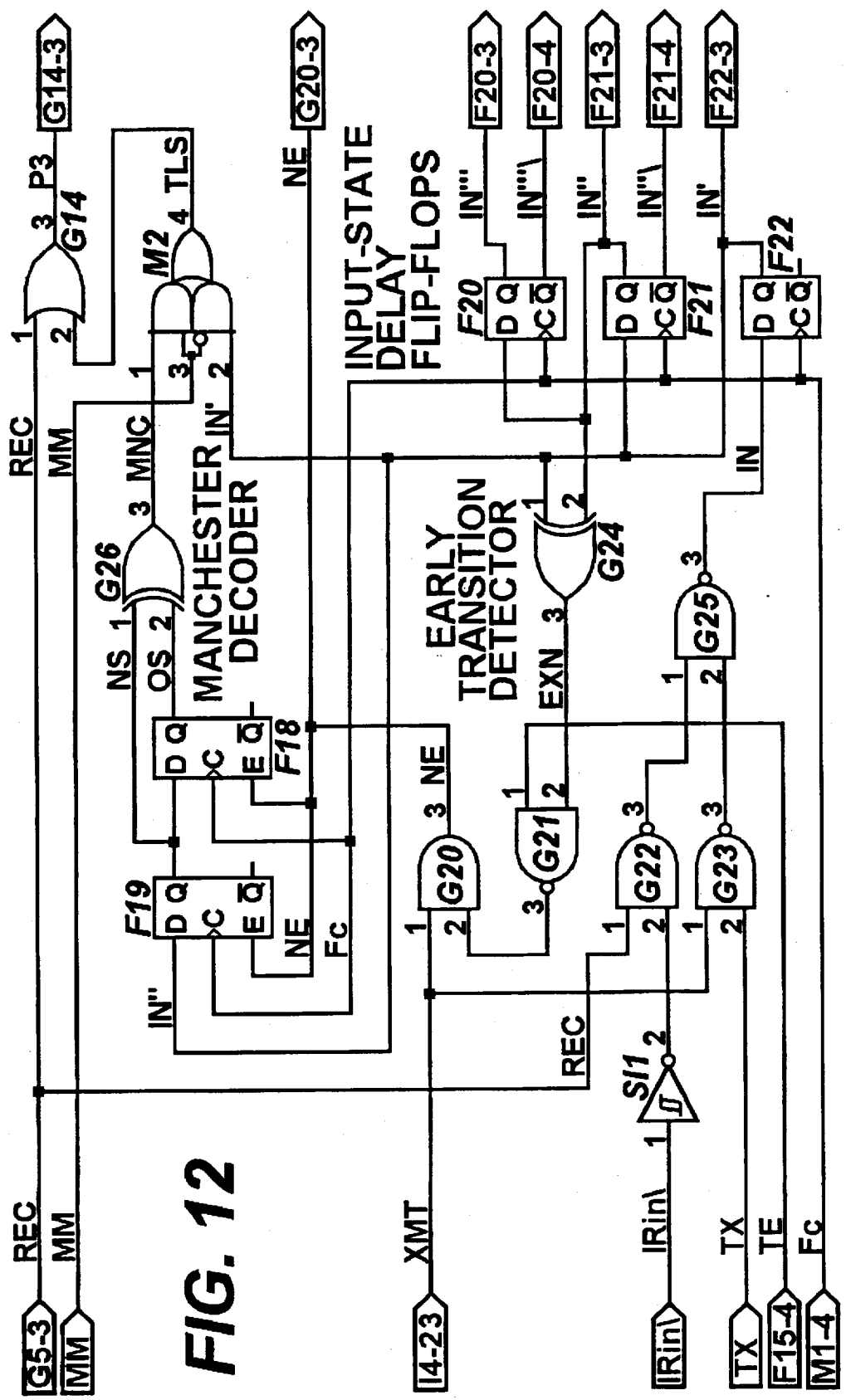
FIG. 12 is a detailed logic diagram of the input signal-selector, input signal delay flip/flops, Manchester-decoder, and counter-modulus control circuits.

FIG. 12 is a logic diagram of the Mdecode circuits, shown as a block within FIGS. 3A and 4A. In the lower left portion of the diagram is the received infrared input (IRIN) signal buffer, Schmitt-trigger-inverter SI1. The IRin polarity is inverted at the FASIR transceiver input to permit the lowest current to be required in the absence of an infrared signal, at the infinite-clipping voltage comparator output, which is usually resistively-biased to its logic one state. The use of a Schmitt-trigger, although not essential to the transceiver operation, helps to reduce the effects of IRin signal noise components. The logic-one-true IRin (detected infrared) signal is then applied to Nand gate G22 pin 2 where, if enabled by a REC signal logic one (receive mode selected), it is passed through G22 and G25 to become the selected input signal, IN. In similar fashion, the TX (transmitted data input) signal, applied to G23 pin 2, if enabled by a XMT signal logic one (transmit mode selected), is passed through G23 and G25 to become the IN signal. The selected IN signal is passed to flip-flop F22 "D" input which is clocked by Fc, and synchronizes transitions of the IN signal to the internal logic clock, forming IN', the captured state of the selected input. The IN' signal, thus formed, is further delayed by each of two more (input-state delay) flip-flops, F21 and F20, to form IN" (one Fc cycle later than IN'), and IN'" (one Fc cycle later than IN". The captured and delayed forms of the selected input signals are passed out of this circuit section to indicate the input signal state in other circuits and for decoding of input transition pulses, as required elsewhere.

Two of the signals generated by the input-state delay flip-flops are passed to the inputs of Exclusive-Or gate, G24, whose output generates a single pulse of one Fc clock cycle upon each transition, of either polarity, of IN'. The signal thus produced at G24 pin 3 is identified in the diagram as EXN (early transition). This pulse, after being enabled by TE (transition enable) via G21, appears in inverted form at Nand gate G20, used as an inverted-input Or gate. G20 combines XMT (transmit mode signal) to create a positive EXN-derived pulse (NE, next-enable signal) when XMT is at logic one, or a constant logic one state when the transceiver is not in transmit mode. The NE signal, thus formed, is used to enable changes-of-state of the two-bit input signal shift register formed by F19 and F18. In transmit mode, the NE pulses enable the F19, F18 flip-flop pair to capture successive unmasked (when TE is at logic one) states of the IN' (captured TX) signal. The NS (new state) and OS (old state) signals, at pins 4 of F19 and 18, respectively, are compared via Exclusive-Or gate G26, generating MNC (the decoded logic state of the Manchester signal bit-time, just passed) to determine the state of Manchester-encoded data at the TX input. The MNC signal, thus formed, is passed to the two-input multiplexer, M2, at pin 1, where it is passed to M2 pin 4 as TLS (TX logic-state), if selected by a logic one at MM (Manchester Maximum bit-rate enable control input). When the transceiver is in receive mode, the NE signal, as described above, continuously enables flip-flops F19 and F18, causing the historical states to be "flushed", and making the initial-transition blanking interval predictable (64 Fc clock cycles) when transmit mode is first invoked. If MM is at logic zero (Manchester mode not selected), the non-decoded form of the IN' signal appears at M2 pin 4 as TLS. In transmit mode (REC at logic zero), TLS is passed via G14 to appear as P3 (the transmit-mode period counter modulus control input). When REC is at logic one, the P3 signal is held continuously at logic one, the correct state of this period counter preload bit input when the transceiver is in receive mode. The signal, thus formed, is passed out of this circuit section to correctly preload the period counter, and to control the count modulus of the transition guard timer circuits, elsewhere located.

Figure 13:
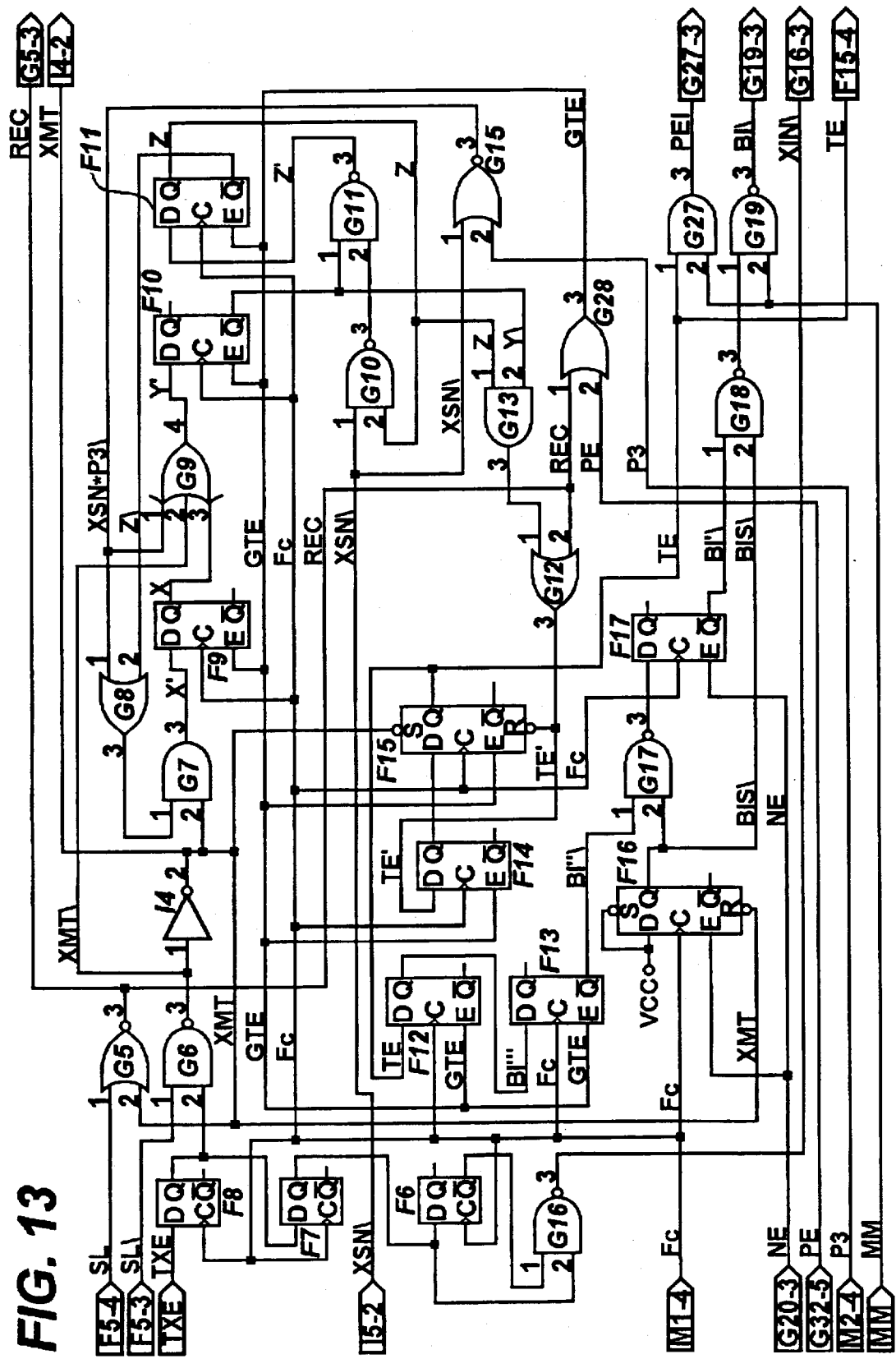
FIG. 13 is a detailed logic diagram of the mode-selection, (input) transition guard-timer and transmit-initialization circuits.

FIG. 13 is a logic diagram of the Gtimer circuits, shown as a block within FIGS. 3A and 4A. In the upper left portion of this diagram are shown the TXE-driven mode-selection circuits, which control the states of the two internal transmit/receive mode select signals, XMT and REC. The state of TXE (the transmit enable input control signal) is captured and synchronized to the internal logic clock by flip-flop F7. The signal TS (transmit select), captured at F7 "Q" output, is gated via Nand gate G6 with SL\ (not sleep mode), to form the inverted form of the transmit mode signal, XMT\, which is complemented by inverter I4, forming the positive-true form, XMT. The TS signal is also passed through two one-Fc-clock signal-delaying flip-flops, F8 and F6, whose delayed non-inverted, then inverted, forms of the TS signal, respectively, appear at the inputs to Nand gate G16. The output of G16 at pin 3 is a logic zero pulse of one Fc cycle duration, occurring in the Fc cycle after a zero-to-one transition of TS. The signal thus formed is labeled XIN\ (inverted transmit-initialize pulse), and is passed out of this circuit section to be gated with the remaining signals that form the period counter preload pulse, PE. Following another path of the XMT signal, XMT appears at Nor gate G5 pin 2 along with SL (sleep mode signal). G5 operates as an inverted-input And, forming REC (receive mode signal) at pin 3.

It should be noted that the gating of TS and its derivative signals with the sleep mode signals, SL\ and SL, serves to disable the input selector circuits as well as other active nodes within the transceiver when sleep mode is selected (SLP\ at logic one). This action, along with the halting of the Fc clock, minimize the number of active nodes within the FASIR transceiver logic, thereby reducing its power requirements to the lowest possible level when its operation is not required by other devices.

The remaining logic circuits in FIG. 13 are concerned with the generation of signals used to provide the various "masking" and related functions required to manage FASIR modulation of infrared signals transmitted in response to TX input signals. One such signal, TE (transition enable), is used in both non-Manchester (MM at logic zero) and Manchester (MM at logic one) transmission modes, as a TX-transition "blanking" signal, to prevent the transmitting transceiver from responding to spurious TX transitions due to signal "ringing" in non-Manchester mode, and to prevent, in Manchester mode, re-synchronization of the modulator timing circuits (period counter, guard timer, Manchester decoder, etc.) due to the mid-bit-time transitions of TX which correspond to a data logic zero input. The TE signal is generated by flip-flops F6, F7, F8, F14, F15 and associated logic gates. Flip-flops F6, F7 and F8, And gate G7, and Or gates G8 and G9 form a two-modulus (modulo-4 and modulo-6) preloadable, self stalling Johnson counter. This counter in transmit mode, advances from its preload state to a predetermined end state, counting successive PE (from the period counter terminal count) pulses occurring from the last XSN (unmasked TX transition). Its beginning, preloaded state is determined by the period counter modulus-control bit, P3, selected by the state of MM, appearing at M2 pin 4, shown in FIG. 9. The sequence of states at the flip-flop "Q" outputs is shown in the following:

1) For P3 (equals TX data-state) at logic one:

|  | F6-4 | F7-4 | F7-4 | STATE | TE'(G12-3) |
|---|---|---|---|---|---|
| Preload value (XSN) After TC: | 0 | 0 | 0 | 0 | 0 |
| 1st | 1 | 0 | 0 | 1 | 0 |
| 2nd | 1 | 1 | 0 | 2 | 0 |
| 3rd | 1 | 1 | 1 | 3 | 0 |
| 4th | 0 | 1 | 1 | 4 | 0 |
| 5th and subsequent | 0 | 0 | 1 | 5 | 1 |

1) For P3 (equals TX data-state) at logic zero:

|  | F6-4 | F7-4 | F7-4 | STATE | TE'(G12-3) |
|---|---|---|---|---|---|
| Preload value (XSN) After TC: | 1 | 1 | 0 | 2 | 0 |
| 1st | 1 | 1 | 1 | 3 | 0 |
| 2nd | 0 | 1 | 1 | 4 | 0 |
| 3rd and subsequent | 0 | 0 | 1 | 5 | 1 |

All three of these flip-flops are enabled to change, in transmit mode, following each PE pulse. The signal GTE (guard timer enable) is formed by gating PE with REC via Or gate G15. In receive mode, the REC signal forces GTE continuously to logic one, permitting rapid initialization of the guard timer Johnson counter to state 4 while in receive mode. This assures that the guard time counter is in a predictable and appropriate state when transmit mode is next invoked, controlling transmit-startup delays. The receive mode preload of the guard timer state is accomplished by forcing of X' at And gate G7 pin 3 to zero by a logic zero at G7 pin 2 (XSN at logic zero), and by forcing of Y' at Or gate G9 pin 4 to one by a logic one at G9 pin 2 (XSN\ at logic one).

As shown in FIGS. 10A and 10B, self-stalling of the Johnson counter is performed by gating of bit Z, the signal at F11 "Q" output, with XSN, via Nand gate G10, thence with Y\, the signal at F11 "Q" output via Nand gate G11 (used as an inverted-input Or gate) to form Z' the data-input to flip-flop F11, "D" input. Once the Johnson counter reaches state 3, setting Z to logic one, the path through G10 and G11 steers Z' (F8 data input) to logic one until an XSN pulse occurs. Z', at F11, "D" input, is thereby held at logic zero and, also in the absence of XSN*P3 (at logic 1 only when P3 and XSN are logic one), assures that the counter will advance normally until state 5 is reached, where it is stalled until another XSN pulse occurs.

Preloading of the guard timer Johnson counter to state 0. when P3 is at logic one is achieved by XSN\ gated with Z, via Nand gate G10. When an unmasked transition pulse, XSN, occurs, PE is generated, enabling changes of state of the Johnson counter. At the same time, G10 pin 3 is driven to logic one by a logic zero at G10 pin 1, XSN\. In the (stalled) state 5, Y\ at F10 Q output is at logic one and consequently, G11 pin 3 goes to logic zero, steering flip-flop F8 "Q" output, Z, to logic zero, following the next Fc positive transition. X' and Y' remain at zero, since the term, XSN*P3\ is at logic zero. The resulting preload state of the counter is therefore, state 0. The preloading of the Johnson counter to state 2 takes place in nearly identical fashion. Z' is still zero during the XSN pulse corresponding to P3 at logic zero, but the condition required to drive the XSN*P3 term to logic one are present at Nor Gate G15 (used as in inverted-input And) pins 1 and 2. The logic one state of XSN*P3\ drives both X' and Y' to logic one via G8-through G7, and via G9, respectively, steering the guard timer Johnson counter to state 2.

This two-modulus operation of the guard timer Johnson counter holds TE', its state-5 decoded output, at logic zero until state 5 is reached, either three or five TC pulses following each unmasked TX transition, depending upon whether P3 was at logic zero or logic one, respectively, when the resulting (delayed) XSN pulse was generated. If P3 is at logic zero during an XSN pulse and subsequent PE pulses generated by TC, the period counter will generate six of these PE pulses per minimum bit-time, which toggle the IRP (infrared pulse) flip-flop, shown in FIG. 15 and described in later paragraphs, through three pulse periods. Conversely, if P3 is at logic one during an XSN pulse and subsequent PE pulses, the period counter will generate eight PE pulses per minimum bit-time, which toggle the IRP flip-flop through four pulse periods. When, at state 5 of the Johnson count, TE' goes to logic one, the inverted reset input at flip-flop F15 "R" pin is released and TE', also appearing at the data input of flip-flop F14 ("D" pin), permits TE, after a delay of two more period counter TC pulses (both F14 and F15 are enabled to change by GTE), to be set to logic one. The final effect of these operations is that TE is driven to logic zero immediately after any unmasked transition, XSN, inhibiting another XSN pulse until one period counter TC interval before the end of a minimum bit interval, whether P3 is at one or zero.

In addition to the repetitive masking of XSN by TE at logic zero for one of two possible intervals following each unmasked transition of the TX input, preloading of the guard time during receive mode to state 4, and the direct setting and resetting of flip-flop F15 by logic zero states of XMT in receive mode, and TE' when REC goes to logic zero, causes TE to be at logic zero (transition-masking state) for an interval immediately after transmit mode is invoked (REC goes to logic zero and XMT goes to logic one). This assures that, upon entering receive mode, two subsequent PE (period counter preload) pulses must have occurred before XSN can be generated by a TX input signal transition. The purpose of this is to assure that the unknown relative states of IRin and TX, and the time that transmit mode is begun, will not generate false XSN pulse. This function is required to prevent false infrared signaling in Manchester mode, and improves, along with action of the XIN\ (inverted transmit-initialize pulse), the predictability of initial infrared pulse (IRP) timing in non-Manchester mode.

Figure 15:
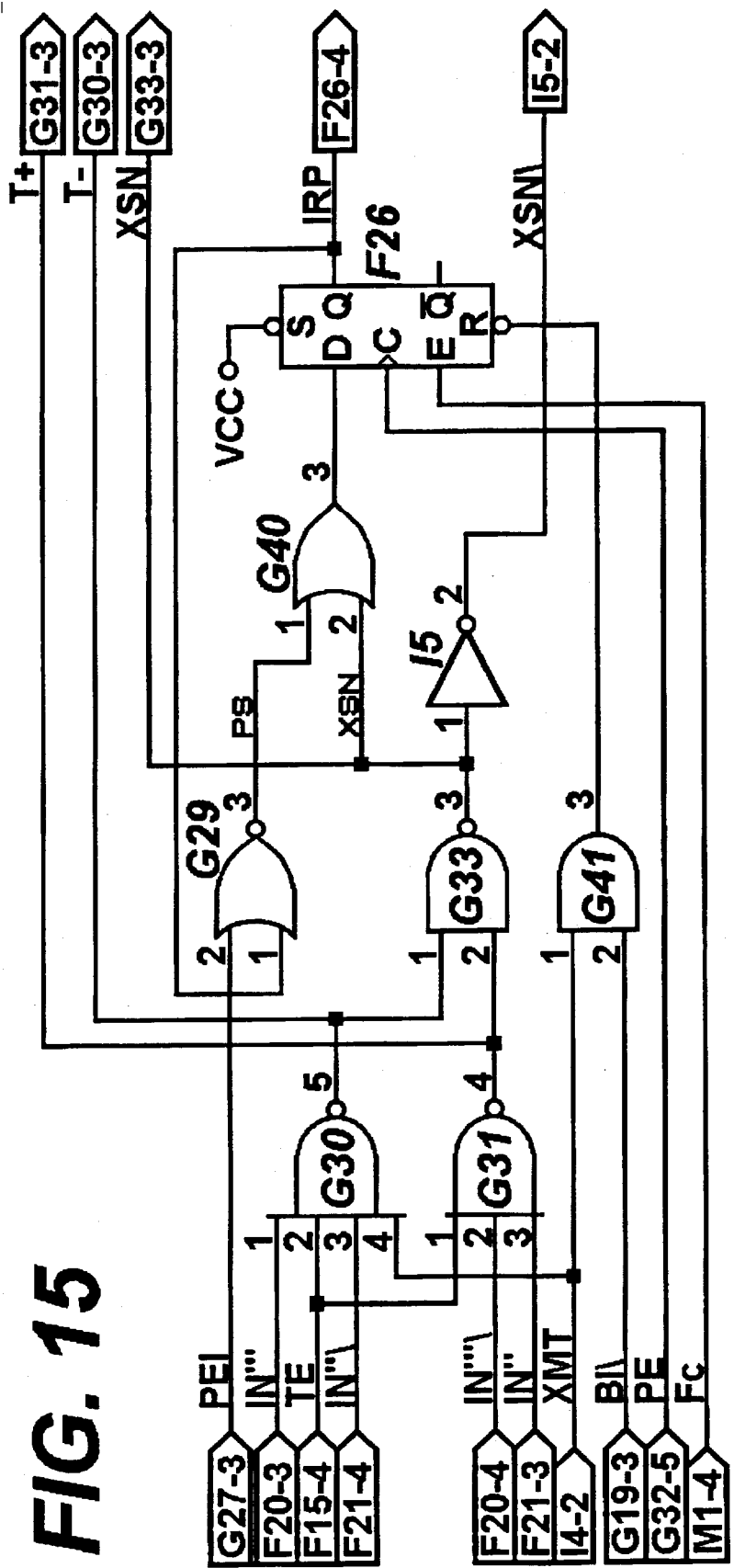
FIG. 15 is a detailed logic diagram of the infrared-pulse control logic and input-transition one-shot decoding circuits.

The final masking of XSN pulses by TE (at logic zero) is performed by gates within the Irp logic section, shown in FIG. 15 and described in following paragraphs. Additionally, the transition enable signal, TE, must be at logic one to permit generation of the NE (next enable) pulse, as shown in FIG. 12 and described in preceding paragraphs dealing with Manchester decoding. The TE signal is also used in this circuit section in the formation of the signal PEI (preload-effect inhibit) and the BI\ (inverted form of beginning inhibit) signal. These two signals are generated and used only in Manchester mode (MM at logic one) transmission, and are required to correctly control generation of the IRP output signal, as described in the previous discussions regarding FIG. 2B.

PEI, as shown in FIG. 13, is generated simply by combining the TE (transition enable) signal with a logic one at MM (Manchester mode selected), via And gate G27. PEI is then passed out of this logic section to the Irp section, where it is used to inhibit the setting of IRP (infrared pulse) when PE (period counter preload) occurs while TE is at logic one and an unmasked transition has not occurred. The final effect of this function is to require, only in Manchester mode (used only at the maximum bit-rate), that the IRP signal must be started by an end-of-bit-time transition at TX. That is, if such an expected transition does not occur, infrared pulse transmission is not begun or resumed. In this way, the end of Manchester signal transitions (the third condition required to be recognized in Manchester signaling) is marked by the ending of infrared transmission to the receiving transceiver. For further clarification, see FIG. 2B, flag note 1, and the preceding descriptions of this required operational constraint.

The function, BI\ (beginning inhibit), generated and used only in Manchester mode, is comprised of three sub-functions. BI"\ is gated with BIS\ (beginning inhibit at start of transmission), as combined by Nand gate G17 (used as in an inverted Or gate), whose output is subsequently passed to a delaying flip-flop, F17, at its "D" input.

As shown in FIG. 13, BIS\ (the inverted form of beginning inhibit at start of transmission), is generated at flip-flop F16 "Q" output. The inverted, direct-reset input of F16 is connected to XMT (transmit mode signal), which is at logic zero prior to entering transmit mode. Upon entering transmit mode (TXE set to logic one and sleep mode not invoked), the F16 inverted reset signal is removed (set to logic one). After two subsequent period counter TC pulses, the TE' logic one state is shifted by GTE through flip-flops F14 and F15, setting TE to logic one and ending the XSN and NE initial masking interval. The next TX transition captured generates a first NE pulse, then the first XSN pulse one Fc clock cycle later. The first NE pulse sets BIS\ to logic one, after it prevented initiation of a first infrared pulse (IRP) which would otherwise have been generated by the XIN\ (inverted transmit initialize) pulse, which is required upon entering non-Manchester transmit mode. BIS\, when at logic zero, drives G17 pin 3 and F17 data input ("D" input) to logic one. This causes BI', at F17 "Q" output, to be at logic zero until one additional unmasked early transition pulse, NE, is generated by a second TX input transition, occurring within the range of the expected end-of-bit-time. BI\, in this case, extends the forced resetting of the IRP flip-flop until the Manchester decoder has received two NE pulses, which are required to determine the data logic state of the Manchester-encoded TX signal. After this, the second NE pulse, the correct state of P3 is determined corresponding to the Manchester-encoded data bit interval just past, and one Fc clock cycle after, XSN begins the first infrared pulse decoded from the first decoded Manchester data bit. This is also shown in FIG. 2B, denoted by flag note 1.

Again referring to FIG. 13, another signal, BI"\, will, at logic zero, also generate a logic zero state at BI\, again forcing reset of the IRP flip-flop, and terminating the transmission of infrared signals when in transmit Manchester mode. The signal is combined with BIS\ by Nand gate G17 (used as an inverted-input Or gate), and is also delayed one data-bit-time interval by F17 to drive BI\ to logic zero. The generation of BI"\ is derived from the state of TE (transition enable). TE is passed, upon subsequent GTE pulses (formed from period counter preload, PE, in transmit mode), through a two-stage shift register formed by flip-flops F12 and F13. The BI"\ signal at F13 "Q" output, is then, the inverted and two TC-interval-delayed form of TE. BI"\ is at logic one at the time that TE goes to logic one, one TC interval before the end of an expected TX Manchester-encoded end-of-bit-time transition, and two such intervals later, goes to logic zero. Any Manchester-encoded TX transition which occurs following the time that BI\ is set to zero (holding G17 pin 3 at logic one), generates an early transition pulse, NE, which sets BI'\, thence BI'\, to logic zero, forcing an immediate reset of the IRP flip-flop and ending any infrared signal transmission for an minimum of one bit-time. As discussed in preceding paragraphs dealing with Manchester mode infrared transmission, this sequence of operation places a constraint upon the timing of Manchester-encoded TX input transitions such that, if on-going TX transitions are stalled and then restarted later than the allowed timing "window" created by BI"\, infrared pulse (IRP) transmission will halt until a second "in-window" TX transition has occurred. This provides a bit-time interval delay, required for operation of the Manchester decoder, before infrared transmission can resume if the Manchester-encoded TX signal is disrupted for an arbitrary interval or is re-synchronized by the sending equipment. If such disruption occurs during transmission, false data states will therefore not be transmitted by the transceiver. The non-transmitting interval will always be sufficient to assure that the receiving transceiver will verify the loss of infrared carrier, then resume reception of valid FASIR modulated infrared data. As is the case for PEI, BI\ is disabled (logic one) when MM is at logic zero (Manchester mode not selected).

Figure 4B:
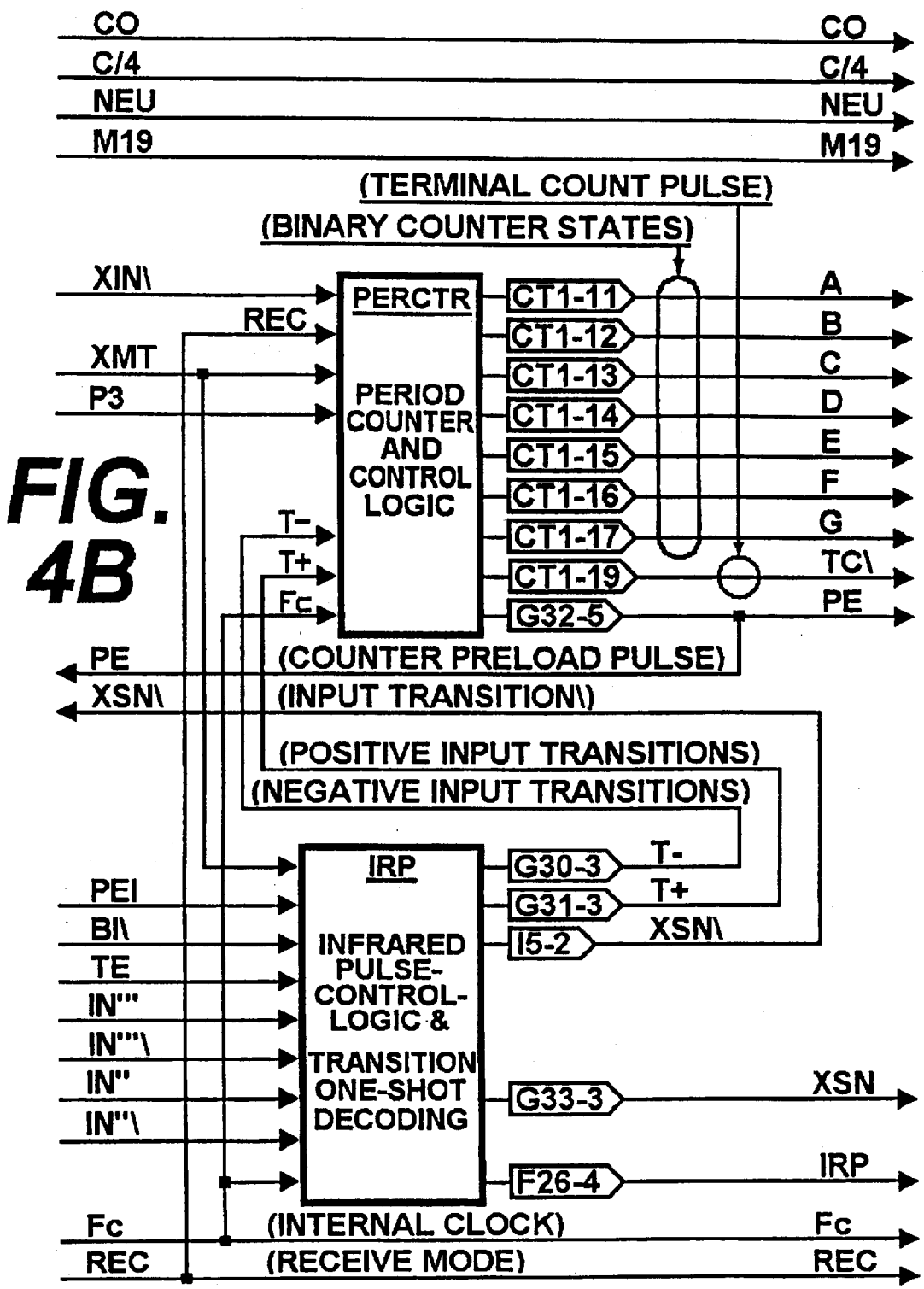
Figure 14:
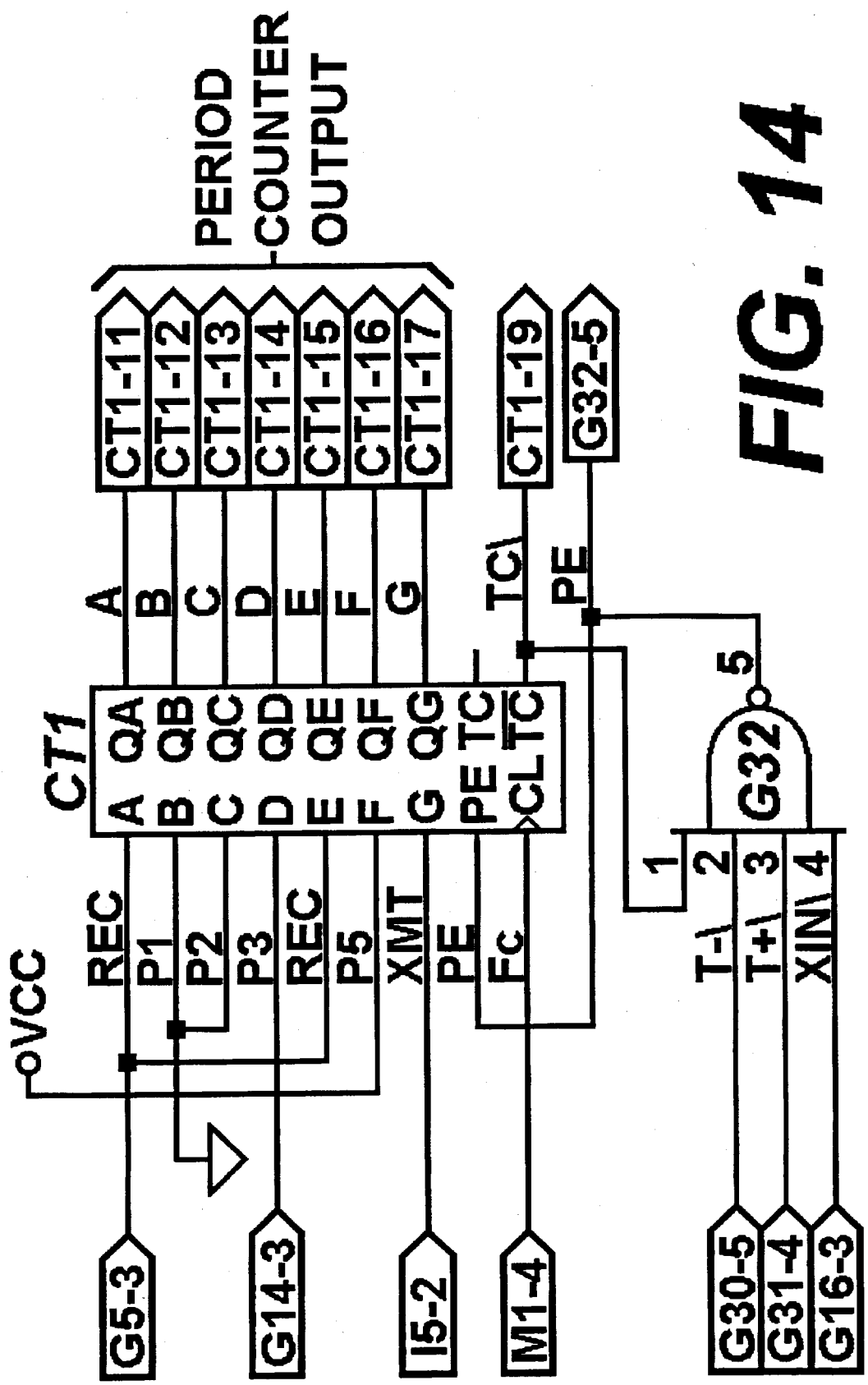
FIG. 14 is a detailed logic diagram of the period-counter and its control logic circuits.

FIG. 14 is a logic diagram of the Perctr circuit section of FIGS. 3A and 4B, showing the seven-bit period counter, CT1, its related control and output signals and Nand gate G32, which combines signals that form PE, the period counter preload pulse. A description of the counter's operation is presented in FIG. 5C in the glossary of logic symbols. As indicated in the timing diagrams of FIGS. 7, 8, 9, 10, and 11, and as described in paragraphs relating to these sequences and elsewhere, the moduli of count (limit cycles) of the period counter, as clocked by Fc, are determined by one of three sets of signal states applied to the preload inputs at pins 1 through 7 (preload bits A through G) during the Fc clock cycles in which PE is at logic one. The three preload states permissible in this design, are 57 decimal for receive mode, and 104 decimal to transmit an infrared logic one modulated period, or 96 decimal to transmit an infrared logic zero modulated period. These binary preload input states for each function are shown in the following:

| Preload bits when PE - 1 | | XMT 0 DATA | | XMT 1 DATA | | RECEIVE MODE |
|---|---|---|---|---|---|---|
| (LSB) | A | 0 | | 0 | <-REC-> | 1 |
| | B | 0 | | 0 | | 0 |
| | C | 0 | | 0 | | 0 |
| | D | 0 | <-P3-> | 1 | | 1 |
| | E | 0 | | 0 | <-REC-> | 1 |
| | F | 1 | | 1 | | 1 |
| (MSB) | G | 1 | | 1 | <-XMT-> | 0 |
| Decimal equivalents | | 96 | | 104 | | 57 |
| Counter modulus | | 32 | | 24 | | 71 |

Active input signals used to set the states of the period counter reload values are P3, REC and XMT, connected to the input bits indicated. Remaining preload bits are tied to the (unchanging) logic levels shown. Nand gate G32, used as an inverted input Or gate, generates PE, the period counter preload signal, as a function of T-\ (inverted, delayed negative transition of IN, the selected input signal), T+\ (inverted, delayed positive transition of IN) TC\ (inverted period counter terminal count) or XIN\ (Transmit initialize pulse). The remaining input to the circuit section is the Fc internal clock, which advances or preloads the counter once each logic zero-to-one transition. Outputs passed from this circuit section are TC\, PE and the binary output bits of the counter, signals A through G, all of which are used one or more of the other circuit sections.

FIG. 15 is a logic diagram of the circuit section in FIGS. 3A and 4B, labeled Irp. Circuits contained in this section are the logical gates which produce the separate and combined input transition pulse signals derived from the delayed states of the selected input signals; IRin in receive mode, and TX in transmit mode. Also is shown the IRP flip-flop, F28, and its control and reset gates. The positive input transition signal, produced as an active logic zero signal T+\, is active in both transmit and receive modes, and is enabled by TE, the transition enable signal described above. When enabled by TE at logic one, G31 Nand gate combines IN"\, the selected and captured IN signal, delayed by one Fc clock period, with IN"'\, the logical complement of the same IN' signal, delayed by two Fc clock periods, thus producing a one Fc period active-zero pulse, one Fc period after capture of a zero-to-one transition of the selected input signal. The negative input transition signal, produced as an active logic zero signal T-\, is active only in transmit mode, and is enabled by XMT, the transmit mode signal, and TE, the transition enable signal. When enabled by TE at logic one and XMT at logic one, G30 Nand gate combines IN"'\, the logical complement of the selected and captured IN signal, delayed by one Fc clock period, with IN", the logical complement of the IN' signal, delayed by two Fc clock periods, thus producing a one Fc period active-zero pulse, one Fc periods after capture of a zero-to-one transition of the selected input signal.

Nand gate G33, used as an inverted input Or gate, combines T+\ and T-\, when active, to form XSN, the unmasked input transition pulse at G33 pin 3. Passing XSN to inverter I5 pin 1 produces the logical complement of XSN, XSN\, at I5 pin 2. All four of these signals are passed out of this circuit section for use in other sections, and XSN is also used within this circuit section. The IRP flip-flop, enabled to change by the period counter preload signal, PE, forcibly reset by at logic zero at F26 "R" pin. And gate G41 forces F26 reset when either XMT is at logic zero (not in transmit mode), or when the beginning-inhibit active-zeros signal, BI\ is at logic zero. The F26 "Q" output is the active-one IRP (infrared pulse) signal, used to enable the infrared gated-current LED driver, shown in FIG. 1, thus producing a transmitted infrared signal. When the inverted reset input of F26 is at logic zero, therefore, no infrared signal is produced. Nor gate G29 and Or gate G40 provide control of the flip-flop data input at F26 "Q" output. The state of this pin, when F26 is not reset, and any PE pulse occurs, steers the IRP signal to that state in the next period of the Fc clock. When the preload-effect inhibit signal, PEI, is at logic zero and XSN is at logic zero, IRP is fed back, via G29 and G40, to the F26 data input, as complemented by G29. When these conditions are true, the inverted feedback of IRP to its flip-flop's input causes IRP to toggle (alternate) following each PE pulse. Or gate G40 combines the inverted IRP feedback signal with XSN, such that a logic one pulse at XSN will always steer IRP to a logic one. In this way, in transmit mode, and with BI\ inactive at logic one and PEI at logic zero, the TC-produced PE pulses created by free-running of the period counter causes the IRP signal to alternate each period counter TC cycle, while each TX transition produces an XSN pulse and a PE pulse, always steering the IRP signal to logic one. Further, if in any PE pulse period both XSN and TC pulses are present, the XSN pulse dominates, steering IRP to logic one. Also, if the XSN pulse immediately precedes the period counter state 127 decimal, the period count will be preloaded, and the expected TC pulse will not occur at the expected time. These operations assure that an IRP pulse will always commence immediately following a TX transition, and that in the absence of a TX transition, IRP pulses will continue between transitions at the three, or four pulse-per-minimum-bit-time rate determined by the period counter modulus. This is the main mechanism by which the infrared pulses are maintained in synchronization with the input data transitions while transmitting FASIR modulated infrared signals. Presence of logic one at PEI while the TIE transition enable signal is at logic one, causes stalling of the IRP pulse at the end of each bit-time until the end-of-bit TX transition occurs in Manchester mode. This added mechanism provides infrared pulse synchronization as required in Manchester mode, as well. These operations are shown in the timing diagrams of FIGS. 7A and B and 8A and 8B and are discussed in preceding paragraphs.

Figure 4C:
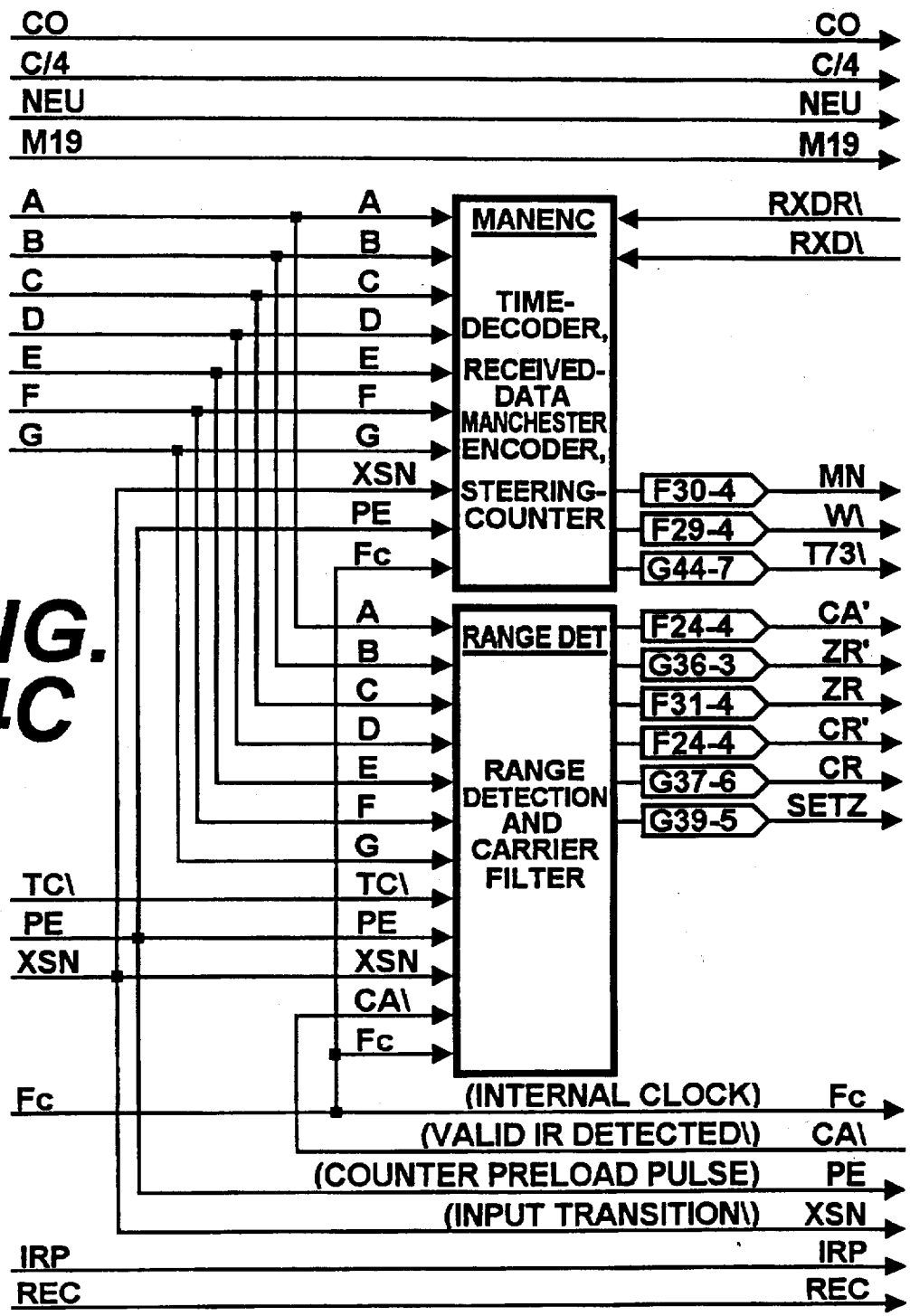
Figure 16:
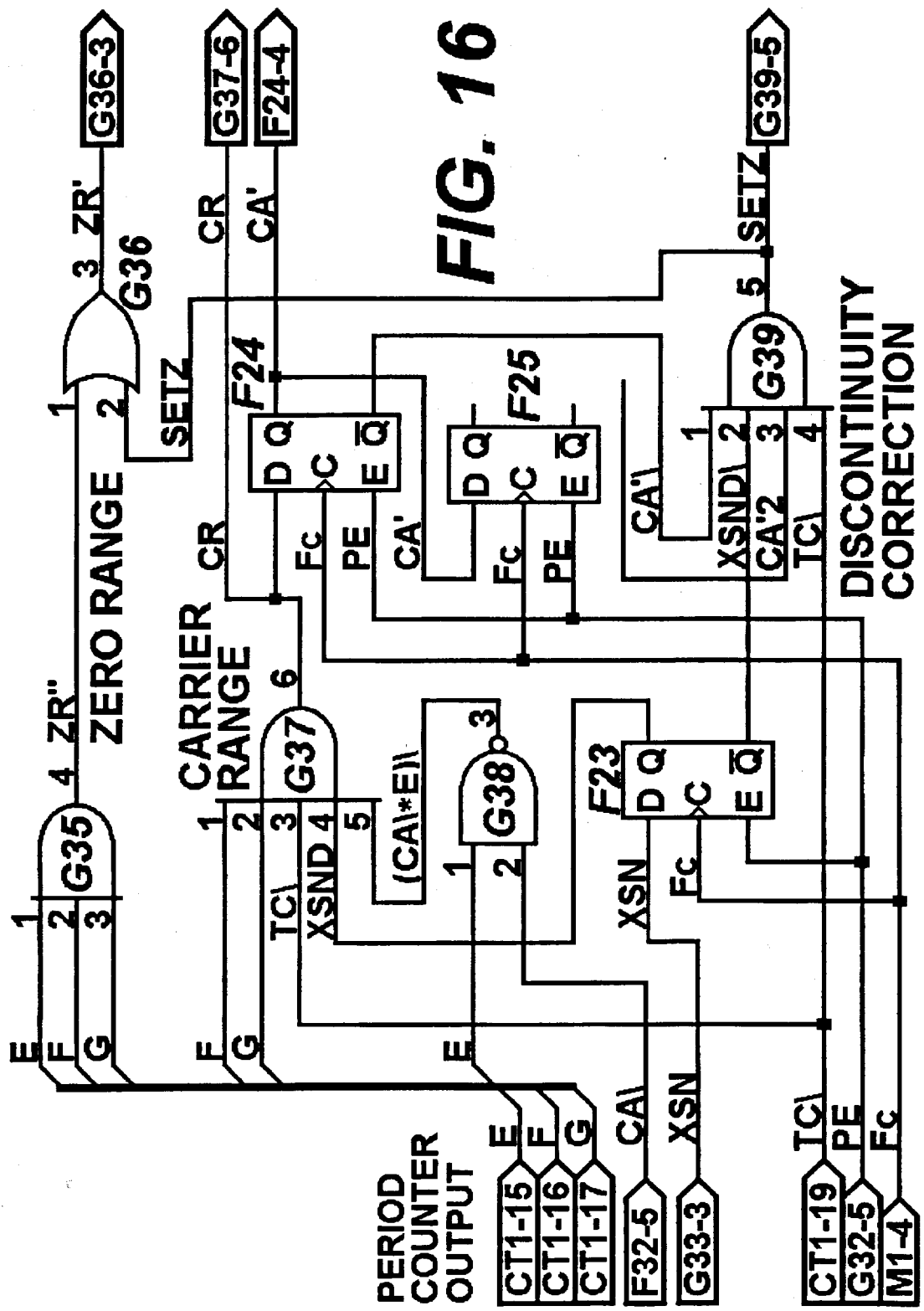
FIG. 16 is a detailed logic diagram of the (infrared input-pulse-period) range-detection and carrier filter circuits.

FIG. 16 is a logic diagram of the Rangedet circuit section, shown in FIGS. 3A and 4C. This circuit section contains the carrier period range and zero period range decoding of the period counter states, the CA' (filtered carrier) flip-flop, the XSND flip-flop and the circuits required to manage the re-synchronized recovery of the receiver, in non-Manchester mode, when exposed to FASIR modulated infrared pulse discontinuities due to transmission of long one, early zero and long one, late zero conditions, as previously described, and as shown in FIG. 2A.

In FIG. 16 are shown two And gates responsible for the decoding of period counter states in receive mode, which define the allowable intervals that distinguish durations, and therefore the data states, of the received infrared pulses. As is seen in FIGS. 9, 10, and 11, the detected carrier range, in the design shown, encompasses the range of period counter states, 96 decimal through 126 decimal. These states are contiguously decoded by And gate G37 from the binary bits of the period counter, F and G, as well as the complement of there period terminal count signal TC, used to exclude state 127 decimal from the range. Two additional input signals, (CA\*E)\ and XSND, are used to inhibit detection of, or loss of carrier under initial, or certain transient conditions. The output of G37 at pin 6, CR (carrier range) is passed out of this circuit section to the Rxd section, and is used within this circuit section, as well. Nand gate G38 combines the signal CA\ and period counter bit E to form the term (CA\*E)\. This term appears at G37 pin 5 to inhibit detection of an initial in-range infrared carrier which lies in the part of the carrier range defined as received-from-zero if a logic one carrier range infrared signal has not been first received and validated. As previously described, the detection of an initial data logic one period is required to "unlock" the receiver, in order to prevent false detection of a logic one data period due to the probable "stretching" of any first-received infrared pulse, due to the impulse response characteristic of the photo-amplifier.

A one-PE-cycle delayed form of XSN, XSND, is generated by flip-flop F23, at its "Q" output. XSND is passed to And gate G37 at input pin 4. This signal inhibits the detection of a carrier signal if its previous period was excessively long, indicating a preceding absence-of-signal, or a preceding out-of-range-low-frequency infrared pulse. This prevents false detection of a first, unsynchronized, positive transition of IRin as an in-range period. A second positive transition of IRin must occur before the pulse period can be evaluated. The first IRin pulse serves only to synchronize the period counter. A second IRin positive transition produces a second XSN pulse without an intervening TC pulse and presents XSND and TC\ as logic one at G37 pins 4 and 3 respectively. This occurs upon receipt of the first complete pulse period which is short enough to prevent TC\ from occurring first. If the period counter state is then in the logic one range, or if carrier (CA\ signal at logic zero) is still valid after a prior detection and the period counter state is within the carrier range, CR (carrier range signal) will be at logic one, and will set both the CA' and CA (part of the Rxd circuit section) flip-flops to logic one in the Fc cycle following the PE pulse (due to XSN) created by the IRin positive transition marking the end of the infrared period. The infrared pulse just received is, at that time, validated, and presence of infrared carrier (CA) enables the remaining receiver operations, described in subsequent paragraphs.

Figure 17:
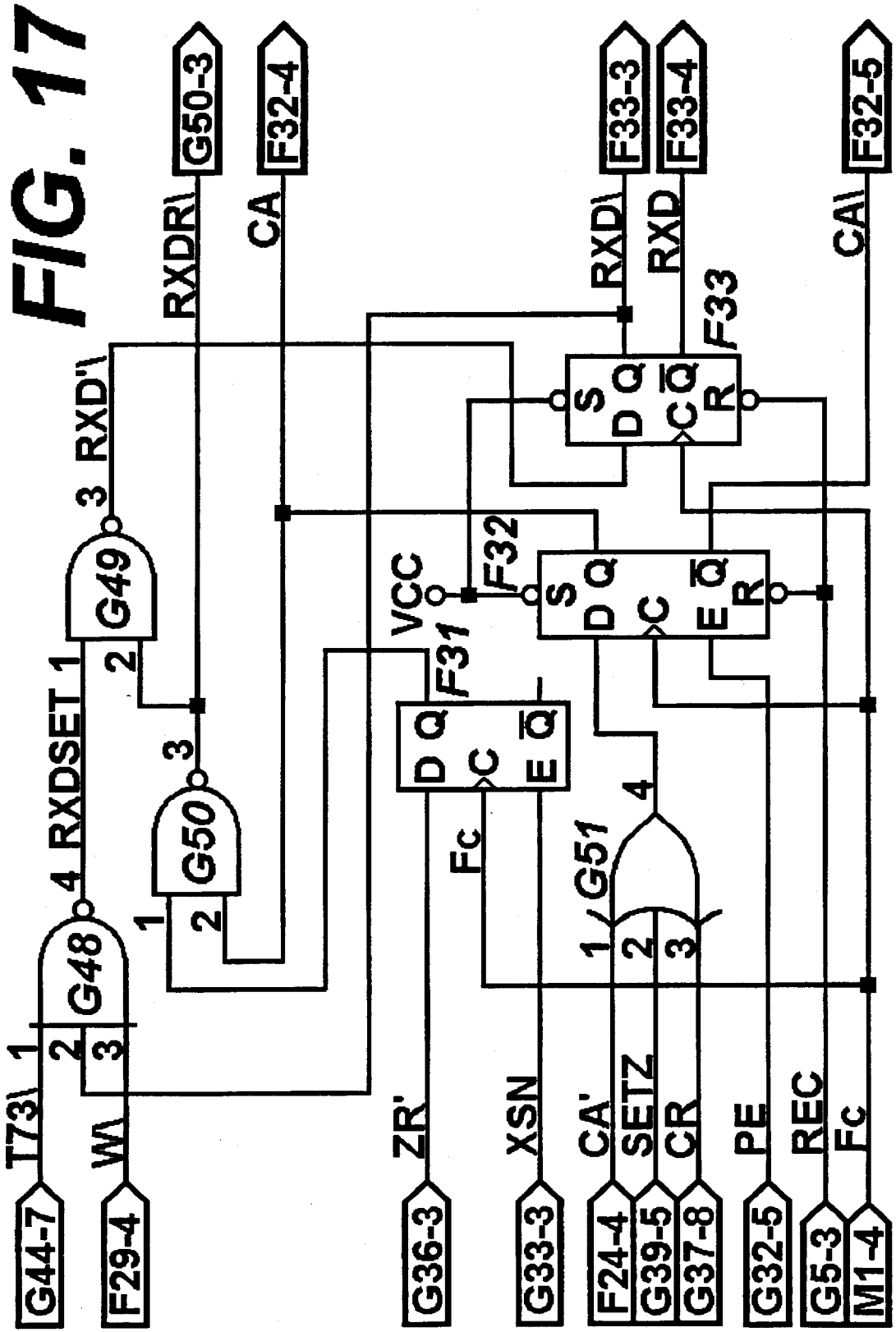
FIG. 17 is a detailed logic diagram of the (received infrared) carrier detection and RXD (received NRZ data output) circuits.

For the following descriptions, reference to FIGS. 3 and 4, FIG. 16, the logic diagram of the Ranged et circuit section, FIG. 17, the logic diagram of the Rxd circuit section, and the timing diagrams in FIGS. 2, 9, 10, 11, 18, and 19 will be required. In FIG. 17 are shown the three signals passed via Or gate G51 to the CA (carrier) flip-flop, F32. If any of these signals are at logic one when a PE pulse occurs, F32 "Q" output (CA) will be set to logic one in the next Fc period. The three signals shown are CA' (filtered carrier signal), CR (decoded period counter states representing an in-band carrier) and SETZ (set-to-zero signal, used to manage a long one, late zero recovery of the receiver). Referring to FIG. 16, and then also to FIG. 17, the CA' flip-flop, F24, and SETZ, at G39 pin 5, serve as "filters" to allow the receiver to tolerate the apparent loss of carrier which can occur due to forced synchronization of the transmitting transceiver on receipt of its first TX one-to-zero transition following a long, unsynchronized, transmission of the preceding TX logic one state, in non-Manchester mode. This phenomenon is shown in a general way in the timing diagram of FIG. 2A, and in detail in the timing diagrams in FIGS. 18A and 18B and FIGS. 19A and 19B which illustrate, on an Fc clock period-by-period basis, the case referred to previously as the long one, late zero condition.

Figure 18A:
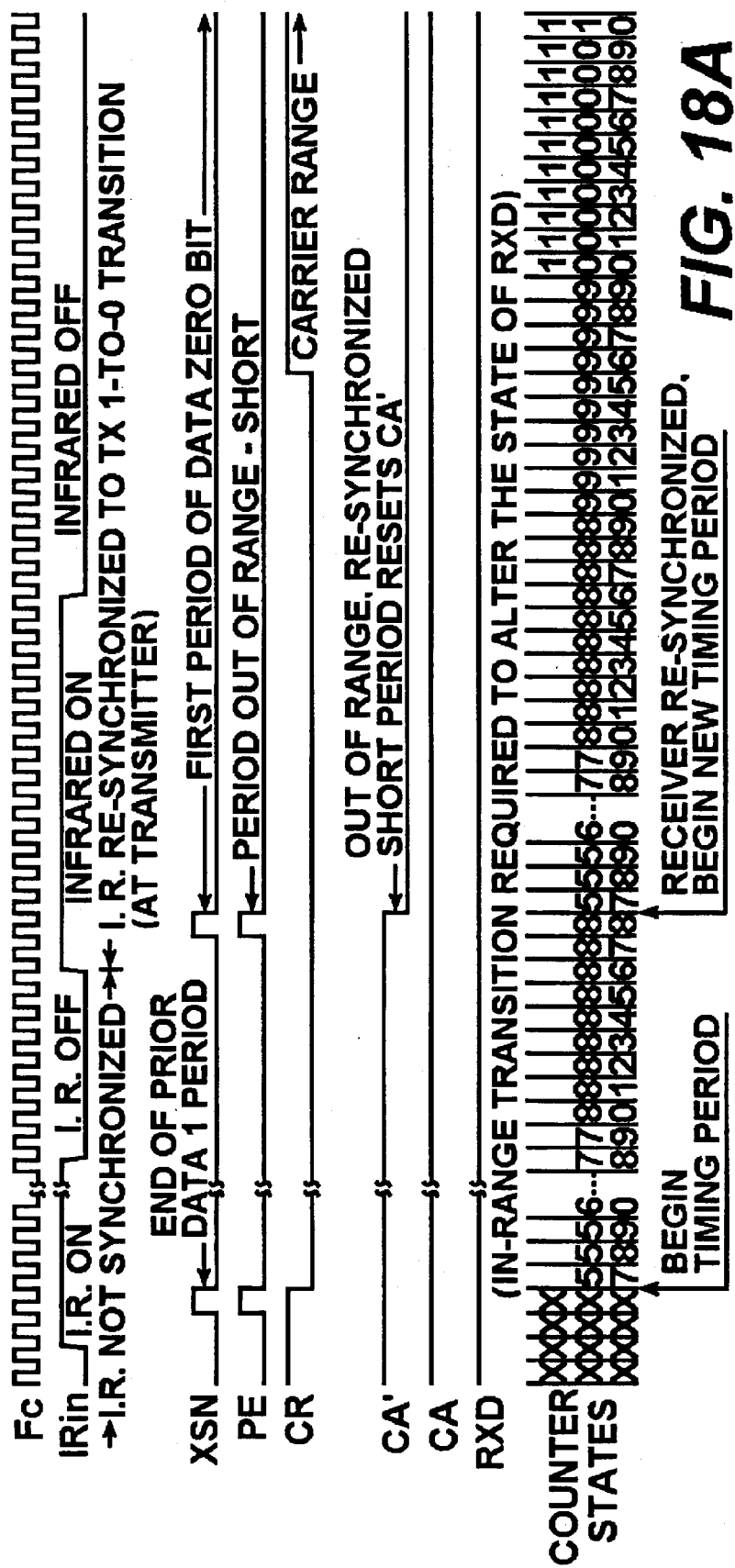
FIGS. 18A, 18B, 19A and 19B are timing diagrams which illustrate the operation of the period counter and related elements within the logic implementation of the preferred embodiment used for the detection and demodulation of infrared pulses received, under adverse infrared signalling conditions.
Figure 18B:
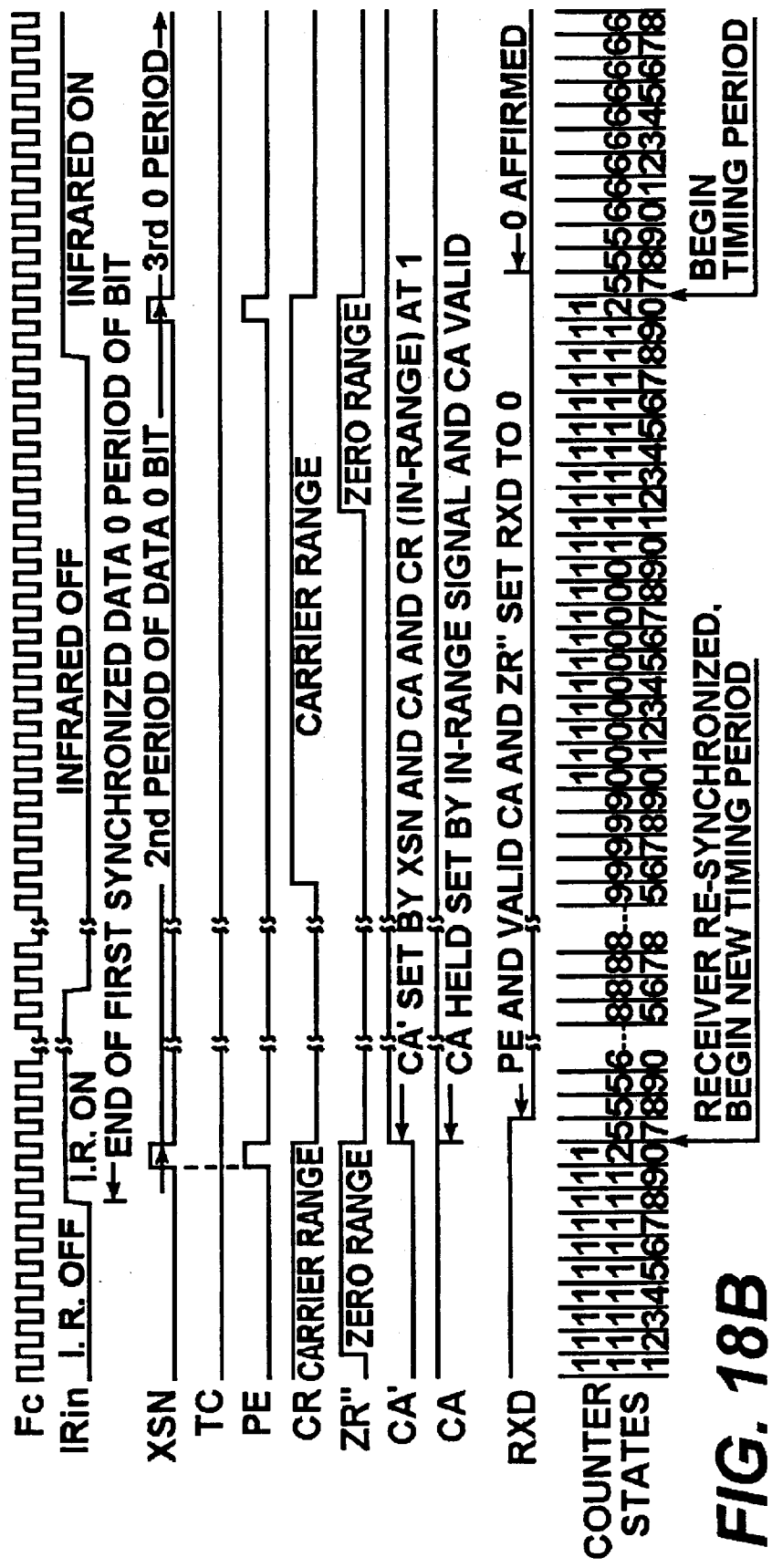

In FIG. 18A is shown, on the IRin time-line, an example of the pulse timing discontinuity pattern of this kind. FIG. 18B is an immediate continuation of FIG. 18A illustrating the receiving transceiver's recovery from this kind of discontinuity. In the example shown, as is seen at the left of the IRin line in FIG. 18A, a preceding series of uninterrupted data logic one infrared pulse periods is assumed to have been transmitted to, and detected by, the receiving transceiver. This (usually, long) data logic one interval is typical of an initial infrared pulse-series that would be produced by the transmitting transceiver following invocation of non-Manchester transmit mode, with its TX input inactive at logic one. Immediately following the first one-to-zero (start bit) transition of TX at the transmitting transceiver input, its IRP-modulating circuits are forced into synchronization with the (first) input data (TX) transition. The receiving transceiver, having received valid data logic one pulses, has been synchronized to the first infrared pulse(s) received and has remained in synchronization, timing and validating each subsequent infrared interval as data logic one periods, and forwarding the state of each pulse period to its RX output, as RXD, held steadily at logic one, along with CA (at S+C/4 output) held steadily at logic one, indicating that a valid carrier has been present. In the case shown in FIG. 18, one of four possible conditions arising from the transmitting transceiver's re-synchronization is shown. In this case, the TX zero-to-one transition is shown to have occurred shortly after the preceding, unsynchronized infrared period was completed, but after the pulsed infrared signal had reached its "off" interval. As shown, this circumstance can produce a IRin pulse at the receiving transceiver which is foreshortened, and is evaluated as an out-of-range (excessively high-frequency) signal. Referring also to FIGS. 16 and 17, the purpose of the CA' flip-flop, F24, will be apparent. The CA' signal, as shown in the FIGS. 18A and B diagram, is set to logic zero, one Fc cycle following the XSN pulse produced by the end of the foreshortened IRin period. The CA (carrier) signal however, is not set to zero at this time, because CA' was at logic one when (in FIG. 17) F32 was enabled to change by the PE pulse produced by this XSN pulse. (It should be noted that if a second, subsequent, out-of-range period were detected, CA' would be at zero, and CA would reset following a second such PE pulse). In the FIG. 18A, then FIG. 18B diagrams, the out-of-range IRin pulse period, at its ending transition, re-synchronizes the receiving transceiver's period counter, such that it correctly evaluates the subsequent data zero period, setting CA' to logic one and correctly setting RXD to logic zero. At the end of the first complete data zero interval, the internal states of the receiver are restored as if the long one, late zero discontinuity had not occurred, and no intervening output anomalies have occurred during the recovery sequences.

Figure 19A:
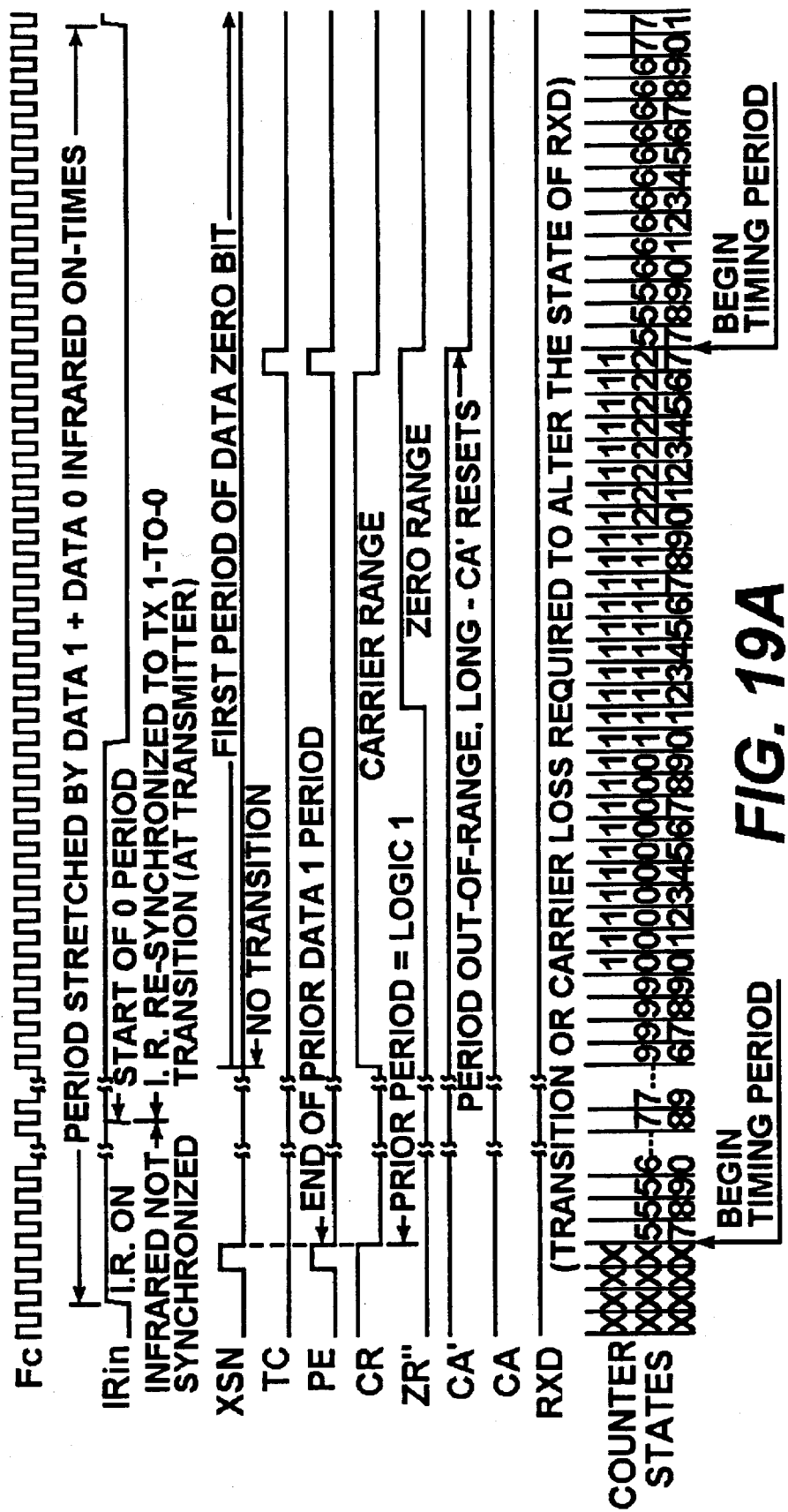
Figure 19B:
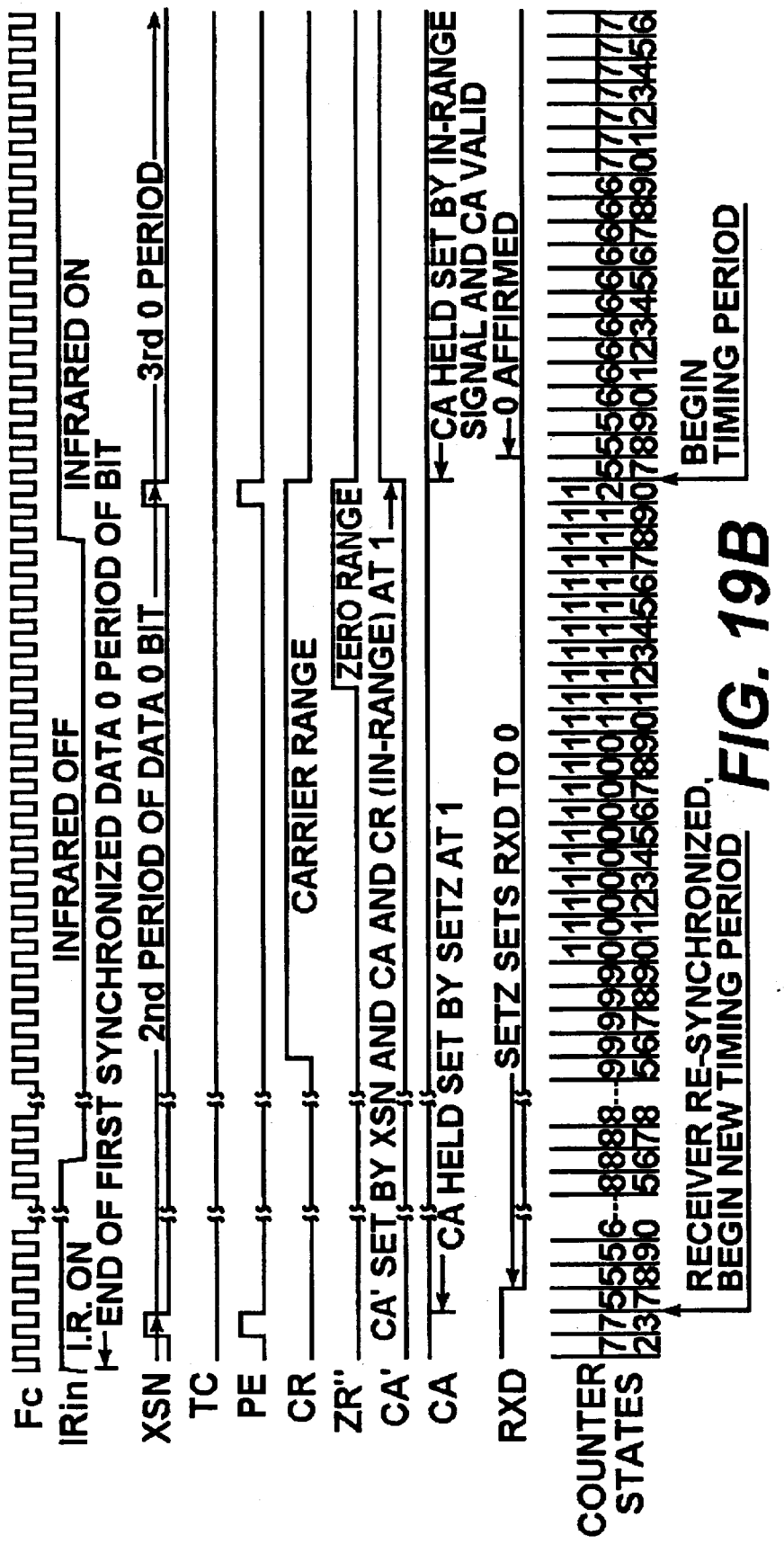

The IRin time-line in FIG. 19A shows an example of the pulse timing discontinuity pattern caused by receipt of a long one, early zero infrared signal discontinuity. FIG. 19B is an immediate continuation of FIG. 19A illustrating the receiving transceiver's recovery from this kind of discontinuity. In the example shown, as is seen at the left of the IRin line in FIG. 19A, a preceding series of uninterrupted data logic one infrared pulse periods is assumed to have been transmitted to, and detected by, the receiving transceiver. As is FIG. 18, This (usually, long) data logic one interval represents an initial infrared pulse-series that would be produced by the transmitting transceiver following invocation of non-Manchester transmit mode, with its TX input inactive at logic one. Immediately following the first one-to-zero (start bit) transition of TX at the transmitting transceiver input, its IRP-modulating circuits, as in FIG. 18, are forced into synchronization with the (first) input data (TX) transition. The receiving transceiver, as before, has been synchronized to the first infrared pulse(s) received and has remained in synchronization, forwarding the state of each pulse period to its RXD (RX) output as logic one, along with CA (carrier signal) at logic one. In the case shown in FIG. 19, the second of four possible conditions arising from the transmitting transceiver's re-synchronization is shown. In this case, the TX zero-to-one transition is shown to have occurred shortly after the preceding, unsynchronized infrared period was completed, but before the pulsed infrared signal had reached its "off" interval. As shown, this circumstance can produce a IRin pulse at the receiving transceiver which is greatly extended, and is evaluated as an out-of-range (excessively low-frequency) signal. Referring also to FIGS. 16 and 17, the purpose of the SETZ function at G39 pin 5, will become apparent. The CA' signal, as shown in the FIG. 19 diagram, is set to logic zero, one Fc cycle following the TC pulse produced by the end state of the period counter, 127 decimal, which occurs during, and due to the extended IRin period received. CA is not set to zero at this time, because CA' was at logic one when the PE pulse was produced by this TC pulse. Unlike the example shown in FIG. 18A, the period counter receives no XSN pulse in FIG. 19A, which would have synchronized it to the IRin signals. The next IRin positive transition does not occur until the end of the extended infrared period (shown at the far right of FIG. 19A), producing the XSN pulse at the far right of FIG. 19B. This transition marks the receipt of the end of the first re-synchronized infrared pulse produced by the transmitting transceiver. The XSN pulse produced by this transition of IRin is in the case shown, evaluated as out-of-range (period too short), but since the period counter TC interval has not expired a second time, CA is still at logic one, but CA' is not set to logic one by CR. This XSN pulse re-synchronizes the period counter to the (now synchronized) IRin pulses, and would cause resetting of CA (carrier signal) if SETZ were not at logic one. (See FIGS. 16 and 17). Examination of the FIG. 19 sequences shows that at the time of the XSN pulse in question, certain historical and present factors are known which can uniquely identify this condition. These factors are:

1) There is no TC pulse, therefore the PE pulse is derived from XSN.

2) CA' is at logic zero for the first time that PE has occurred after CA' was first set to zero.

3) The previous PE pulse occurred when XSN was not present. Additional facts regarding these sequences are discernible, as well, but those listed above are sufficient to identify this condition uniquely.

Referring again to FIG. 16, each these factors are generated as needed and used at the inputs to And gate G39 to produce SETZ (set-to-zero signal), subsequently applied to G51 (in FIG. 17) input, to prevent loss of the carrier signal, and also to G36 pin 2 to simulate the receipt of a valid zero range (ZR') signal, used as an input the RXD steering circuits to set RXD to logic zero. These would be the correct actions of the receiving transceiver if the long one, early zero discontinuity had not occurred. Factor 1), above, is included in the SETZ term by connection of TC\ from the period counter to G39 pin 4. The first (but not second) logic zero period of CA' is included in SETZ by connection of CA\ to G39 pin 1, and the connection one PE pulse-delayed form of CA', CA'2, to G39 pin 4. This signal is generated at F25 "Q" output. The third and final factor required to identify this condition is XSND\, indicating that the previous PE pulse was not concurrent with XSN, already generated at F23 "Q" output as required as part of the CR (carrier range) signal generation.

As seen in the FIG. 19A diagram, at the right, then near the far left of FIG. 19B, the final out-of-range IRin pulse period, at its ending transition, XSN, re-synchronizes the receiving transceiver's period counter such that it correctly evaluates the subsequent data zero period, setting CA' to logic one and correctly holding RXD at logic zero. At the end of the first undistorted data zero interval, the internal states of the receiver are restored as if the long one, early zero discontinuity had not occurred, and no intervening output anomalies have occurred during the recovery sequences.

The two remaining conceivable infrared pulse-distortion conditions to be considered, which may result from the abrupt re-synchronization of the transmitting transceiver due to a one-to-zero transition of the data input (TX) in non-Manchester mode, are:

1) Re-synchronization later than that shown in FIGS. 18A and 18B, and

2) Re-synchronization earlier than that shown in FIGS. 19A and 19B.

Referring to FIGS. 18A and 18B for examination of case 1), above, it can be seen in FIG. 18A that if the second IRin (transmitter re-synchronizing) positive pulse were moved incrementally to the right (earlier) in the diagram, the preceding data logic one period would eventually reach a point where is again fell into the correct range for evaluation by the receiving transceiver as a logic one period. The subsequent pulse, following re-synchronization of the infrared transmitting transceiver, would then be correctly identified as a data logic zero period. A change of RXD would occur at the time required, and neither CA, or CA' would be set to logic zero. In short, no signal disruption would exist. If the same second IRin transition were moved further to the right in the diagram, the last logic one pulse shown could not be extended beyond its normal period, and the conditions shown in FIGS. 19A and 19B would begin to appear. Up to that point, again, no signal disruption would exist.

Referring to FIGS. 19A and 19B for examination of case 2), above, it can be seen in FIG. 19A that if missing an IRin (transmitter re-synchronizing) transition, and the entire IRin pulse were moved incrementally to the left (earlier) in the diagram, this first data zero pulse one period would eventually reach a point where is again fell into the correct range for evaluation by the receiving transceiver as a logic zero period. This pulse, also following re-synchronization of the infrared transmitting transceiver, would then be correctly identified as a data logic zero period. A change of RXD would occur at the time required, and neither CA, or CA' would be set to logic zero. Here also, no signal disruption would exist. If the same second IRin transition were moved further to the left in the diagram, the last logic one pulse shown would not occur, and the conditions shown in FIG. 18 would begin to appear. Up to that point, yet again, no signal disruption would exist.

It should be noted that the operations, described above, are required for conditions which occur only in receive non-Manchester mode, and are not required in, nor are their mechanisms detrimental to, operations required in receive Manchester mode. As previously shown, transmission of infrared pulses from a Manchester-encoded TX signal source are synchronized bit-time-by-bit-time at the transmitting transceiver, and are dependent upon the continuous end-of-bit TX transitions in order to be continued.

Again referring to FIG. 16, And gate G35 decodes period counter bits E, F and G, to define the ZR" signal as logic one over the period counter states 112 decimal through 127 decimal. The SETZ signal is combined with ZR" via Or gate G36, to form ZR' at its pin 3. ZR' is passed out of the circuit section to be used in the Rxd circuit section to steer the state of the RXD output after its capture by an intervening flip-flop, and to the Manenc circuit section for use in control of the Manchester output encoder circuits.

Referring to FIG. 17, the logic diagram for the Rxd circuit section, once more, the signals CA', SETZ, and CR, just described, are shown as inputs to Or gate G51. Its output at pin 4, connected to the data ("D") input of flip-flop F32, generates the CA (carrier signal), as previously described. The connection of REC (receiver mode signal) to the inverted reset at the "R" pin of F32 prevents the indication of a valid carrier when receive mode is not invoked. The CA signal is used within this circuit section to form RXDR\, and then RXD'\, used here to steer the states of the RXD flip-flop, F33, and is passed out of this circuit section to the Manenc circuit section, as shown in FIG. 4C. The connection of REC to the F33 inverted reset ("R" pin) forcibly sets RXD to logic one (its idle state) when receive mode is not invoked.

Still referring to FIG. 17, the state of ZR' is captured by flip-flop F31 in the Fc cycle following an XSN (input transition) pulse, forming ZR, the captured, (data) zero range signal. The ZR signal flip-flop, F31, always holds the ZR' state captured at the last XSN pulse, and is not affected by TC or PE pulses. This assures that if only one TC pulse occurs between valid carrier evaluations, RXD will not be steered to a false state before carrier loss can be validated, or a new IRin period correctly evaluated. Thereafter, if a second PE pulse occurs due to loss of valid carrier (excepting in the one special case where SETZ is active), CA will be set to zero, then steering RXD to logic one, as follows. If the carrier signal, CA, and ZR are both at logic one, Nand gate G50 combines these terms to drive RXDR\ (inverted RXD reset) at pin 3 to its logic zero (active) state. RXDR\ is passed out of this circuit section to the Manenc section, and is used within this section to drive RXD'\, via Nand gate G49, to logic one. RXD'\ is connected to the data input of the RXD flip-flop, F33, and in the following Fc cycle, sets the RXD (F33 "Q") output to logic zero, and its complement, RXD\ (F33 "Q" output) to logic one, as seen in several of the previously referenced receive-mode timing diagrams. Once RXD\ is set to logic zero, it is held in that state by CA and ZR both at logic zero, or regeneratively latched to logic zero, so long as T73\ and W\ are at logic one, via the feedback path through Nand gates G48 and G49 to RXD'\. In all other cases, where RXDR\ is at logic one, RXD is returned to zero (its idle state, or its state following evaluation of a valid data-one IRin period) when the inverted skew-correcting time pulse, T73\, Or W\ (from the Manchester encoder steering counter) go to logic zero. Generation and uses of these signals is described in the following paragraphs.

Figure 20:
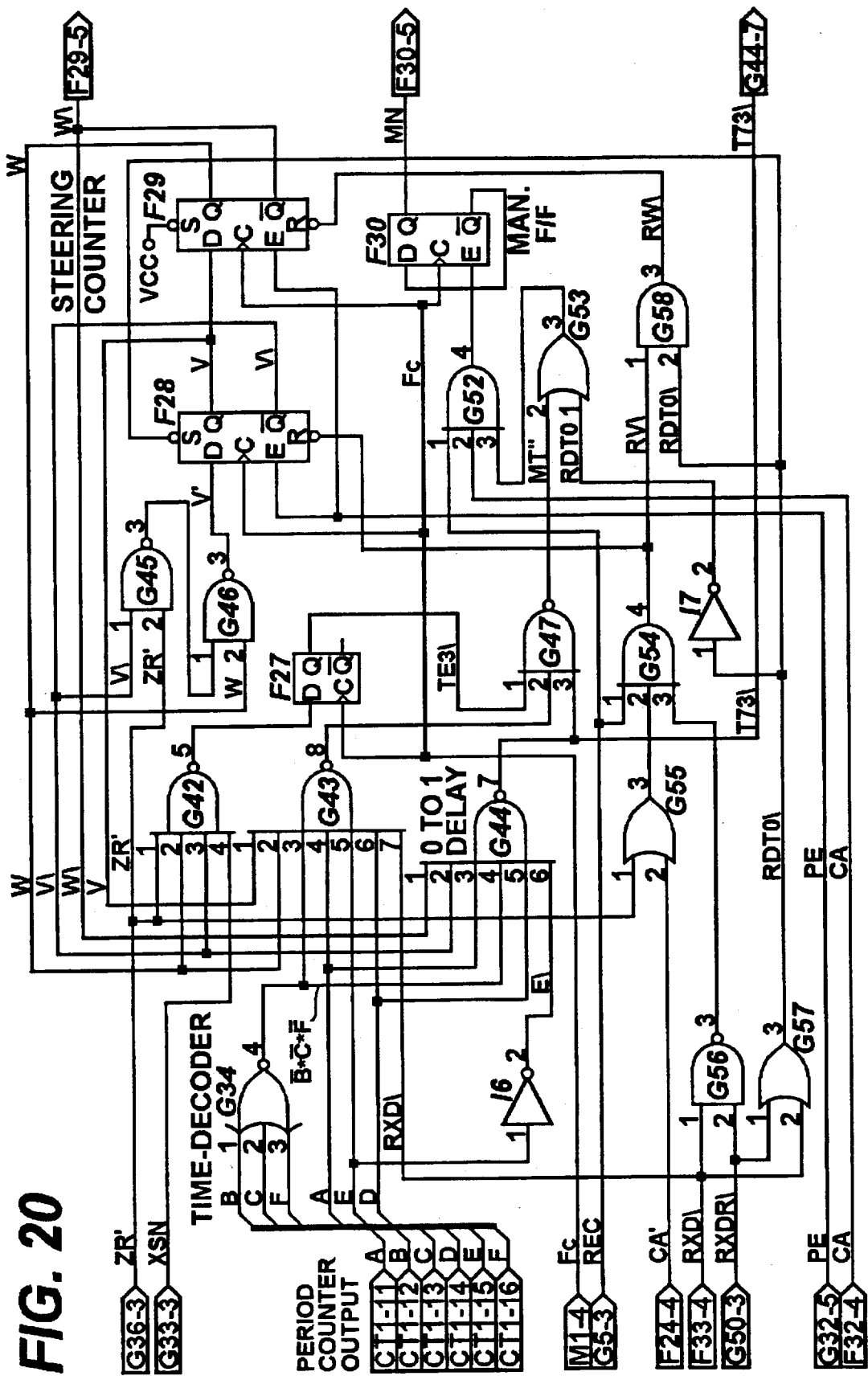
FIG. 20 is a detailed logic diagram of the received data Manchester-encoder

FIG. 20 shows the Circuit section identified as Manenc in FIGS. 3B and 4C, and is the logic diagram of the circuits used to decode the timing signals use for time-skew correction of RXD zero-to-one transitions (T73 \ and W) in both receive modes, and to control generation of the Manchester-encoded form of the RX output (MN), selected by MM at logic one, in receive Manchester mode. FIG. 2A, under the receiver input/output legend, illustrates the general operation of the Manchester encoder output, as RX. As is the case at the TX input to the transmitting transceiver, the Manchester-encoded output states are represented by the number of signal transitions which take place each bit-time. A single transition identifies a logic one data state, while an additional, mid-bit-period transition marks a logic zero bit state.

Figure 21:
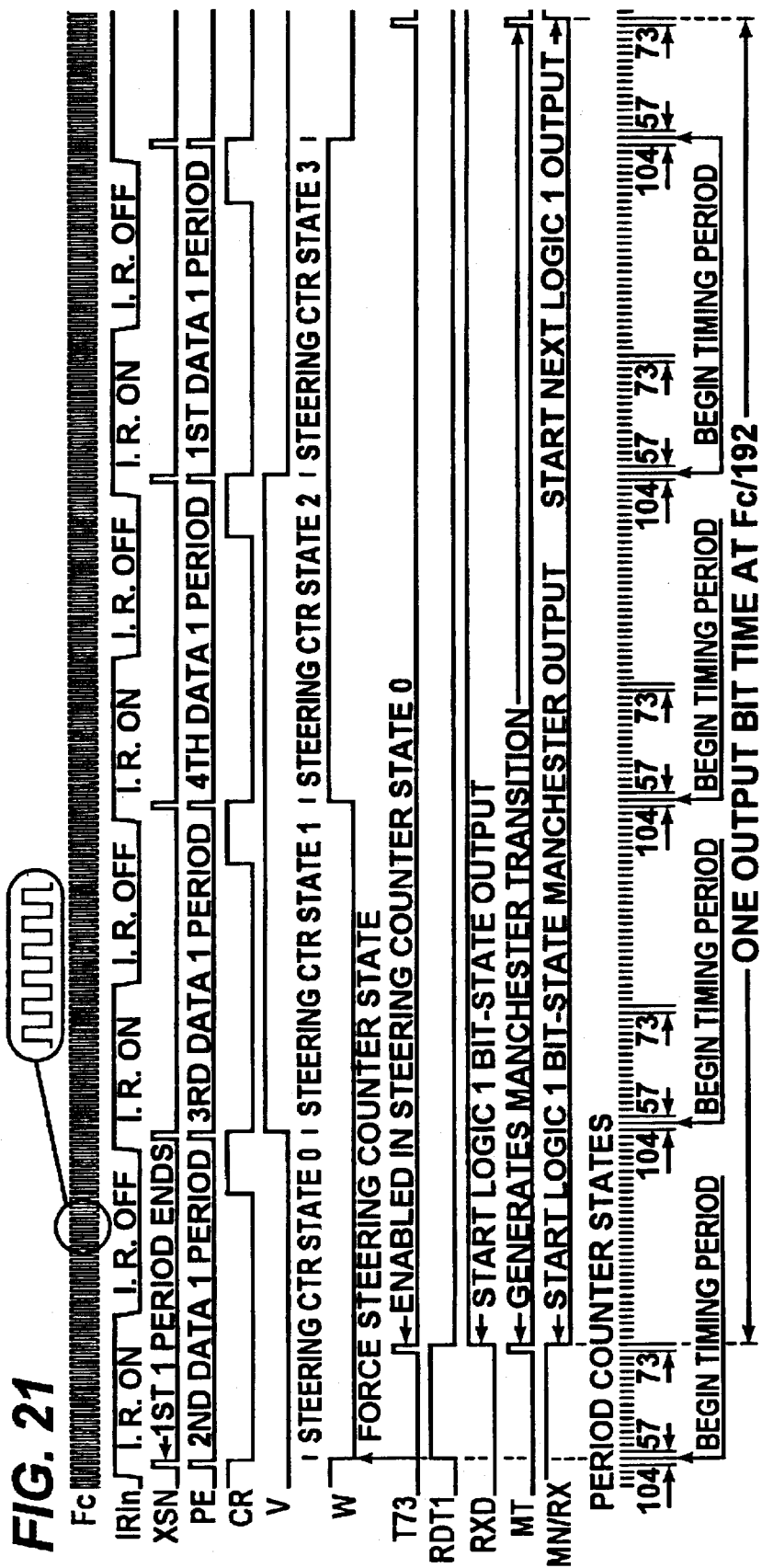
FIGS. 21 and 22 are timing diagrams which illustrate the operation of the Manchester encoder circuits and related timing elements within the logic implementation of the preferred embodiment used to provide Manchester-formatted output signals at the receiver output.
Figure 22:
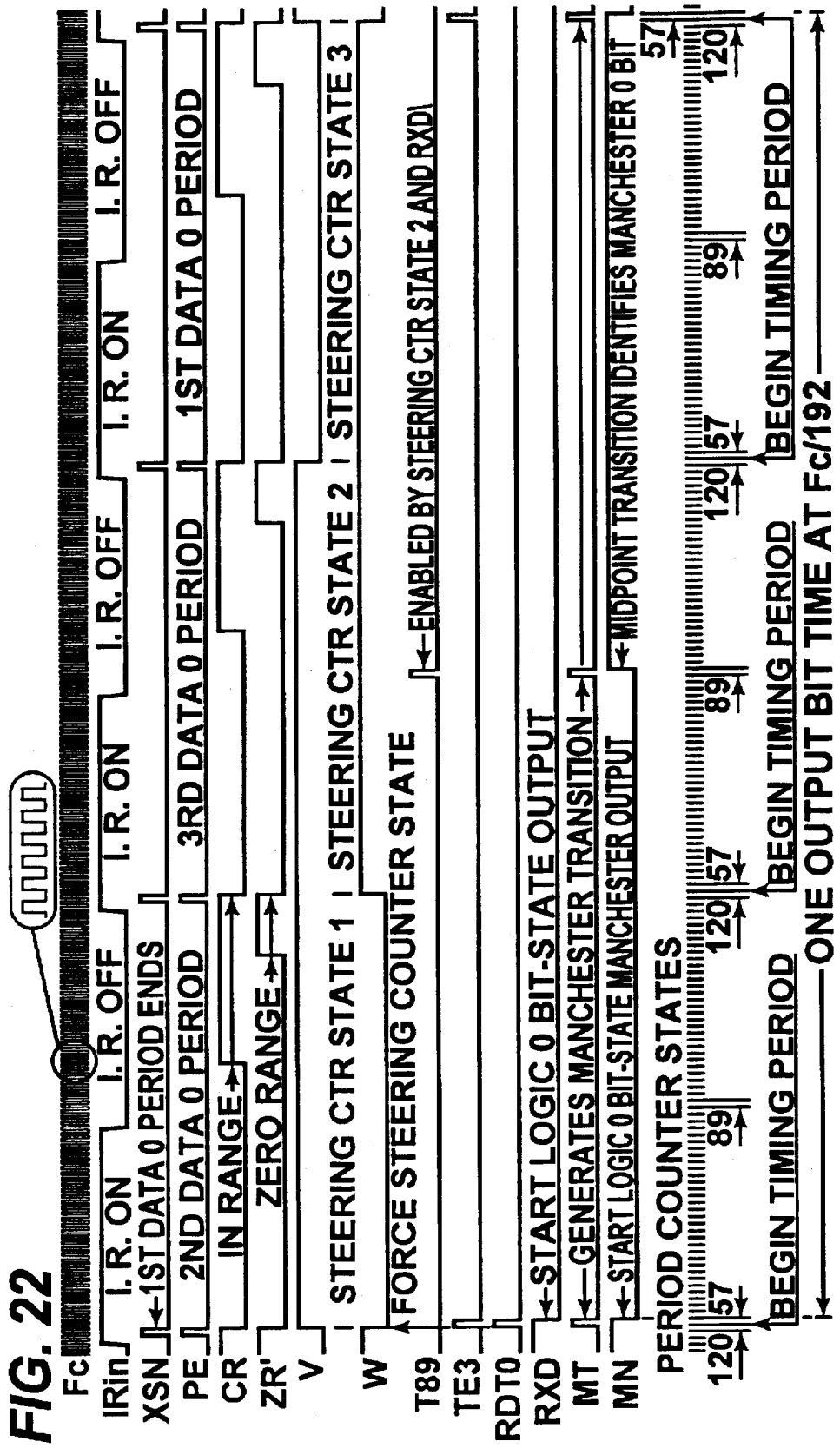

FIGS. 21 and 22 illustrate, with respect to the internal Fc clock and the period counter states (shown here as two states per column), the operations of the important functions of the circuits of FIG. 20. FIG. 21 illustrates these functions, beginning with a zero-to-one IRin-period change followed by a series of uninterrupted data one periods, and FIG. 22 illustrates these functions, beginning with a one-to-zero IRin-period change followed by a series of uninterrupted data zero periods.

Referring to FIGS. 20, 21, and 22, it can be seen that, in order to create the correct signal transitions at MN, three separate timing signals are required. These essential timing signals, gated to form MT' (later expanded to generate MT) are decoded by Nor gate G34, Inverter I6, as well as Nand gates G42, G43 and G44. XSN, ZR', RXD\, and the binary states of the Period counter are decoded along with state-signals from a modulo-3/modulo-4 presettable/resettable "steering counter", formed by flip-flops F28 and F29 and their associated gates. The function of the steering counter, thus formed, is to count the number of PE (derived normally from XSN) pulses occurring from the time of each RXD output transition. The steering-counter-state data is required, as an extension of the period counter preload periods (PE pulses), to identify the time portions, within the output period of each bit, at which Manchester signal (MN) transitions must take place. These MN transition times are then refined to single Fc-cycle pulses, by inclusion of period counter states or the XSN pulses in the decoded terms.

The F28, F29 steering counter is a modified form of a simple two-bit Johnson counter, that is; a shift register with its second (F29) stage output inverted and fed back as the first stage (F28) data input, both flip-flops sharing a common clock (Fc) and change-enable term (PE). As can be seen, upon sequential enable pulses, the sequence of states of the respective V and W outputs would then be: 0,0 (state 0), then 1,0 (state 1), then 1,1 (state 2), then 0,1 (state 3), then repeat, beginning at 0,0 (state 0). The W term (generated at F29 "Q" output), inverted and passed to F28 "D" input as V' via Nand gate G46, accomplishes this sequence when G46 pin 1 is held at logic one, thereby forming a modulo-4 Johnson-sequence counter, advanced during the Fc period following each PE pulse. If however, G46 pin 1 (the output of Nand gate G45 at its pin 3), is at logic zero during any PE pulse, steering counter bit V, at F28 "Q" output, will be set to logic one in the next Fc period. Nand gate G45 combines V\ (inverted form of V) and the decoded period counter zero-range signal ZR' to generate a logic zero state at G46 pin one when these terms are both at logic one. V\ at logic one indicates that V, the F28 "Q" output bit is not set, and ZR' indicates that the PE pulse (XSN pulse) marks the end of an IRin period which is within the valid data zero range. As a result, when receiving valid infrared pulses representing a data zero state, the modulus of the F28, F29 steering counter becomes 3, rather than 4. Under this condition then, it can be seen that, following each sequential enable pulse (PE), the sequence of states of the respective V and W outputs will then be: 1,0 (state 1), then 1,1 (state 2), then 0,1 (state 3), then repeat, beginning at 1,0 (state 1). The states of the steering counter then exclude (skip) state 0.

In this way, the modulus of the steering counter is adjusted at the beginning PE pulse (which marks the completion of the evaluation of a beginning-of-bit-time period, and the beginning of the corresponding output of that bit), to the number of PE pulses which will occur during that (output) bit-time. It is, however, necessary to forcibly synchronize the steering counter to its correct beginning state at all times possible, to avoid the generation of spurious or incorrectly-timed transitions of the Manchester-encoded output signal due to an incorrect state of the steering counter output bits, V and W. This required forced-synchronization (and initialization) of the steering counter states is performed by signals provided by the steering counter preset logic, consisting of gates G54, G55, G56, and G58, whose final, combined, outputs, RV\ (inverted reset of V), RW\ (inverted reset of W) and RDT0\ (applied to F28 "R" pin to set V), are applied to the inverted-reset or the inverted-set inputs of flip-flops F28 and F29, at all required times and opportunities. The following paragraphs describe the operation of this forced-synchronization logic as it affects the generation of data output transition timing.

The first requirement of the steering counter preset logic is that it must correctly initialized the steering counter before any demodulated data is output. This is done in the first instance by the passing of the REC signal logic zero state, via And gate G54, to the F28 reset\ (inverted reset) at pin "R", as RV\. The RV\ (logic zero state) signal is also passed via And gate G58, to the F29 reset\ at pin "R", as RW\. As a result, when REC is at logic zero (receive mode not selected), the steering counter is initialized at state 0. It should be noted that, prior to receipt of a valid Manchester-encoded data one period, initiated at the transmitting transceiver by the second transition of its TX input, CA, the carrier signal, will not have been verified, and the appearance of CA at logic zero, at And gate G52 pin 2, inhibits all possible transitions of MN. The initialization of the steering counter to state 0, by REC at logic zero, assures that the steering counter state is initially predictable.

A second, more critical, initialization term, INIT\, generated at G55 pin 3, is also used to forcibly set the steering counter to its state 0. CA', the filtered carrier signal, at logic zero prior to validation of an in-range IRin period, and ZR', also at logic zero during any PE pulse when carrier has not been validated, appear at Or gate G55 pins 2 and 1, generating a logic zero (INIT\ active state) during all PE pulse intervals (and at all times when ZR' is decoded as logic zero during the period counter sequence), which holds the steering counter at state 0. The steering counter is therefore, poised to count in modulo 4 mode, and ready to "track" the sub-bit periods of the output of a first-received data logic one state. (The ZR' term is included in the Generation of INIT\ (Or'ed with CA' by G55), only to prevent incorrect operation of the steering counter during recovery from the long one, late zero IRin period-discontinuity, when SETZ is active logic one) and CA' is at logic zero, as previously described, and as shown in FIG. 19B).

There are two remaining conditions under which the steering counter preset logic forcibly synchronizes (or re-synchronizes) the steering counter states to the beginning of the data-output bit-times. These are the times of transition of the RXD output signal, which occur after the detection of a change of the IRin period from one data state to the other. The signals generated for this purpose are RDT1\ (received data transition-to-one, inverted), and RDT0\ (received data transition-to-zero, inverted), generated at pins 3 of Nand gate G56, and Or gate G57, respectively. The RDT1\ signal at G56 pin 3 is at logic zero during the time between decoding of a newly received valid logic one IRin data period (RXDR\ at logic one), and until RXD, steered by RXDR\, is permitted to go to logic zero, as allowed by the next T73\ (logic zero) timing pulse (see FIG. 17). The RDT1\ active logic zero pulse, thus formed, is passed via And gate G54 to the inverted reset inputs of F28 (via G58, as RV\), and to F29 (as RW\), setting the steering counter to state one as required at the beginning of an output logic one bit-time. In similar fashion, the RDT0\ signal at G57 pin 3 is at logic zero during the time between decoding of a newly-received valid logic zero IRin data period (RXDR\ at logic one), and until RXD, steered by RXDR\, is clocked to logic zero by the next Fc clock cycle. The RDT0\ active logic zero pulse, thus formed, is passed to the inverted set input of F28 at pin "S", and (via And gate G58) to the inverted reset ("R") pin of F29, as RW\. Referring to FIG. 17, the purpose of the one Fc clock delay in the change of state of the F33, the RXD flip-flop, is to produce the required RDT0\ pulse.

The states of the steering counter are, as a result of the actions of the RDT0\, RV\ and RW\ signals, as well as the steering-counter-modulus control signal at G45 pin 3, correctly started and maintained in synchronization with the sub-bit periods of the bit-times of the data output at RXD, and are therefore kept at all times, in the correct states to control the required transitions of the Manchester-encoded form of the received data, as well. Also, in cases where non-Manchester receive mode is selected and FASIR modulated data are received at the highest design bit-rates, or at integer sub-multiples thereof, no interfering signals will be generated which can disrupt or distort the operations of the receiving transceiver. Referring now to FIGS. 20, 21, and 22, the generation and operations of the timing signals used to control the delayed (timing skew-correcting) transitions of RXD and MN, and to control all remaining transitions of MN, can be seen. The skew-correcting function, T73\ (active logic zero signal) is decoded from the period counter state bits A through F, as the binary pattern, (MSB through LSB):, 1001001, or state 9, or state 73 decimal. Period counter bit G is not required to define state 73 uniquely, because state 9 is never reached by the period counter in any mode of operation. The common term, B\C\F\, is decoded by Nor gate G34 at pin 4, and is also used to generate T89\, described in the paragraph following. The remaining terms required to generate T73\ appear as inputs to Nand gate G44. Period counter output bits A, D, and E\ (from Inverter I6 pin 2) complete all the period counter bits required, and the steering counter (inverted) output bits, W\ and V\, limit the occurrence to T73 to those Sub-bit times in which the steering counter is in state 0. As described above, this state is "skipped" when the demodulated IRin data state is zero and so, T73\ can only become active when the output data decoded is at logic one. As shown in FIG. 10B near the lower right portion of the timing diagram, and in FIG. 21, the T73 pulse, thus generated, enables transitions of both RXD and MN such as to precisely correct for the difference in detection time of a first logic one IRin period in a bit interval, as compared to detection time of a first logic zero IRin period in a bit interval. T73\ then initiates such zero-to-one transitions of RXD. T73\ also times all beginning-of-bit transitions of MN during output of a data logic one state, by passing its active-zero state into Nand gate G46 (used as an inverted-input Or) and thence via G53 and G52 to create an enabling pulse at MT (when CA and REC are at logic one) at the change enable input of Flip-flop F30 "E" pin, causing its output (MN) state to change (toggle, due its "Q" output connected to its data "D" input) during the following Fc period, as is required by the Manchester format described.

As seen in FIGS. 20, 21, and 22, in a fashion similar to the generation of T73\, T89\ is decoded by Nand gate G43 at pin 8. This signal is used only to create a mid-bit-time transition of the MN Manchester output signal when a logic zero state is output. Examination of FIG. 21, near the midpoint of the timing diagram, illustrates such a transition, s produced by T89\, forming the MT (Manchester toggle) pulse via the same path as T73\. Nand gate G43 decodes the period counter state 89 decimal as the binary pattern, 011001, equal to state 25 decimal or 89 decimal, excluding bit G. Since state 25 decimal is not reached by the period counter in any mode, G is not included as an input to G43. The remaining terms forming T89\ are RXD\, used to inhibit T89 when the output data state is logic one, and the steering counter state bits, V and W, to confine the sub-bit period to the mid-time of the output bit, identified by a steering counter state of 2. The states of these decoded signals are shown in FIG. 22, again near the midpoint of the timing diagram, and result in the precise mid-bit transition required to identify a data logic zero Manchester-encoded bit-state.

Again referring to FIGS. 20, 21, and 22, Nand gate G42 and Flip-flop F27 generate the third Manchester togging (MT) pulse required, TE3\, as delayed by one Fc clock period by flip-flop F27 to form TE3\, used aim to pulse MT. When an series of data logic zero IRin periods are being received, at three pulses per bit-time, the beginning-of-bit transitions required by the Manchester-encoded output, MN, correspond to the detection of valid zero period infrared pulses, delayed by one Fc clock period from the first XSN pulse of each new output bit time. G42 decodes steering counter bits W and V\ (inverted V) to identify the final state of the steering counter (end of output bit), state 3, which exists just prior to incrementing of the steering counter by a PE pulse. In the case where a valid series of IRin data logic one period are decoded, the PE pulse corresponds to XSN, generated by a positive transition of the detected infrared pulse, IRin. XSN and ZR' are included in the decoding of TE3'\ to correctly identify, along with the steering counter bits, the exact time that the data zero period is evaluated. This time, however, is two Fc clocks earlier than the required transition time of MN, and so the pulse is delayed by one Fc cycle by F27, forming TE3\, used to generate an MT pulse, by the same path as T73\ and T89\. The second required Fc period delay is provided by the MN flip-flop, F30. A fourth, previously-generated term, RDT0\ is also used to create an MT pulse, corresponding to the expected TE3\ pulse, when the RXD data output is in transition from a logic one to a logic zero state. In the highly unlikely case wherein the steering counter state is perturbed by an unusual event, and is not in state 3 at the time of a one-to-zero RXD data transition, the inclusion of RDT0 (active true form of RDT0\) in the MT term, as generated by Or gate G53, assures that at such a data transition, and subsequently (due to re-synchronization of the steering count performed by RDT0\), the required, correctly-time transitions of MN will occur. Under all normal and expected operations, the RDT0 pulse is redundant, as it is exactly concurrent with the TE3\ pulse.

A final consideration in the generation of Manchester-encoded data output transitions remains. As shown if FIG. 2B, at the far right of the timing diagram, the last transmitted FASIR modulated bit time is not ended by an additional infrared pulse transition after the last transition of a Manchester-encoded TX signal. As noted in the diagram, the receiving transceiver is required to insert such an output transition in the MN signal to avoid possible misinterpretation of the Manchester-encoded output data by any receiving equipments. After such final transition occurs, the Manchester-encoded data output remains in this final state until reception is resumed. These operations occur in the manner following.

Referring again to FIG. 20, the transition timing pulse T73, active in period comer state 73 decimal when the steering counter is in state 0, will be generated when the steering counter reaches state 0, and the period then reaches state 73 decimal. Regardless of the previous state of the steering counter, a logic zero at CA' generates a logic zero (active state) at INIT, upon the next occurrence of PE (in this case produced by the period counter having reached state 127 decimal), generated by a logic zero pulse at TC. (See again FIGS. 11, 14 and 16). CA' at zero holds the steering counter at state 0, such that the next occurrence of period counter state 73 decimal generates T73\, toggling flip-flop F30, and creating the necessary final-transition of MN. The Period counter, in the absence of XSN pulses will reach state 127 decimal, and will generate a TC\ logic zero pulse, and therefore, its preload (PE) pulse. This PE pulses will occur 23 Fc periods later than if XSN had occurred when expected, also delaying by the same interval, the T73\ pulse. This causes a modest delay of about 12% of a bit-time, in the final Manchester-encoded transition. This amount of delay in the final MN transition is well within the limits of detection of Manchester signals, as normally defined for receiving equipments. Again, as shown in FIGS. 11, 17 and 20, the next PE pulse, again produced by the period counter reaching (the TC pulse) state, 127 decimal, causes CA to be set to logic zero, prohibiting further transitions of MN until reception of further FASIR modulated infrared signals, beginning with a data logic one validated period.

The provisions made in non-Manchester receive mode to accommodate the long one, late zero and long one, early zero infrared period disruptions, as previously described and shown in the timing diagrams in FIGS. 18 and 19 do not occur in transmission of Manchester-encoded data, as each new bit-period transmission must be started by a beginning pair of input transitions at the TX input of the transmitting transceiver. Loss of any transition will stop transmission long enough for carrier loss to be detected by the receiving transceiver, and subsequent transmissions will be detected as the first data received.

It should be noted that in receive mode, the decoded data zero range of the period counter states includes state 127 decimal, whereas, the carrier range excludes this state. This can be seen in the timing diagrams of FIGS. 9A (sequence 1), 11 (sequences V and VI), and in 19B, (sequence IV). The choice of this range of states for ZR" provides the same single-period time-distortion tolerance for the detection of a data logic zero infrared pulse as is provided for detection of a data logic one infrared pulse. This accommodates a fixed amount of accumulated clock "jitter" or other transient disturbances which occur in the light transmission and detection processes, regardless of the logic state of the data received. For this reason, the exclusion of period counter state 127 decimal from the ZR" term is neither necessary nor desirable.

In FIG. 17, the steering counter bit, W\ (the inverted form of bit W), which is at logic zero during steering counter states 2 and 3 as shown in the timing diagrams in FIGS. 21 and 22, is passed to an input pin of Nand gate G48, along with T73\ and RXD\. G48, used as in inverted input Or gate, generates RXDSET, which permits, via Nand gate G49, the delayed setting of RXD to logic one when RXDR\ is a logic one. This assures that in the highly unlikely event that the steering counter state has become disturbed during reception of data, RXD will, in such event, still be set to its correct state, nonetheless. In such a case, a small fraction of a bit-time error will occur in the transition time of RXD, on a one-time basis. Such an error will not recur in subsequent periods, because the RXD transition, thus generated, will forcibly and immediately re-synchronize the steering counter to its correct state. This action minimizes the likelihood of data loss by the external data receiving equipments, even in such an anomalous circumstance.

Figure 4D:
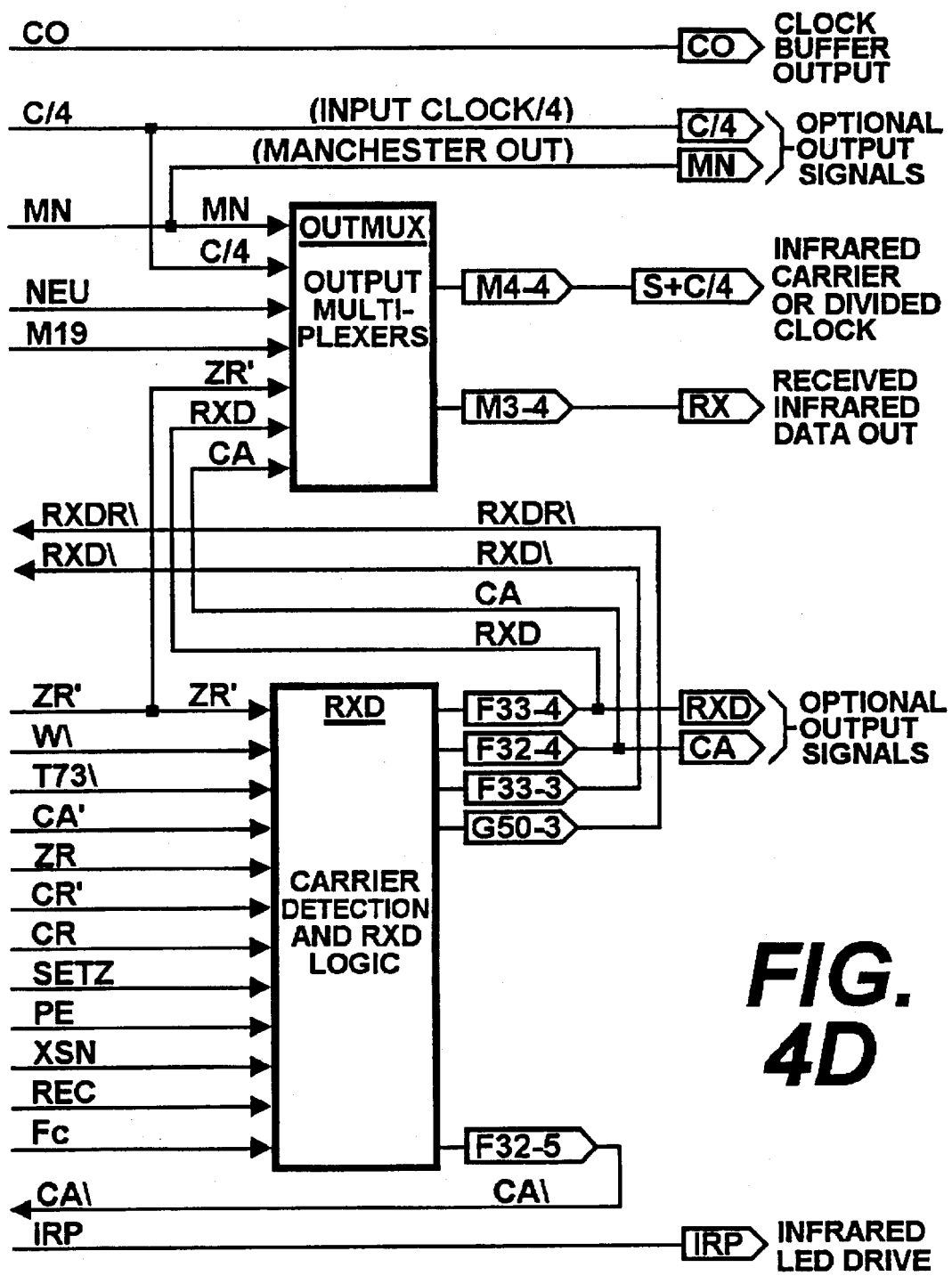

FIG. 23 is a logic diagram showing the final output multiplexer circuits within the Outmux circuit section, shown in FIGS. 3B and 4D. These circuits select between the received data output signals RXD or MN to be output as RX, and the input clock-divided-by-four signal, C/4 or the valid-carrier signal CA to be output as S+C/4. Multiplexer M3 provides RXD at the RX output when non-Manchester mode is selected by MM at logic zero, and provides MN (Manchester-encoded received data signal) at the RX output when Manchester mode is selected by MM at logic one. Likewise, Multiplexer M4 provides CA at the S+C/4 output when non-Neuron-CHIP-compatible mode is selected by NEU at logic zero, and C/4 at the S+C/4 output when Neuron-CHIP-compatible mode is selected by NEU at logic one.

Although specific applications, materials, components, connections, sequences of events and methods have been stated in the above description of the preferred embodiment of the invention, other suitable materials, other applications, components, and process steps as listed herein may be used with satisfactory results and varying degrees of quality. In addition, it will be understood that various other changes in details, materials, steps, arrangements of parts, and uses which have been herein described and illustrated in order to explain the nature of the invention will occur to and may be made by those skilled in the art, upon reading if this disclosure, and such changes are intended to be included within the principles and scope of this invention as hereinafter claimed.

We claim:

1. A signal transformation means for conversion of electrical, separately-generated serial binary information signals from an original sequential signal form having binary state transitions that can occur only at predictable intervals, and having a highest-permissible data transitions-rate, to a second sequential signal form suitable for transmission over a distance via light path or other media as a continuous signal of a form that permit conversion again into the original signal form, or other useful signal form, said signal transformation means comprising in combination:

a) an electrical sensing means to determine sequential binary states of said separately-generated serial binary information signals;

b) a first timing means to determine binary state-intervals of said separately-generated serial binary information signals;

c) a second timing means to determine binary state-transitions of said separately-generated serial binary information signals;

d) a third timing means to form, concurrently with, and produced from, timing of binary state-transitions of said separately-generated serial binary information signals, binary states and transitions of said second sequential signal form, such that the second sequential signal form continuously alternates at one of two fundamental frequencies;

e) a control means, used to control said third timing means, to select between two fundamental frequencies of the second sequential signal form, each frequency corresponding to a separate logic state of the separately-generated serial binary information signals, f) an electrical amplifying means to convert logic states of said second sequential signal form from low signal power levels to higher signal power levels suitable to operate and control intensity of a light transmitting source, or otherwise modulate any other suitable, second sequential signal transmission means;

g) a light, or other media, transmission means, suitable to transmit said second sequential signal form;

h) a second sensing means to convert light, or other suitable signal means, to electrical analog signals;

i) a second electrical amplifying means, suitable to increase electrical analog signals produced by said second sensing means to levels suitable for subsequent detection and timing measurement;

j) a signal-level comparison means to infinitely clip, and thereby convert, electrical analog signals produced by said second sensing means and increased by said second electrical amplifying means to binary signals;

k) a fourth timing means to determine binary state-transition times of like-polarity transitions of binary signals as produced by said signal-level comparison means, and to classify timed periods of said binary state-transition times within at least four predetermined ranges, classified as in-band high, in-band low, out-of-band high, and out-of-band low;

l) a fifth timing means to form, concurrently with, and produced from, binary state-transition times determined from the fourth timing means, a new, final sequential binary signal, which accurately duplicates binary states and transition-timing characteristics of the separately-generated serial binary information signals.

2. In a signal transformation means as described in claim 1, an improvement comprising an analog signal filtering means to limit signal-bandwidth content of analog signals produced by the second sensing means and increased by said second electrical amplifying means, in order to reduce influence of foreign light sources or other interfering signals that can otherwise disturb timing-accuracy determinations of the second sequential signal, as it is received.

3. In the signal transformation means according to claim 1, a binary signal-synchronizing means to cause states and state-transitions of said second sequential signal form to occur at times, relative to state-transitions of said separately-generated serial binary signals, which are predictable and of minimal delay.

4. In the signal transformation means according to claim 1, a binary signal-synchronizing means to cause states and state-transitions of the final sequential binary signal to occur at times, relative to binary state-transitions of said second sequential signal form, which are predictable and of minimal delay.

5. A signal transformation means as described in claim 1, wherein the second sequential signal form is comprised of a series of continuous pulses whose pulse-rates are altered by states of the separately-generated serial binary information signals.

6. A signal transformation means as described in claim 1, wherein state-transitions of the second sequential signal form are synchronized to state-transitions of said separately-generated serial binary information signals, and state-transitions of said final sequential binary signal are synchronized to state transitions of the second sequential signal form, such as to cause a summation of times required for transformation of the separately-generated serial binary signals to the final sequential binary signal to be predictable and of minimal delay.

7. A signal transformation means as described in claim 6, wherein the second sequential signal form is comprised of a series of continuous pulses whose pulse-rates are altered by states of the separately-generated serial binary information signals.

8. A signal transformation means as described in claim 5, wherein pulse intervals of the second sequential signal form are integer-multiples of minimum binary state transition intervals present in the separately-generated serial binary information signals, thereby providing multiple and continuous verifications of states of the separately-generated serial binary information signals.

9. A signal transformation means as described in claim 8, wherein a common synchronous logic time-base, derived from an external logic clock signal, is chosen to have a fundamental frequency which is a common multiple of two frequencies, comprising the second sequential signal form, which represent logic states of the separately-generated serial binary information signals.

10. In a signal transformation means as described in claim 6, an improvement comprising a timing and re-synchronizing means to delay by a fixed interval relative to state-transitions of said second sequential signal form, transitions of the final sequential binary signal to occur at times, wherein differences in pulse intervals of the second sequential signal received are precisely compensated such as to minimize transition timing errors of the final sequential binary signal which would otherwise occur.

11. A signal transformation means as described in claim 8, wherein frequencies of the second sequential signal form are chosen to be respectively, either two and three times, or three and four times, the highest-permissible data transition rates of the separately-generated binary information signals.

12. A signal transformation means as described in claim 11, wherein a common synchronous logic time-base is chosen to have a frequency equal to the highest-permissible data transition rates of the separately-generated binary information signals, multiplied by an integer value of 192, 96, 48, 24, 12, each of these integers being a common multiple of ratios of pulse frequencies of the second sequential signal form to the highest permissible data transition rates of the separately-generated binary information signals.

13. A signal transformation means as described in claim 1, in which common circuits are combined such as to transform separately-generated serial binary information signals to the second sequential signal form at one time, and from the second sequential signal form to the final sequential binary signal at another time, as determined by states of a separately-controlled input signal.

14. A signal transformation means as described in claim 1, in which a first said signal transformation means transforms separately-generated serial binary information signals to the second sequential signal form and a second said signal transformation means transforms signals of the second sequential signal form, received from a separate first said signal transformation means by separated light or other suitable paths, to a final sequential binary signal, at concurrent times.

15. A data, control or sensing network, comprised of a plurality of signal transformation means as described in claim 1, and employing light or other suitable transmission means to pass data or control signals among separate devices or equipments.

16. A signal transformation means as described in claim 1, including a decoding means and an encoding means to enable certain non-return-to-zero serial data formats, as required by separate devices or equipments, to be transmitted and received via the signal transformation means of claim 1 at maximum data rates which are equal to data rates of other non-return-to-zero serial data formats.

17. A signal transformation means as described in claim 16, wherein the decoding means and the encoding means that enable transmission of certain non-return-to-zero serial formats at maximum data rates equal to data rates of other non-return-to-zero formats are specifically compatible with Manchester-encoded separately-generated binary information signals.

18. A signal transformation means as described in claim 17 wherein said decoding means includes synchronization means to require continuous transitions to occur in the separately-generated binary information signals, in order to begin or to continuously produce a sequence of pulses comprising the second sequential signal transmitted.

19. A signal transformation means as described in claim 17, wherein the encoding means includes synchronization means to require a continuous sequence of pulses comprising the second sequential signal received, in order to begin, or to continuously produce, transitions in the final sequential binary signal.

20. A signal transformation means as described in claim 17, wherein either an encoding means or a decoding means to enable Manchester-encoded data formats to be transmitted and received at data rates which are equal to data rates of other non-return-to-zero serial data formats, can be disabled to provide for conversion of serial data formats.

21. A signal transformation means as described in claim 5, including signal-detection means, further comprising a signal-error detection means, to provide separate indication of presence, absence, out-of range intervals or disruption of the second sequential signal form received.

22. A signal transformation means as described in claim 21, wherein the signal-detection means provides for certain non-recurring, normal and expected, disruptions in the sequence of pulses comprising the second sequential signal received, without producing corresponding disruptions in the final sequential binary signal.

23. A signal transformation means as described in claim 22, wherein non-recurring, normal and expected disruptions in the sequence of pulses comprising the second sequential signal received result from synchronization of the second sequential signals to state-transitions of the separately-generated serial binary signals, prior to transmission.

24. A signal transformation means as described in claim 1, in which a summation of times required for transformation of separately-generated serial binary signals to the final sequential binary signal is less than an interval equal to a reciprocal of the highest-permissible data transition rate of the separately-generated binary information signals.

25. A signal transformation means as described in claim 1, in which the separately-generated serial binary information signals, generated at commonly used data-communication (baud) rates, can be passed at, or at a number of integer sub-multiples of, a maximum data transition rate for which circuit elements of the signal transformation means are designed, without requiring changes in operation, timing or characterization of any of said circuit elements.

26. A signal transformation means as described in claim 25, in which maximum data rates, for which circuit elements of the signal transformation means are readily designed, using presently available circuit components and techniques, are at least 38,400 bits per second.

27. A signal transformation means as described in claim 11, wherein separately generated serial binary signals to be transmitted may be obtained from TXD signal pins, and the final sequential binary signals received may compatibly be connected to RXD signal pins, as provided on any of several types of commonly used and available universal asynchronous receiver-transmitters or like signaling devices.

28. A data, control or sensing system or network or a part thereof, comprised of a plurality of signal transformation means as described in claim 26, wherein the separately generated serial binary information signals to be transmitted and the final sequential binary signals received are passed as the second sequential signal form via light path or other suitable medium, between or among computing devices and/or compatible devices and equipments.

29. A signal transformation means as described in claim 11, in which separately-generated serial binary signals, generated at commonly used data rates in networks for sensing, communicating and controlling purposes, can be passed at, or at a number of integer sub-multiples of, a maximum data transition rate for which circuit elements of the signal transformation means are designed, without requiring changes in operation, timing or characterization of any of said circuit elements.

30. A signal transformation means as described in claim 29, in which maximum data rates for which circuit elements of the signal transformation means are readily designed using presently available circuit components and techniques, are at least 39,063 bits per second.

31. A signal transformation means as described in claim 11, wherein the separately-generated serial binary signals to be transmitted may be obtained from output signal pins, and the final sequential binary signals received may compatibly be connected to input signal pins, and additional transmit/receive control signals are also compatibly connected to other pins, provided by a cell or other device used in a network for sensing, communicating and controlling.

32. A data, control or sensing system or network or a part thereof, comprised of a plurality of signal transformation means as described in claim 31, wherein separately generated serial binary information signals to be transmitted and the final sequential binary signals are passed as the second sequential signal form via light path or other suitable medium, between or among computing devices and/or compatible devices and equipments.

33. A light-signal repeater, comprised of a pair of signal transformation means as described in claim 11, each including signal-detection means to provide a separate carrier-present output signal when the second sequential signal form is received, compatibly interconnected such that each, normally set to receive the second sequential signal form, will, upon detection of the second sequential signal form, set a second signal transformation means into a condition required for it to transform and re-transmit signals from the final sequential binary signal of a receiving signal transformation means, thereby repeating and amplifying light-transmitted signals around, through or past an optical barrier, in either signaling direction.

34. A plurality of light-signal repeaters as described in claim 33, each repeating and amplifying light-transmitted signals around, through or past optical barriers, in both signaling directions, thereby passing serial binary information signals between or among devices and equipments separated by more than one optical barrier.

35. In a signal transformation means as described in claim 1, an improvement comprising a logic clock-frequency prescaling means, included to produce a synchronous logic time-base, suitable for synchronizing and timing all logic operations of the signal-transformation means, from external clock signals of certain different, commonly-used frequencies, that are usually chosen to suit requirements of connected devices or equipments.

36. The improvement defined in claim 35, in which said logic clock-frequency prescaling means, when enabled, performs a non-integer division of an external clock signal on a transition-by-transition basis, rather than on a cycle-by-cycle basis, to produce a synchronous logic time-base which is more regular than other conventional means, thus producing minimal degradation of accuracy of signal-timing functions of the signal transformation means.

37. A light-path transceiver, comprising the signal transformation means according to claim 1, a light transmission means, suitable to transmit said second sequential signal form derived from states and state-transitions of the separately-generated serial binary information signals, and a light-sensing means to convert received light to electrical analog signals for amplification and signal level sensing to produce a binary signal whose transition intervals are timed, classified and are used to produce a final sequential binary signal essentially duplicating binary states and transition-timing characteristics of said separately-generated serial binary information signals.

38. The light-path transceiver of claim 37, used to transmit and receive light signals over a distance, through a light-permeable medium such as space, water or air.

39. The light-path transceiver of claim 37, used to transmit and receive infrared light signals over a distance.

40. The light-path transceiver of claim 37, wherein spectral output characteristics of said light transmission means closely match spectral response characteristics of said light-sensing means.

41. In a light-path transceiver according to claim 37, an improvement wherein one or more light-spectrum filtering means are used within a light path to minimize disturbances in electrical signals derived from the second sequential signal received, which disturbances may cause errors in response of the light-path transceiver when the light-path transceiver is operated as a light-signal receiver.

42. A signal transformation means as described in claim 5, wherein a lesser of two pulse rates chosen to comprise the second sequential signal form transmitted represents a logic zero state and a greater of two pulse rates chosen to comprise the second sequential signal form transmitted represents a logic one state.

43. A signal transformation means as described in claim 5, wherein a range encompassing a lesser of two pulse rates chosen to comprise the second sequential signal form, as received, represents a logic zero state, and a range encompassing a greater of two pulse rates chosen to comprise the second sequential signal form, as received, represents a logic one state.

44. A signal transformation means as described in claim 43, wherein received signals having no detectable transitions, or transitions which represent pulse rates outside either range described in claim 43, will operate to place the final sequential binary signal to an inactive, non-interfering state.

45. A signal transformation means as described in claim 43, wherein a signal-detection means is included, further comprising a signal-error detection means that provides a separate indication of signal presence, when received signals having no detectable transitions or transitions that represent pulse rates outside either range described in claim 43 are present, will operate to place said separate indication of signal presence in its false state.

46. A signal transformation means as described in claim 5, wherein reception of binary signal transitions within a range encompassing pulse rates chosen to comprise the second sequential signal form, as received, representing a logic one state, must be detected before reception of binary signal transitions within a range encompassing pulse rates chosen to comprise the second sequential signal form, as received, representing a logic zero state.

* * * * *